(12) United States Patent
Lim et al.

(10) Patent No.: US 11,948,883 B2
(45) Date of Patent: Apr. 2, 2024

(54) SEMICONDUCTOR DEVICE

(71) Applicant: SAMSUNG ELECTRONICS CO., LTD., Suwon-si (KR)

(72) Inventors: Seonghun Lim, Hwaseong-si (KR); Wookyung You, Hwaseong-si (KR); Kyoungwoo Lee, Hwaseong-si (KR); Juyoung Jung, Yongin-si (KR); Il Sup Kim, Suwon-si (KR); Chin Kim, Seongnam-si (KR); Kyoungpil Park, Yongin-si (KR); Jinhyung Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 17/221,191

(22) Filed: Apr. 2, 2021

(65) Prior Publication Data
US 2022/0068810 A1 Mar. 3, 2022

(30) Foreign Application Priority Data
Aug. 27, 2020 (KR) .......................... 10-2020-0108429

(51) Int. Cl.
*H01L 23/522* (2006.01)
*H01L 23/528* (2006.01)
*H01L 27/06* (2006.01)
*H01L 49/02* (2006.01)

(52) U.S. Cl.
CPC ...... *H01L 23/5228* (2013.01); *H01L 23/5226* (2013.01); *H01L 23/5283* (2013.01); *H01L 27/0629* (2013.01); *H01L 28/20* (2013.01); *H01L 28/24* (2013.01); *H01L 27/0688* (2013.01)

(58) Field of Classification Search
CPC ..... H01L 23/5228; H01L 28/20; H01L 28/24; H01L 23/5226; H01L 23/5283; H01L 27/0629
See application file for complete search history.

(56) References Cited

U.S. PATENT DOCUMENTS

| 5,637,534 | A * | 6/1997 | Takeyasu | H01L 23/5226 257/E21.586 |
|---|---|---|---|---|
| 6,365,481 | B1 | 4/2002 | Bonser et al. | |
| 7,303,972 | B2 | 12/2007 | Coker et al. | |
| 8,298,902 | B2 | 10/2012 | Dalton et al. | |
| 10,177,214 | B2 | 1/2019 | Ali et al. | |
| 2006/0118885 | A1* | 6/2006 | Song | H10B 12/09 257/532 |
| 2013/0328131 | A1* | 12/2013 | Lu | H01L 27/0629 257/E27.011 |

(Continued)

FOREIGN PATENT DOCUMENTS

KR  10-2021-0154294 A  11/2021

*Primary Examiner* — Aaron J Gray
(74) *Attorney, Agent, or Firm* — Fish & Richardson P.C.

(57) ABSTRACT

A semiconductor device including a transistor on a substrate; an interlayer insulating layer on the transistor; a first metal-containing layer on the interlayer insulating layer; and a second metal-containing layer on the first metal-containing layer, wherein the second metal-containing layer includes a resistor, the resistor includes a first insulating layer on the first metal-containing layer; a resistor metal layer on the first insulating layer; and a second insulating layer on the resistor metal layer, and the resistor metal layer includes a recessed side surface.

20 Claims, 52 Drawing Sheets

(56) References Cited

U.S. PATENT DOCUMENTS

| | | | |
|---|---|---|---|
| 2014/0368965 A1* | 12/2014 | Kondo | H01F 27/402 |
| | | | 361/278 |
| 2018/0130796 A1* | 5/2018 | Jun | H01L 23/5228 |
| 2018/0211952 A1* | 7/2018 | Shin | H01L 23/5228 |
| 2019/0035878 A1 | 1/2019 | Fest | |
| 2019/0148370 A1* | 5/2019 | Hung | H01L 28/60 |
| | | | 257/532 |
| 2019/0348494 A1 | 11/2019 | Leng et al. | |
| 2021/0391254 A1 | 12/2021 | You et al. | |
| 2022/0013520 A1* | 1/2022 | Ho | H01L 29/7835 |

\* cited by examiner

SEMICONDUCTOR DEVICE

CROSS-REFERENCE TO RELATED APPLICATION

Korean Patent Application No. 10-2020-0108429, filed on Aug. 27, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit having metal-oxide-semiconductor field-effect transistors (MOS-FETs). To meet an increasing demand for a semiconductor device with a small pattern size and a reduced design rule, the MOS-FETs may be scaled down.

SUMMARY

The embodiments may be realized by providing a semiconductor device including a transistor on a substrate; an interlayer insulating layer on the transistor; a first metal-containing layer on the interlayer insulating layer; and a second metal-containing layer on the first metal-containing layer, wherein the second metal-containing layer includes a resistor, the resistor includes a first insulating layer on the first metal-containing layer; a resistor metal layer on the first insulating layer; and a second insulating layer on the resistor metal layer, and the resistor metal layer includes a recessed side surface.

The embodiments may be realized by providing a semiconductor device including a transistor on a substrate; an interlayer insulating layer on the transistor; a first metal-containing layer on the interlayer insulating layer, the first metal-containing layer including a lower interconnection line; and a second metal-containing layer on the first metal-containing layer, wherein the second metal-containing layer includes a resistor metal layer and an upper interconnection line on the resistor metal layer, the resistor metal layer is between the upper interconnection line and the lower interconnection line, the upper interconnection line includes a first portion vertically overlapped with the resistor metal layer, and a second portion horizontally offset from the resistor metal layer, and a bottom surface of the first portion of the upper interconnection line is located at a level higher than a bottom surface of the second portion of the upper interconnection line.

The embodiments may be realized by providing a semiconductor device including a substrate including an active region; a device isolation layer defining active patterns on the active region, the device isolation layer covering a lower side surface of each of the active patterns, an upper portion of each of the active patterns protruding above the device isolation layer; a pair of source/drain patterns in the upper portion of each of the active patterns; a channel pattern between the pair of source/drain patterns; a gate electrode crossing the channel pattern and extending in a first direction; gate spacers at both sides of the gate electrode and extending in the first direction, along with the gate electrode; a gate dielectric pattern between the gate electrode and the channel pattern and between the gate electrode and the gate spacer; a gate capping pattern on a top surface of the gate electrode and extending in the first direction, along with the gate electrode; a first interlayer insulating layer on the gate capping pattern; an active contact penetrating the first interlayer insulating layer and being coupled to at least one of the source/drain patterns; a gate contact penetrating the first interlayer insulating layer and being coupled to the gate electrode; a first metal-containing layer in a second interlayer insulating layer on the first interlayer insulating layer; and a second metal-containing layer in a third interlayer insulating layer on the second interlayer insulating layer, wherein the first metal-containing layer includes a lower interconnection line, the second metal-containing layer includes a resistor on the first metal-containing layer; an upper interconnection line on the resistor; and a first via below the upper interconnection line and connected to the resistor, the resistor includes a first insulating layer; a resistor metal layer on the first insulating layer; and a second insulating layer on the resistor metal layer, and the resistor metal layer includes a recessed side surface.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
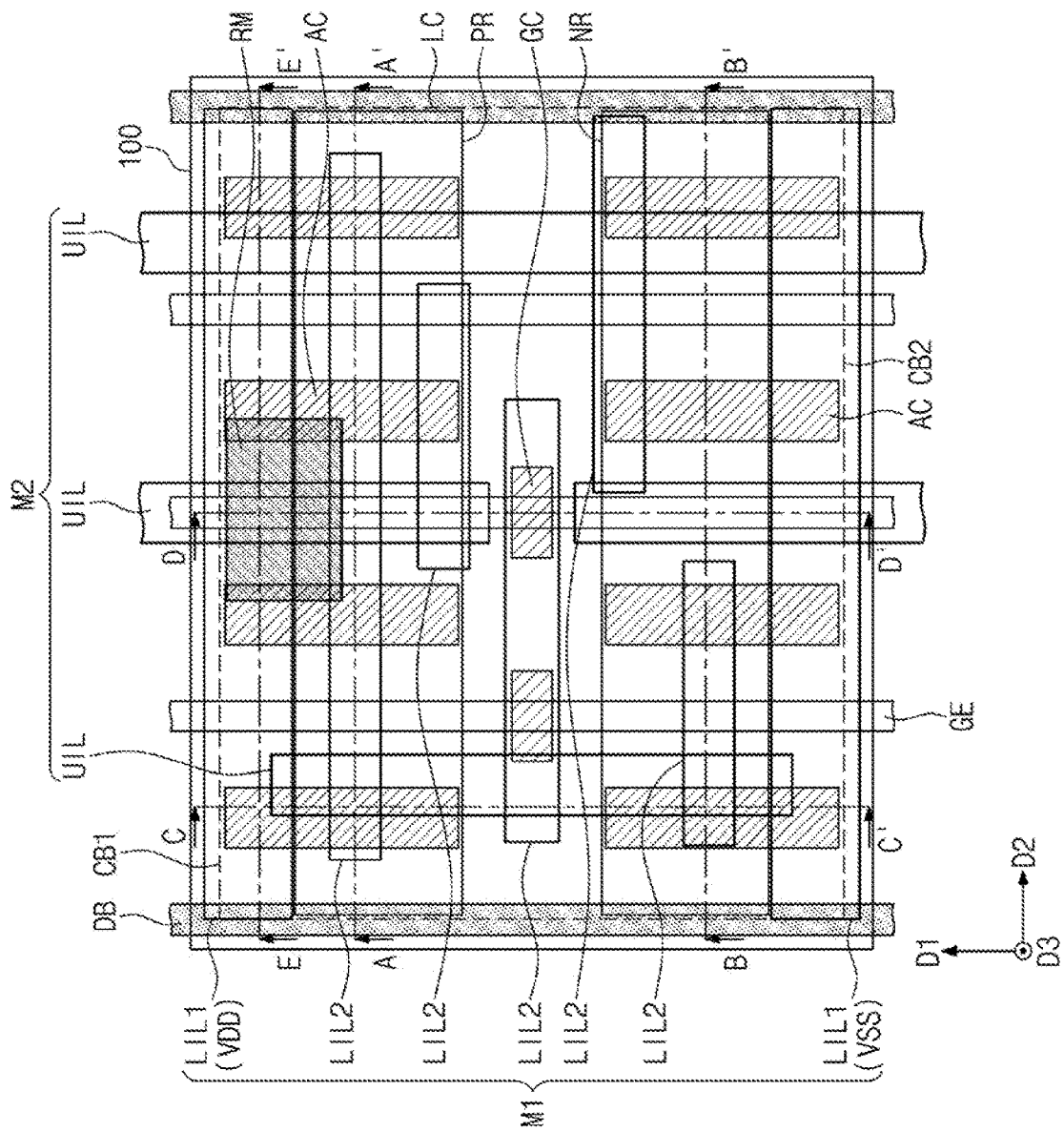
FIG. 1 is a plan view of a semiconductor device according to an embodiment.
Figure 2A:
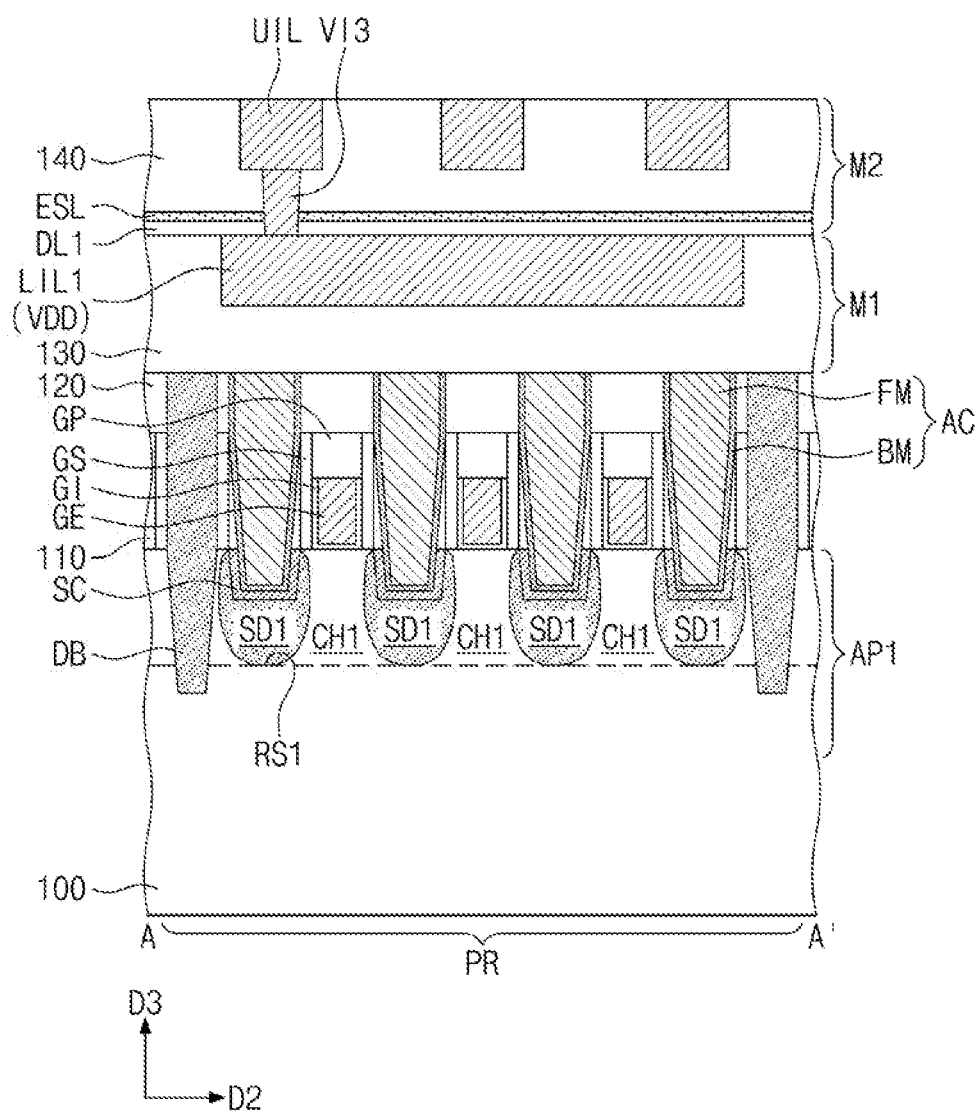
FIGS. 2A to 2E are sectional views, which are respectively taken along lines A-A', B-B', C-C', D-D', and E-E' of FIG. 1.
Figure 2B:
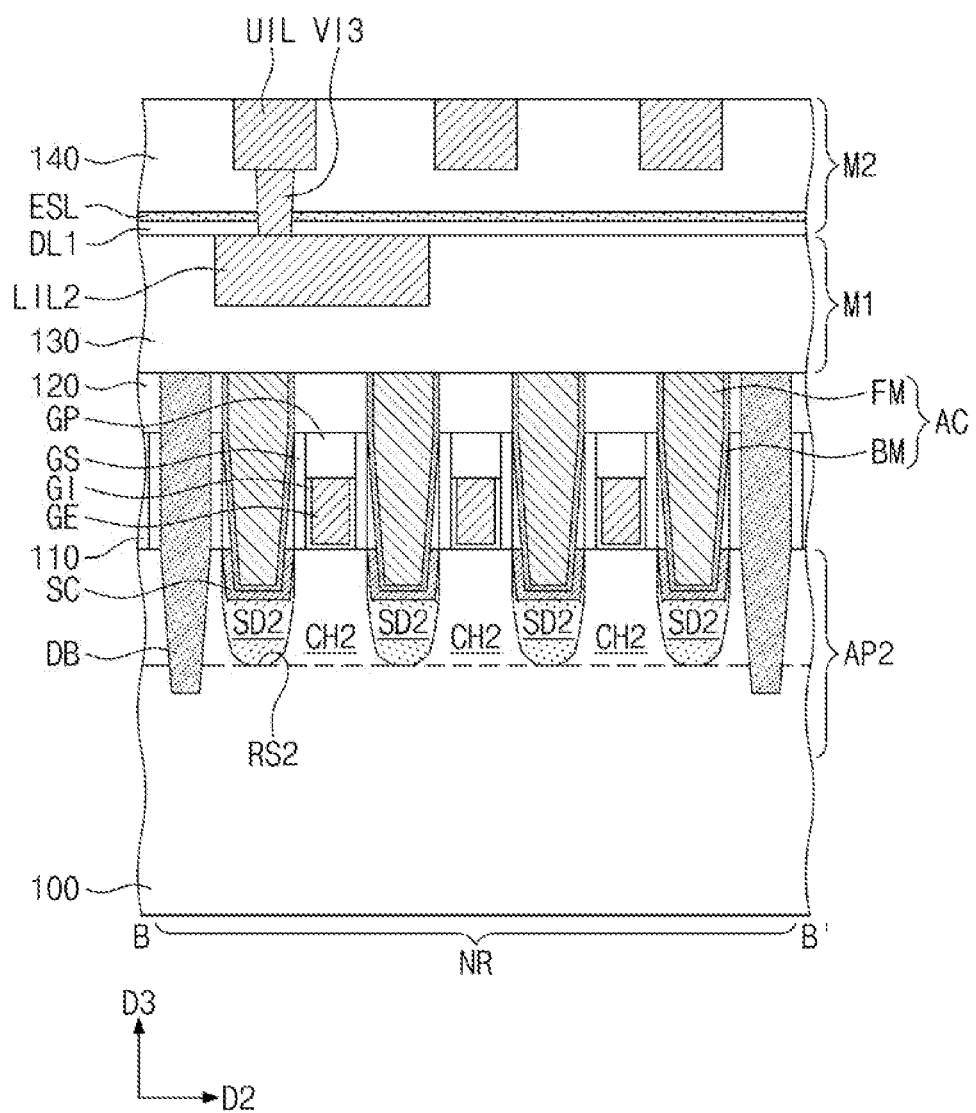
Figure 2C:
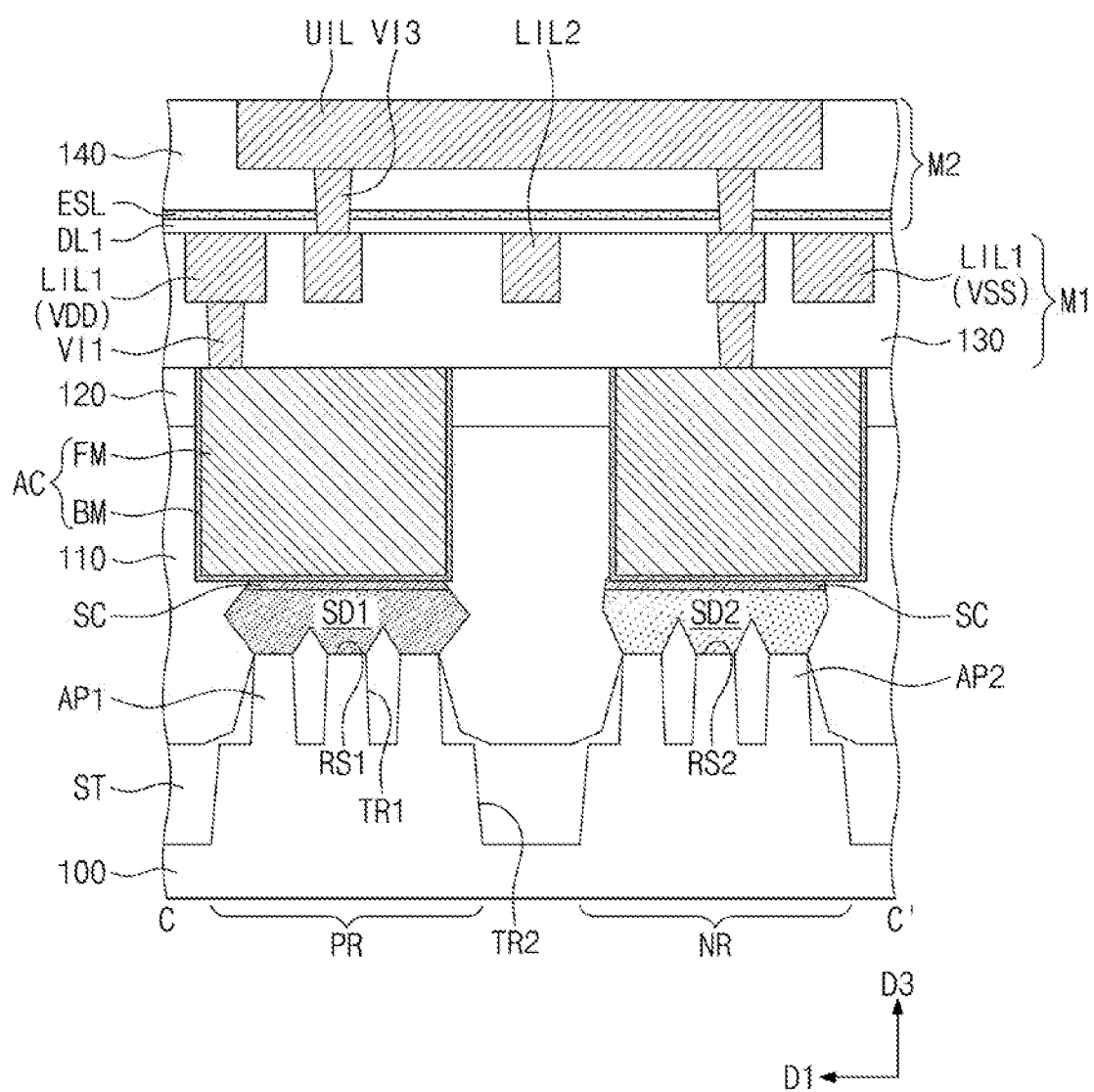
Figure 2D:
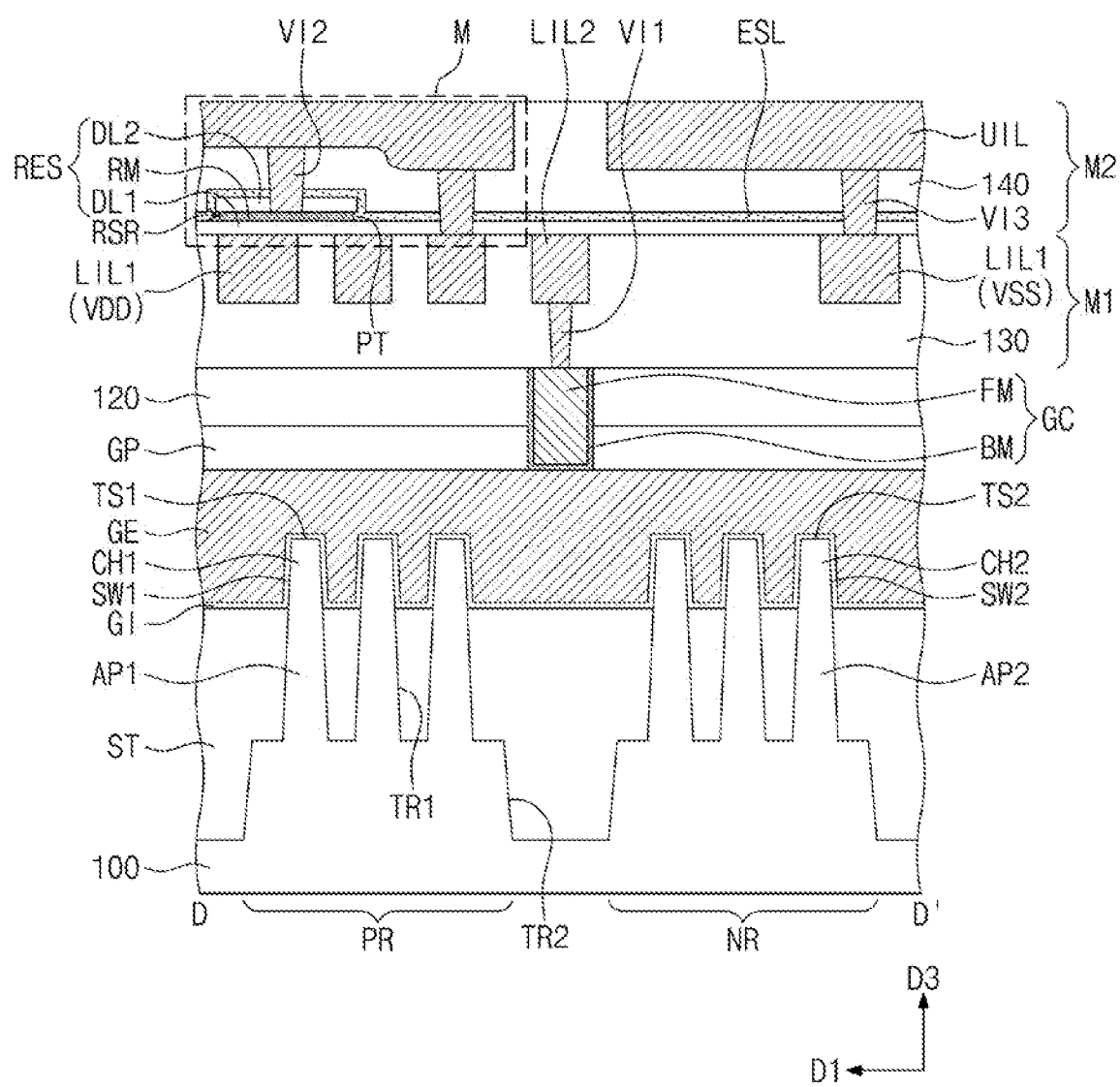
Figure 2E:
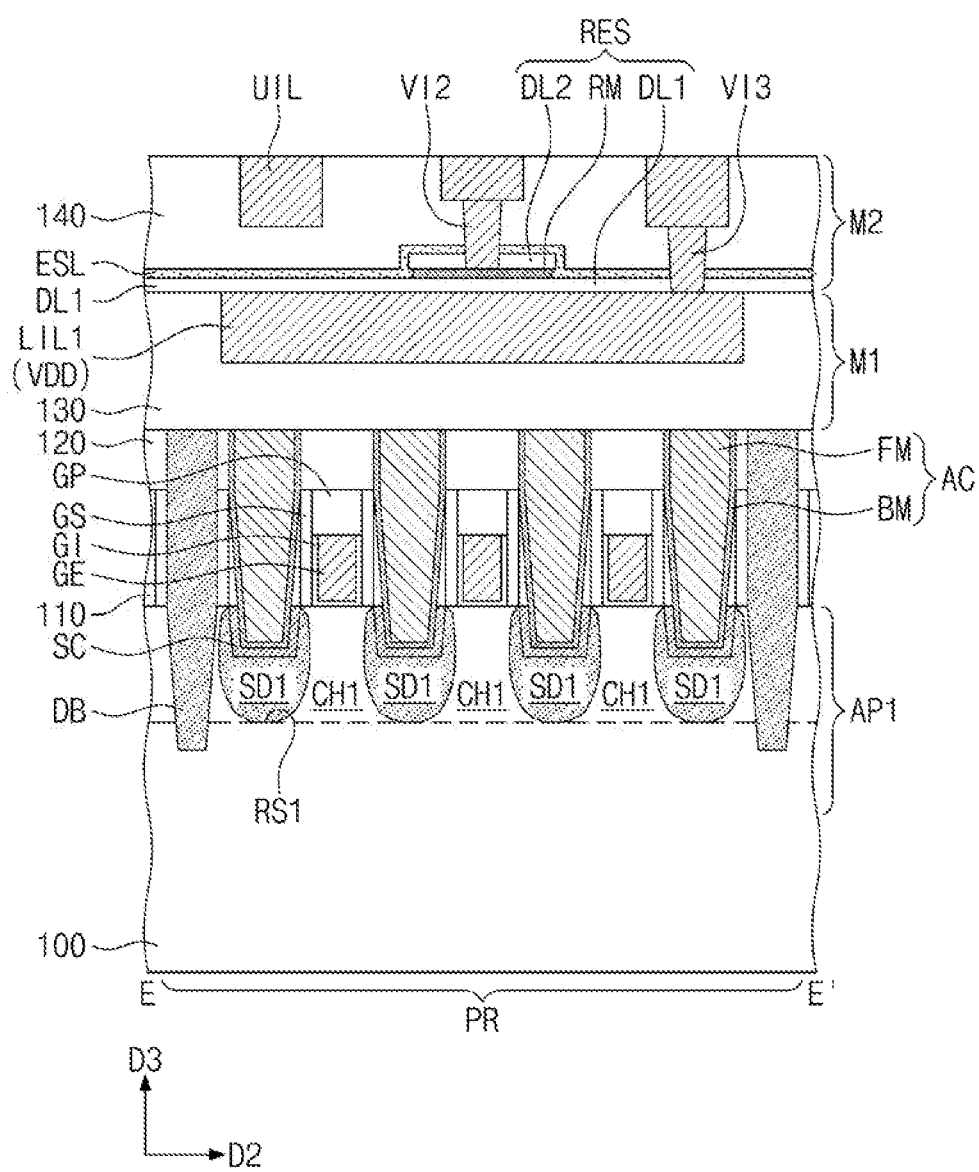
Figure 3:
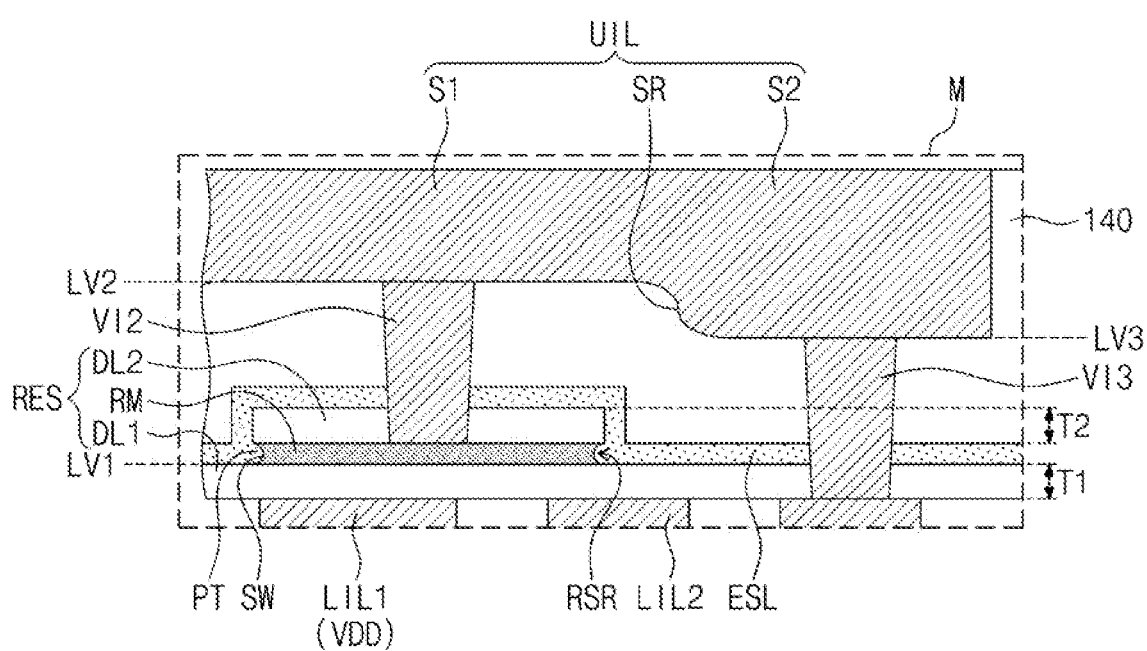
FIG. 3 is an enlarged sectional view of a portion M of FIG. 2D.

FIG. 1 is a plan view of a semiconductor device according to an embodiment. FIGS. 2A to 2E are sectional views, which are respectively taken along lines A-A', B-B', C-C', D-D', and E-E' of FIG. 1. FIG. 3 is an enlarged sectional view of a portion M of FIG. 2D.

Referring to FIGS. 1 and 2A to 2E, a logic cell LC may be on a substrate 100. In the present specification, the logic cell LC may mean a logic device (e.g., an inverter, a flip-flop, or the like), which is configured to execute a specific function. In an implementation, the logic cell LC may include transistors constituting the logic device and interconnection lines connecting the transistors to each other.

The substrate 100 may include a first active region PR and a second active region NR. In an implementation, the first active region PR may be a PMOSFET region, and the second active region NR may be an NMOSFET region. The substrate 100 may be a semiconductor substrate (e.g., of silicon, germanium, or silicon-germanium) or a compound semiconductor substrate. In an implementation, the substrate 100 may be a silicon wafer.

The first and second active regions PR and NR may be defined by a second trench TR2, which is in an upper portion of the substrate 100. The second trench TR2 may be between the first and second active regions PR and NR. The first and second active regions PR and NR may be spaced apart from each other, in a first direction D1, with the second trench TR2 therebetween. Each of the first and second active regions PR and NR may extend (e.g., lengthwise) in a second direction D2 that is different from the first direction D1.

First active patterns AP1 and second active patterns AP2 may be on the first active region PR and the second active region NR, respectively. The first and second active patterns AP1 and AP2 may extend in the second direction D2 and may be parallel to each other. The first and second active patterns AP1 and AP2 may be portions of the substrate 100 protruding in a vertical direction (e.g., a third direction D3). A first trench TR1 may be between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. The upper portions of the first and second active patterns AP1 and AP2 may be protruding patterns, which vertically extend above the device isolation layer ST (e.g., see FIG. 2D) in the third direction D3. Each of the upper portions of the first and second active patterns AP1 and AP2 may be shaped like a fin. The device isolation layer ST may not cover the upper portions of the first and second active patterns AP1 and AP2. The device isolation layer ST may cover lower portions of side surfaces of the first and second active patterns AP1 and AP2.

First source/drain patterns SD1 may be in or on the upper portions of the first active patterns AP1. The first source/drain patterns SD1 may be impurity regions of a first conductivity type (e.g., p-type). A first channel pattern CH1 may be between a pair of the first source/drain patterns SD1. Second source/drain patterns SD2 may be in or on the upper portions of the second active patterns AP2. The second source/drain patterns SD2 may be impurity regions of a second conductivity type (e.g., n-type). A second channel pattern CH2 may be between a pair of the second source/drain patterns SD2.

The first and second source/drain patterns SD1 and SD2 may be epitaxial patterns, which may be formed by a selective epitaxial growth process. In an implementation, the first and second source/drain patterns SD1 and SD2 may have top surfaces that are coplanar with top surfaces of the first and second channel patterns CH1 and CH2. In an implementation, the top surfaces of the first and second source/drain patterns SD1 and SD2 may be higher than the top surfaces of the first and second channel patterns CH1 and CH2.

The first source/drain patterns SD1 may include a semiconductor element (e.g., SiGe), whose lattice constant is larger than a lattice constant of a semiconductor element in the substrate 100. Accordingly, the first source/drain patterns SD1 may exert a compressive stress on the first channel patterns CH1. In an implementation, the second source/drain patterns SD2 may include the same semiconductor element (e.g., Si) as the substrate 100.

Gate electrodes GE may cross the first and second active patterns AP1 and AP2 and extend (e.g., lengthwise) in the first direction D1. The gate electrodes GE may be spaced apart from each other with a first pitch in the second direction D2. The gate electrodes GE may be overlapped with the first and second channel patterns CH1 and CH2 when viewed in a plan view. Each of the gate electrodes GE may enclose a top surface and opposite side surfaces of each of the first and second channel patterns CH1 and CH2.

Referring back to FIG. 2D, the gate electrode GE may be on a first top surface TS1 of the first channel pattern CH1 and on at least one first side surface SW1 of the first channel pattern CH1. The gate electrode GE may be on a second top surface TS2 of the second channel pattern CH2 and on at least one second side surface SW2 of the second channel pattern CH2. In an implementation, the transistor may be a three-dimensional field effect transistor (e.g., FinFET), in which the gate electrode GE three-dimensionally surrounds the channel patterns CH1 and CH2.

Referring back to FIGS. 1 and 2A to 2E, a pair of gate spacers GS may be on opposite side surfaces of each of the gate electrodes GE. The gate spacers GS may extend along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include, e.g., SiCN, SiCON, or SiN. In an implementation, the gate spacers GS may be a multi-layered structure, which includes at least two different materials selected from SiCN, SiCON, and SiN.

A gate capping pattern GP may be on each of the gate electrodes GE. The gate capping pattern GP may extend along the gate electrode GE and in the first direction D1. The gate capping pattern GP may be formed of or include a material, which has an etch selectivity with respect to first and second interlayer insulating layers 110 and 120 to be described below. In an implementation, the gate capping patterns GP may be formed of or include, e.g., SiON, SiCN, SiCON, or SiN. As used herein, the term "or" is not an exclusive term, e.g., "A or B" would include A, B, or A and B.

A gate dielectric pattern GI may be between the gate electrode GE and the first active pattern AP1 and between the gate electrode GE and the second active pattern AP2. The gate dielectric pattern GI may extend along a bottom surface of the gate electrode GE thereon. In an implementation, the gate dielectric pattern GI may cover the first top surface TS1 and the first side surfaces SW1 of the first channel pattern CH1. The gate dielectric pattern GI may cover the second top surface TS2 and the second side surfaces SW2 of the second channel pattern CH2. The gate dielectric pattern GI may cover a top surface of the device isolation layer ST below the gate electrode GE.

In an implementation, the gate dielectric pattern GI may be formed of or include a high-k dielectric material, whose dielectric constant is higher than that of a silicon oxide layer. In an implementation, the high-k dielectric material may include hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be on the gate dielectric pattern GI and may be adjacent to the first and second channel patterns CH1 and CH2. The first metal pattern may include a work function metal adjusting a threshold voltage of a transistor. By adjusting a thickness and composition of the first metal pattern, it may be possible to realize a transistor having a desired threshold voltage.

The first metal pattern may include a metal nitride layer. In an implementation, the first metal pattern may include nitrogen (N) and titanium (Ti), tantalum (Ta), aluminum (Al), tungsten (W) or molybdenum (Mo). In an implementation, the first metal pattern may further include carbon (C). The first metal pattern may include a plurality of work function metal layers, which are stacked.

The second metal pattern may include a metal having electric resistance lower than the first metal pattern. In an implementation, the second metal pattern may include tungsten (W), aluminum (Al), titanium (Ti), or tantalum (Ta).

A first interlayer insulating layer 110 may be on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS. A second interlayer insulating layer 120 may be on the first interlayer insulating layer 110 to cover the gate capping patterns GP. A third interlayer insulating layer 130 may be on the second interlayer insulating layer 120. A fourth interlayer insulating layer 140 may be on the third interlayer insulating layer 130. In an implementation, the first to fourth interlayer insulating layers 110, 120, 130, and 140 may be formed of or include silicon oxide.

A pair of isolation structures DB may be at both sides of the logic cell LC, which are opposite to each other in the second direction D2. The isolation structure DB may extend in the first direction D1 and parallel to the gate electrodes GE. In an implementation, a pitch between the isolation structure DB and the gate electrode GE adjacent to each other may be equal to the first pitch.

The isolation structure DB may penetrate the first and second interlayer insulating layers 110 and 120 and may extend into the first and second active patterns AP1 and AP2. The isolation structure DB may penetrate the upper portion of each of the first and second active patterns AP1 and AP2. The isolation structure DB may separate the first and second active regions PR and NR of the logic cell LC from the active region of a neighboring logic cell.

Active contacts AC may penetrate the first and second interlayer insulating layers 110 and 120 and may be electrically connected to the first and second source/drain patterns SD1 and SD2, respectively. Each of the active contacts AC may be between a pair of the gate electrodes GE.

The active contact AC may be a self-aligned contact. In an implementation, the active contact AC may be formed by a self-alignment process using the gate capping pattern GP and the gate spacer GS. In an implementation, the active contact AC may cover at least a portion of a side surface of the gate spacer GS. In an implementation, the active contact AC may cover a portion of the top surface of the gate capping pattern GP.

A silicide pattern SC may be between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include a metal-silicide material (e.g., titanium silicide, tantalum silicide, tungsten silicide, nickel silicide, or cobalt-silicide).

A gate contact GC may penetrate the second interlayer insulating layer 120 and the gate capping pattern GP and may be connected to the gate electrode GE. When viewed in a plan view, the gate contact GC may be between the first and second active regions PR and NR. A bottom surface of the gate contact GC may be in contact with the top surface of the gate electrode GE. The gate contact GC may have a top surface that is coplanar with a top surface of the second interlayer insulating layer 120.

Each of the active and gate contacts AC and GC may include a conductive pattern FM and a barrier pattern BM enclosing the conductive pattern FM. In an implementation, the conductive pattern FM may be formed of or include aluminum, copper, tungsten, molybdenum, or cobalt. The barrier pattern BM may cover side and bottom surfaces of the conductive pattern FM. The barrier pattern BM may include a metal layer or a metal nitride layer. The metal layer may be formed of or include titanium, tantalum, tungsten, nickel, cobalt, or platinum. The metal nitride layer may be formed of or include titanium nitride (TiN), tantalum nitride (TaN), tungsten nitride (WN), nickel nitride (NiN), cobalt nitride (CoN), or platinum nitride (PtN).

A first metal-containing layer M1 may be in or on the third interlayer insulating layer 130. The first metal-containing layer M1 may include first lower interconnection lines LIL1, second lower interconnection lines LIL2, and first vias VI1. The first vias VI1 may be below the first and second lower interconnection lines LIL1 and LIL2 (e.g., the first vias VI1 may be between the substrate 100 and the first and second lower interconnection lines LIL1 and LIL2 in the third direction D3). The first and second lower interconnection lines LIL1 and LIL2 may be in an upper portion of the third interlayer insulating layer 130. The first vias VI1 may be in a lower portion of the third interlayer insulating layer 130.

The first lower interconnection lines LIL1 may extend in the second direction D2 and to cross the logic cell LC. The first lower interconnection lines LIL1 may serve as power lines. In an implementation, a drain voltage VDD or a source voltage VSS may be applied to the first lower interconnection line LIL1.

Referring to FIG. 1, a first cell boundary CB1, extending in the second direction D2, may be defined in a region of the logic cell LC. A second cell boundary CB2 extending in the second direction D2 may be defined in a region of the logic cell LC opposite to the first cell boundary CB1. One first lower interconnection line LIL1, to which the drain voltage VDD (i.e., a power voltage) is applied, may be on the first cell boundary CB1. The one first lower interconnection line LIL1, to which the drain voltage VDD is applied, may extend along the first cell boundary CB1 or in the second direction D2. Another first lower interconnection line LIL1, to which the source voltage VSS (i.e., a ground voltage) is applied, may be on the second cell boundary CB2. The other first lower interconnection line LIL1, to which the source voltage VSS is applied, may extend along the second cell boundary CB2 or in the second direction D2.

The second lower interconnection lines LIL2 may be between the one first lower interconnection line LIL1 and the other first lower interconnection line LIL1, which are respectively applied with the drain voltage VDD and the source voltage VSS. The second lower interconnection lines LIL2 may extend in the second direction D2 and may be parallel to each other. When viewed in a plan view, the second lower interconnection lines LIL2 may be line or bar-shaped patterns. The second lower interconnection lines LIL2 may be spaced apart from each other with a second pitch in the first direction D1. In an implementation, the second pitch may be smaller than the first pitch.

The first vias VI1 may be between the first and second lower interconnection lines LIL1 and LIL2 and the active contacts AC. The first vias VI1 may be between the second lower interconnection lines LIL2 and the gate contact GC.

A second metal-containing layer M2 may be on the first metal-containing layer M1. The second metal-containing layer M2 may include a resistor RES. The resistor RES may include a first insulating layer DL1 on a top surface of the first metal-containing layer M1, a resistor metal layer RM on the first insulating layer DL1, and a second insulating layer DL2 on the resistor metal layer RM. The resistor RES may be on the first metal-containing layer M1.

The first insulating layer DL1 may cover the top surface of the first metal-containing layer M1. The first insulating layer DL1 may include, e.g., a silicon oxide layer, a silicon nitride layer, or a silicon oxynitride layer.

The resistor metal layer RM may be on the first insulating layer DL1. The resistor metal layer RM may be on at least a portion of the first insulating layer DL1. In an implementation, the resistor metal layer RM may be formed of or include titanium nitride (TiN), tantalum nitride (TaN), or tungsten nitride (WN).

The second insulating layer DL2 may be on the resistor metal layer RM. The second insulating layer DL2 may be on a top surface of the resistor metal layer RM. The second insulating layer DL2 may be at a position corresponding to the resistor metal layer RM. The second insulating layer DL2 may include, e.g., a silicon oxide layer, a silicon nitride layer, or a silicon oxynitride layer. The first and second insulating layers DL1 and DL2 may be formed of or include the same material.

The second metal-containing layer M2 may include an etch stop layer ESL on a top surface of the resistor RES. The etch stop layer ESL may cover the entire top surface of the resistor RES. In an implementation, the etch stop layer ESL may cover the top surface of the first insulating layer DL1, a side surface SW of the resistor metal layer RM, and the top and side surfaces of the second insulating layer DL2. The etch stop layer ESL may be formed of or include a material having an etch selectivity with respect to the fourth interlayer insulating layer 140. In an implementation, the etch stop layer ESL may be formed of or include aluminum oxide (AlO).

The fourth interlayer insulating layer 140 may be on the etch stop layer ESL. The second metal-containing layer M2 may include upper interconnection lines UIL, second vias VI2, and third vias VI3, which are in the fourth interlayer insulating layer 140. The upper interconnection lines UIL may be in an upper portion of the fourth interlayer insulating layer 140. The second vias VI2 and the third vias VI3 may be in a lower portion of the fourth interlayer insulating layer 140.

The upper interconnection lines UIL may extend in the first direction D1 and may be parallel to each other. When viewed in a plan view, the upper interconnection lines UIL may be line or bar-shaped patterns. The upper interconnection lines UIL may be arranged, e.g., spaced apart, in the second direction D2.

The second metal-containing layer M2 may include the second vias VI2 and the third vias VI3. The second vias VI2 and the third vias VI3 may be below the upper interconnection lines UIL. The second vias VI2 may be between the upper interconnection lines UIL and the resistor metal layer RM. The third vias VI3 may be between the upper interconnection lines UIL and the first and second lower interconnection lines LIL1 and LIL2. In an implementation, the second vias VI2 may electrically connect the upper interconnection lines UIL to the resistor metal layer RM, and the third vias VI3 may electrically connect the upper interconnection lines UIL to the first and second lower interconnection lines LIL1 and LIL2. The second vias VI2 may penetrate the etch stop layer ESL and the second insulating layer DL2. The third vias VI3 may penetrate the etch stop layer ESL and the first insulating layer DL1.

The first and second lower interconnection lines LIL1 and LIL2, the upper interconnection lines UIL, and the first to third vias VI1, VI2, and VI3 may be formed of or include a metallic material (e.g., titanium (Ti), tungsten (W), copper (Cu), or aluminum (Al)).

The second metal-containing layer M2 according to an embodiment will be described in more detail with reference to FIG. 3.

A thickness of the first insulating layer DL1 in the third direction D3 may be a first thickness T1. A thickness of the second insulating layer DL2 in the third direction D3 may be a second thickness T2. The thickness of the first insulating layer DL1 may be a vertical distance from the top surface of the first insulating layer DL1 to the bottom surface (e.g., in the third direction D3). The thickness of the second insulating layer DL2 may be a vertical distance from the top surface of the second insulating layer DL2 to the bottom surface. The first thickness T1 may be substantially equal to the second thickness T2. In an implementation, the first thickness T1 and the second thickness T2 may range from 100 Å to 150 Å. A ratio of the first thickness T1 to the second thickness T2 may range from 0.8 to 1.2.

The first and second insulating layers DL1 and DL2 may have substantially the same thickness. In an implementation, it is possible to help prevent defects from being formed on a surface of the first insulating layer DL1 by an etching process, which is performed on the first insulating layer DL1 when the thicknesses of the first and second insulating layers DL1 and DL2 are different from each other. In an implementation, it is possible to help prevent the first and second lower interconnection lines LIL1 and LIL2 or the resistor metal layer RM from being partially etched by an etching process, which is performed to form an interconnection structure. In an implementation, it is possible to help prevent the reliability of the semiconductor device from being deteriorated.

A thickness of the resistor metal layer RM may be smaller than the thicknesses of each of the first and second insulating layers DL1 and DL2. The thickness of the resistor metal layer RM may be a vertical distance between the top and bottom surfaces of the resistor metal layer RM. In an implementation, the thickness of the resistor metal layer RM may range from 40 Å to 50 Å.

The resistor metal layer RM may have a recessed (e.g., concave) side surface SW. The recessed side surface SW of the resistor metal layer RM may be recessed inwardly toward a center of the resistor metal layer RM. The recessed side surface SW of the resistor metal layer RM may be recessed in an inward direction away from a side surface of the second insulating layer DL2. In an implementation, the recessed side surface SW of the resistor metal layer RM may have a curved or non-flat profile. A recess region RSR may be defined by the recessed side surface SW of the resistor metal layer RM. In an implementation, the recessed side surface SW of the resistor metal layer RM may have a curved or non-flat profile.

The etch stop layer ESL may include a protruding portion PT, which may extend or protrude into the recess region RSR. The protruding portion PT may be a portion of the etch stop layer ESL that protrudes toward the recessed side surface SW of the resistor metal layer RM. The protruding portion PT may be vertically overlapped with the second insulating layer DL2 (e.g., a line extending in the third direction D3 may pass through the second insulating layer DL2 and the protruding portion PT of the etch stop layer ESL). The protruding portion PT may fill the recess region RSR. In an implementation, the protruding portion PT may be in the recess region RSR. In an implementation, the protruding portion PT may have a curved, convex, or non-flat profile corresponding or complementary to the recessed or concave side surface SW of the resistor metal layer RM.

A lowermost level of the top surface of the first insulating layer DL1 may be at a first level LV1. A lowermost level of the bottom surface of the resistor metal layer RM and the lowermost level of the bottom surface of the etch stop layer ESL may also be at the first level LV1. The lowermost level of the top surface of the first insulating layer DL1 and the lowermost level of the bottom surface of the resistor metal layer RM may be at substantially the same level. In an implementation, the lowermost level of the top surface of the first insulating layer DL1 and the lowermost level of the bottom surface of the etch stop layer ESL may be at substantially the same level. In an implementation, there may be no difference in level or height (e.g., distance from the substrate 100 in the third direction D3) between the bottom surface of the resistor metal layer RM and the top surface of the first insulating layer DL1. This may be because the afore-described etching process, which could otherwise be performed on the first insulating layer DL1 when the thicknesses of the first and second insulating layers DL1 and DL2 are different from each other, may not be performed.

The upper interconnection lines UIL may include a first portion S1, which may vertically overlap with the resistor metal layer RM, and a second portion S2, which may not vertically overlap with the resistor metal layer RM. The second portion S2 of the upper interconnection lines UIL may be a portion, which is horizontally or laterally (e.g., in the first direction D1) offset from the resistor metal layer RM.

A bottom surface of the first portion S1 of the upper interconnection line UIL may be at a second level LV2. A bottom surface of the second portion S2 of the upper interconnection line UIL may be at a third level LV3. The second level LV2 may be higher (e.g., farther from the substrate 100 in the third direction D3) than the third level LV3.

The bottom surface of the first portion S1 and the bottom surface of the second portion S2 may be connected to each other by an inclined portion SR. The inclined portion SR may be a portion of the bottom surface of the upper interconnection line UIL. The inclined portion SR may be a portion of the bottom surface of the upper interconnection line UIL that is inclined at an angle or curved. The bottom surface of the upper interconnection line UIL may have a non-flat, e.g., stepped, profile, due to the presence of the inclined portion SR.

The second vias VI2 may electrically connect the first portion S1 to the resistor metal layer RM. The third vias VI3 may electrically connect the second portion S2 to the first and second lower interconnection lines LIL1 and LIL2. The second vias VI2 may have top surfaces that are substantially coplanar with the bottom surface of the first portion S1. The third vias VI3 may have top surfaces that are substantially coplanar with the bottom surface of the second portion S2. The top surfaces of the second vias VI2 may be at a level that is higher than the top surfaces of the third vias VI3. The second vias VI2 may have bottom surfaces that are substantially coplanar with the top surface of the resistor metal layer RM. The third vias VI3 may have bottom surfaces that are substantially coplanar with the top surfaces of the first and second lower interconnection lines LIL1 and LIL2. The bottom surfaces of the second vias VI2 may be at a level that is higher than the bottom surfaces of the third vias VI3.

FIGS. 4, 6, 8, 10, 12, and 15 are plan views of stages in a method of fabricating a semiconductor device, according to an embodiment. FIGS. 5, 7A, 9A, 11A, 13A, 14A, 16A, 17A, and 18A are sectional views taken along lines A-A' of FIGS. 4, 6, 8, 10, 12, and 15, respectively. FIGS. 7B, 9B, 11B, 13B, 14B, 16B, 17B, and 18B are sectional views taken along lines B-B' of FIGS. 6, 8, 10, 12, and 15, respectively. FIGS. 9C, 11C, 13C, 14C, 16C, 17C, and 18C are sectional views taken along lines C-C' of FIGS. 8, 10, 12, and 15, respectively. FIGS. 9D, 11D, 13D, 14D, 16D, 17D, and 18D are sectional views taken along lines D-D' of FIGS. 8, 10, 12, and 15, respectively.

Figure 4:
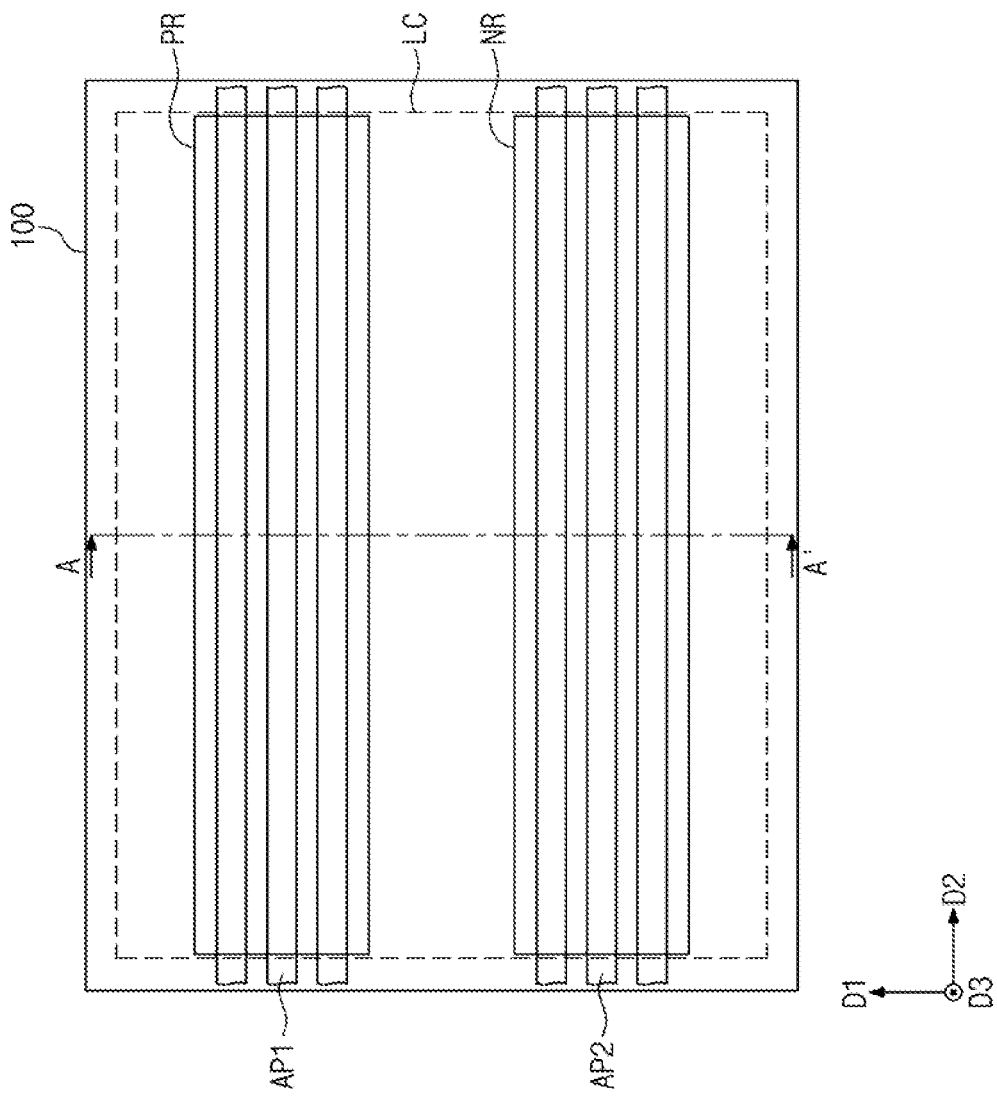
FIGS. 4, 6, 8, 10, 12, and 15 are plan views of stages in a method of fabricating a semiconductor device, according to an embodiment.
Figure 5:
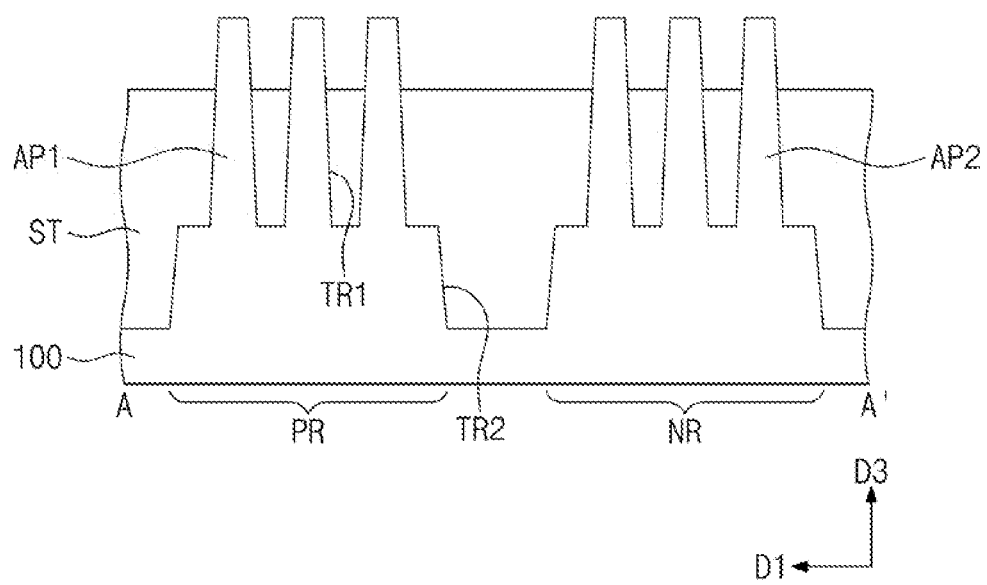
FIGS. 5, 7A, 9A, 11A, 13A, 14A, 16A, 17A, and 18A are sectional views taken along lines A-A' of FIGS. 4, 6, 8, 10, 12, and 15, respectively.

Referring to FIGS. 4 and 5, the substrate 100 including the first and second active regions PR and NR may be provided. The first and second active regions PR and NR may define the logic cell LC on the substrate 100.

The first and second active patterns AP1 and AP2 may be formed by patterning the substrate 100. The first active patterns AP1 may be formed on the first active region PR, and the second active patterns AP2 may be formed on the second active region NR. The first trench TR1 may be formed between the first active patterns AP1 and between the second active patterns AP2. The second trench TR2 may be formed by patterning a portion of the substrate 100 between the first and second active regions PR and NR. The second trench TR2 may be formed to have a depth that is larger than that of the first trench TR1.

The device isolation layer ST may be formed on the substrate 100 to fill the first and second trenches TR1 and TR2. The device isolation layer ST may be formed of or include an insulating material (e.g., silicon oxide). The device isolation layer ST may be recessed to expose upper portions of the first and second active patterns AP1 and AP2. In an implementation, the upper portions of the first and second active patterns AP1 and AP2 may protrude vertically above the device isolation layer ST.

Figure 6:
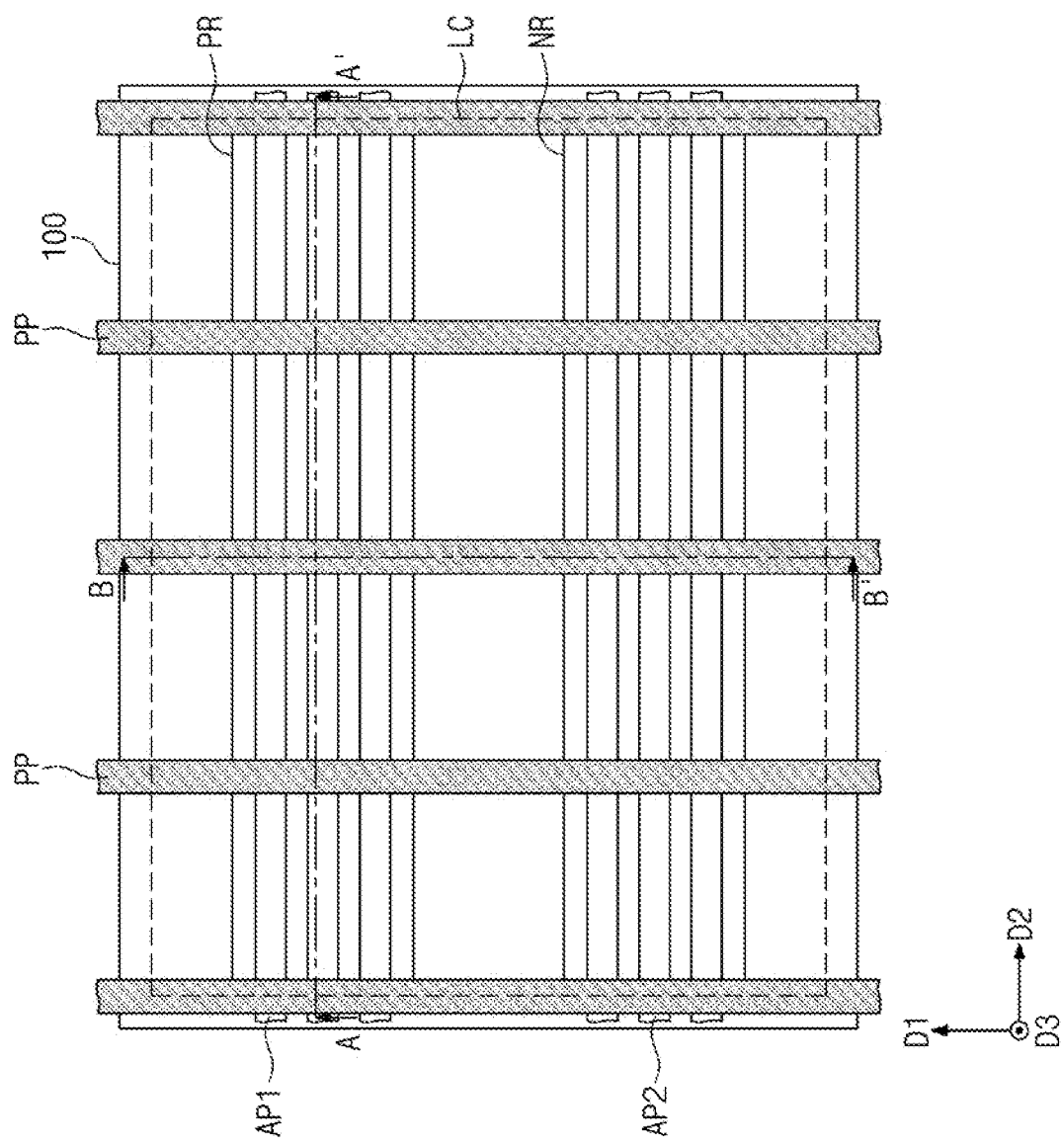
Figure 7A:
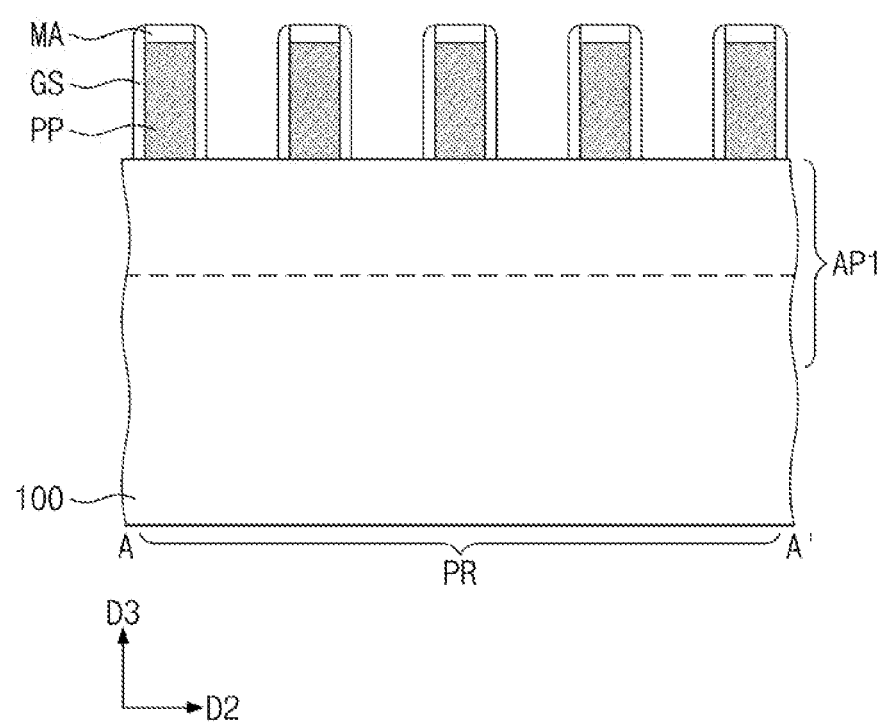
Figure 7B:
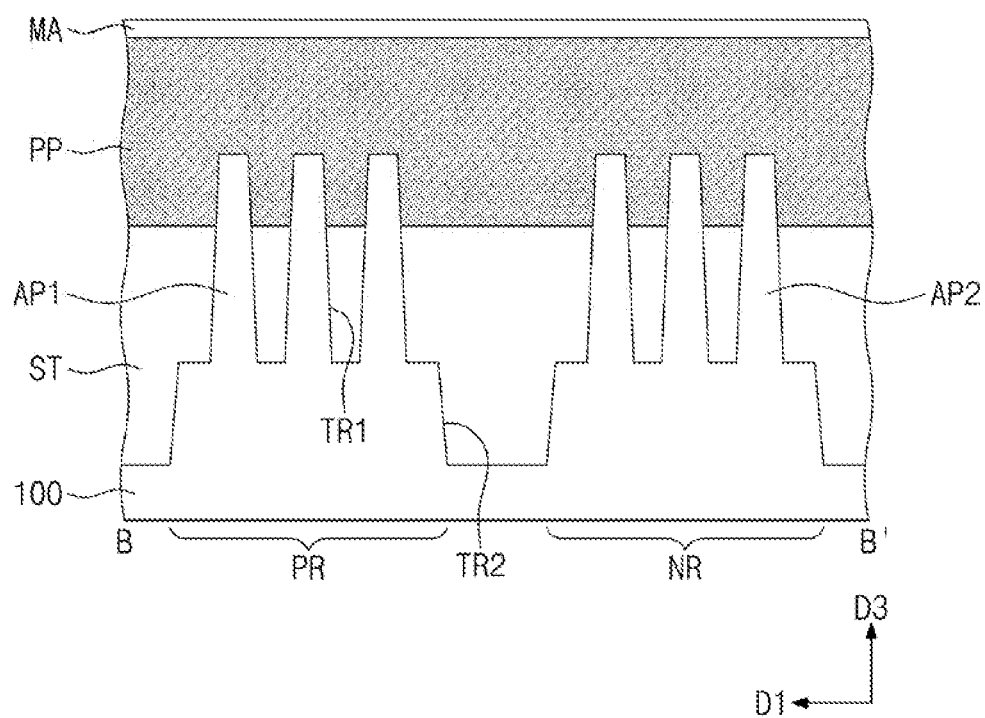
FIGS. 7B, 9B, 11B, 13B, 14B, 16B, 17B, and 18B are sectional views taken along lines B-B' of FIGS. 6, 8, 10, 12, and 15, respectively.
Figure 8:
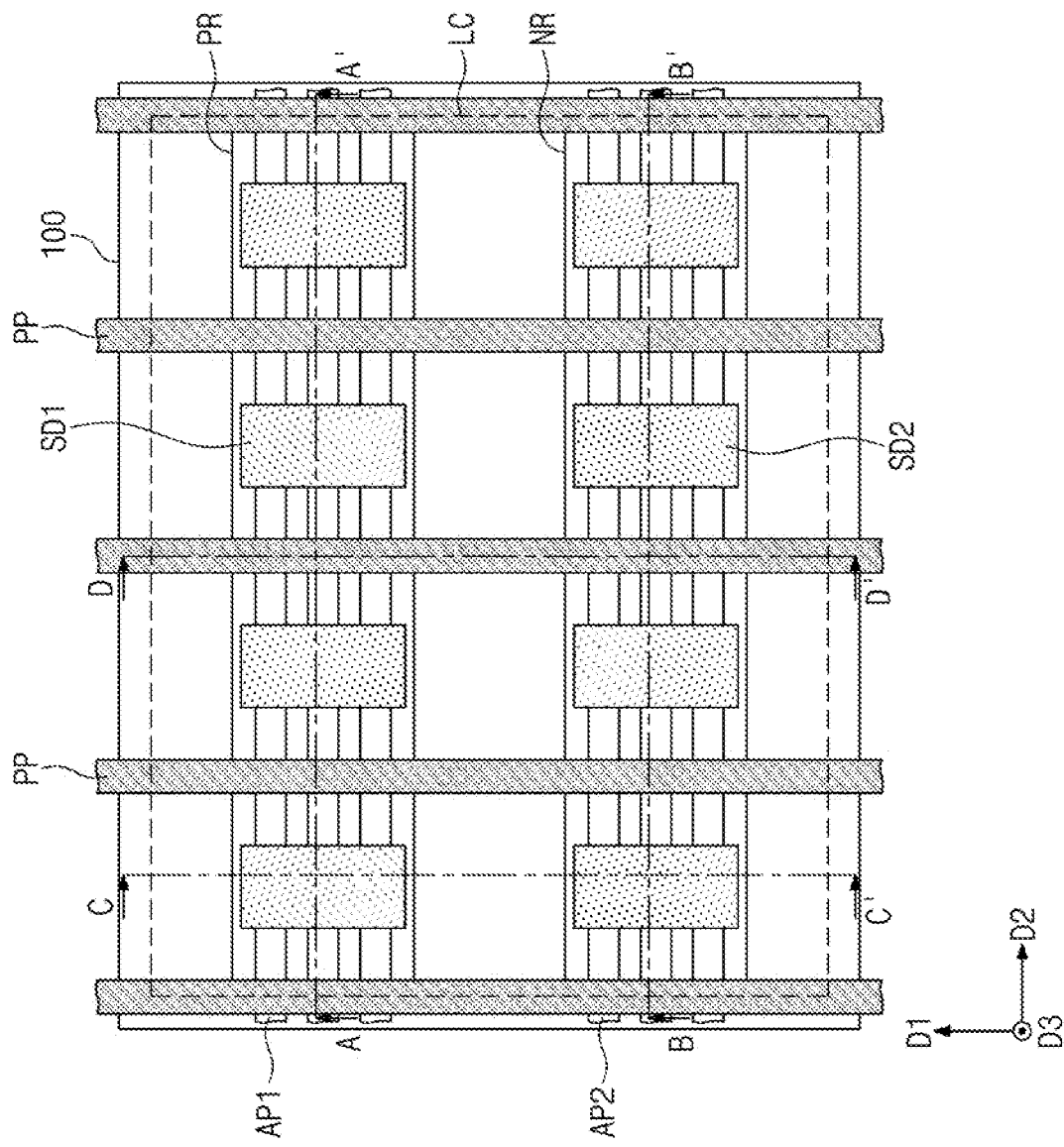
Figure 9A:
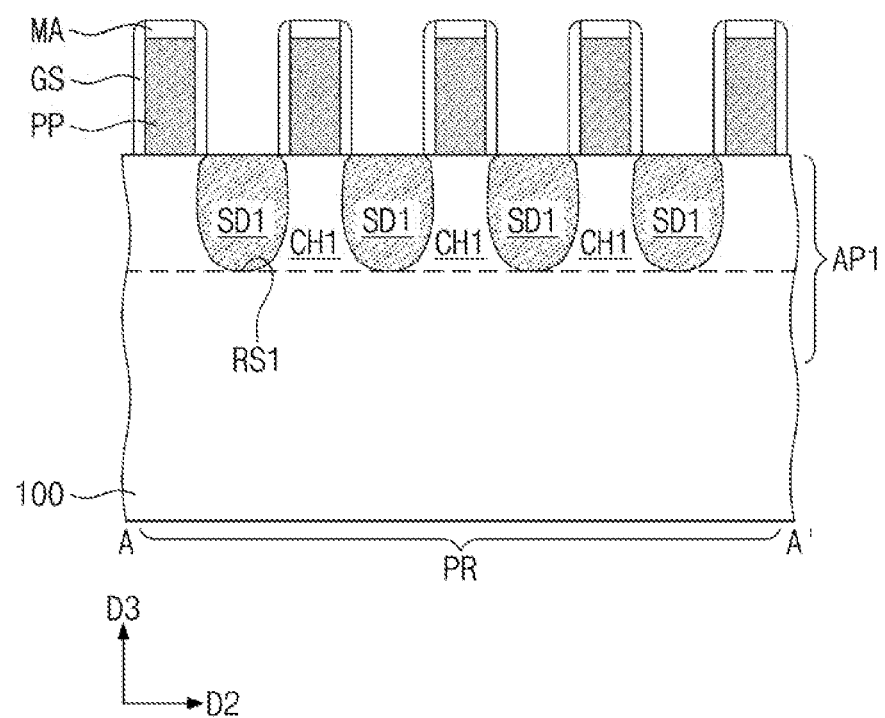
Figure 9B:
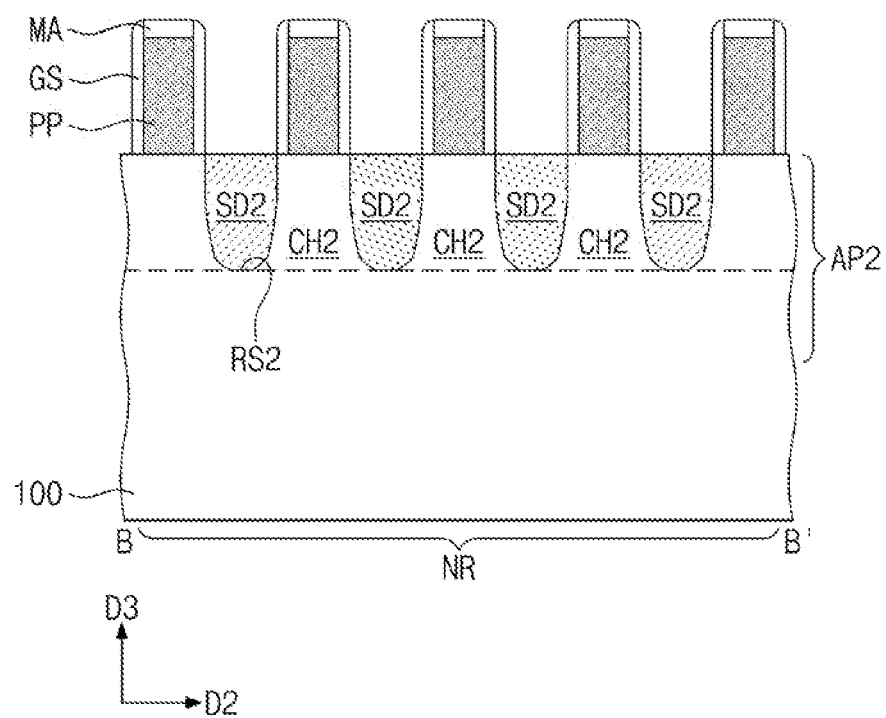
Figure 9C:
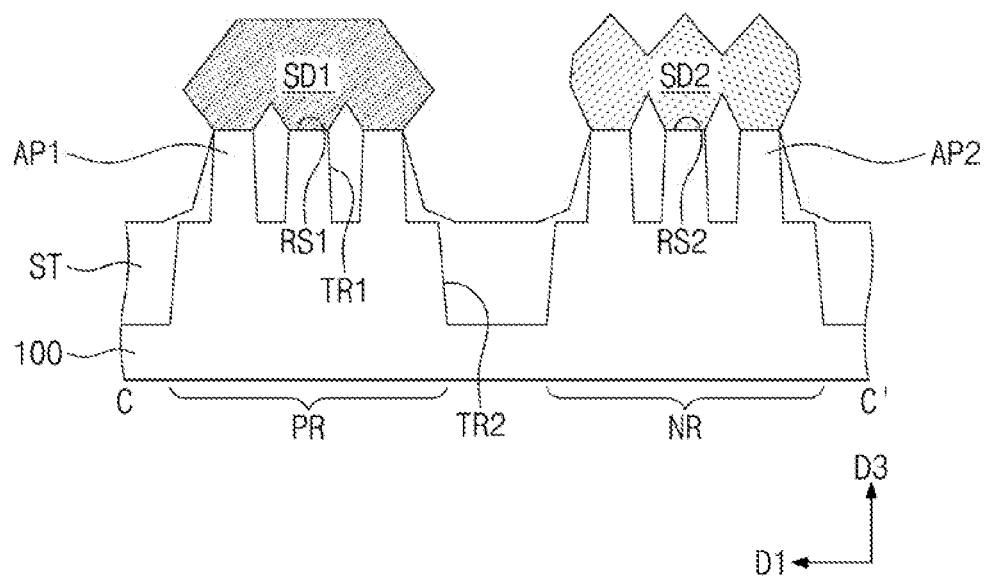
FIGS. 9C, 11C, 13C, 14C, 16C, 17C, and 18C are sectional views taken along lines C-C' of FIGS. 8, 10, 12, and 15, respectively.
Figure 9D:
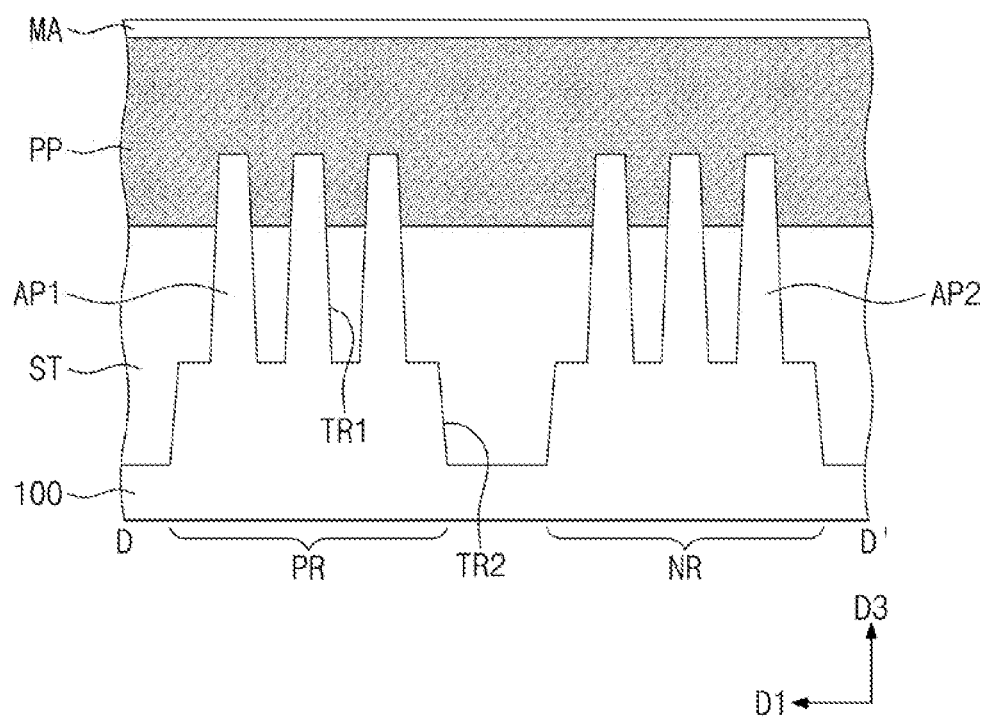
FIGS. 9D, 11D, 13D, 14D, 16D, 17D, and 18D are sectional views taken along lines D-D' of FIGS. 8, 10, 12, and 15, respectively.
Figure 10:
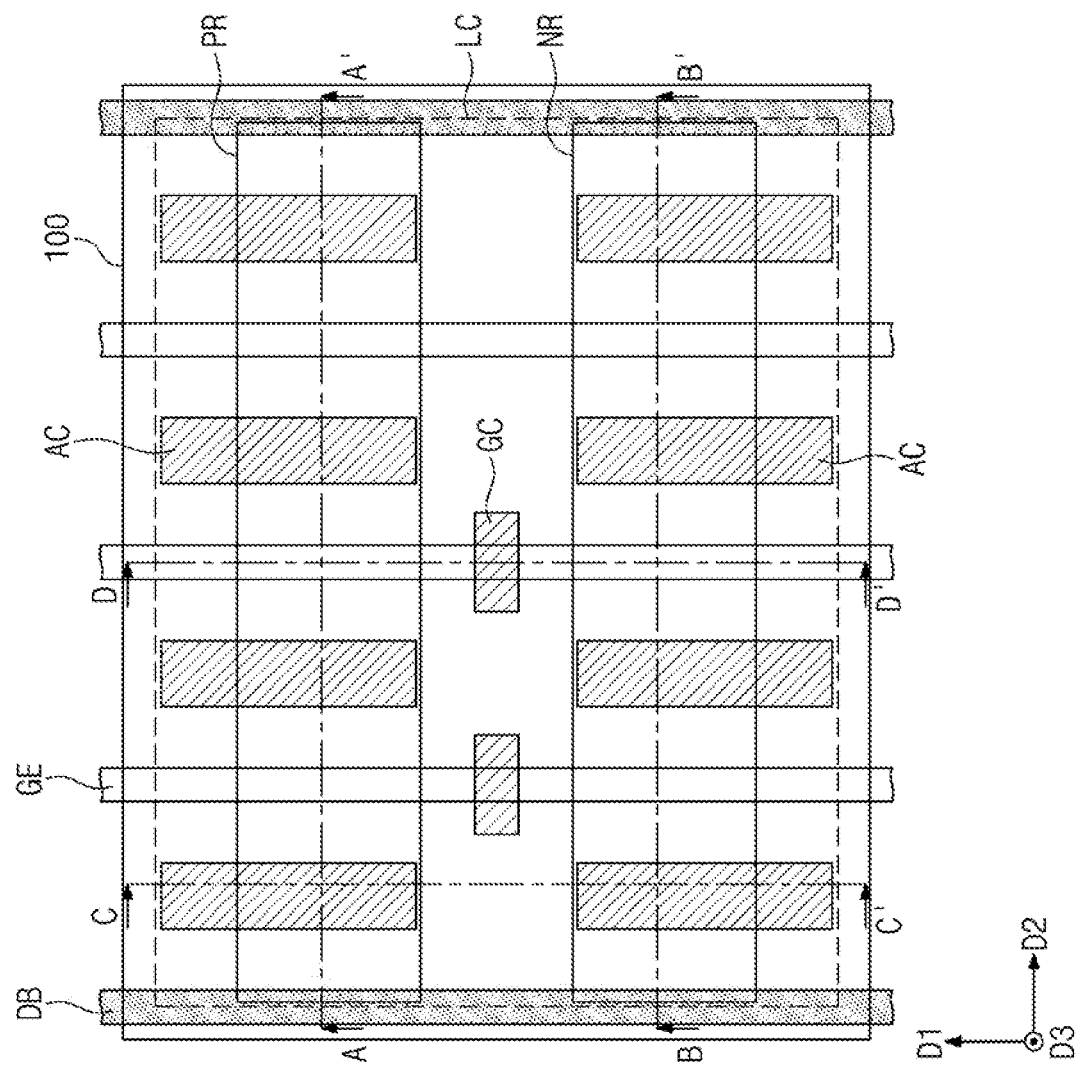
Figure 11A:
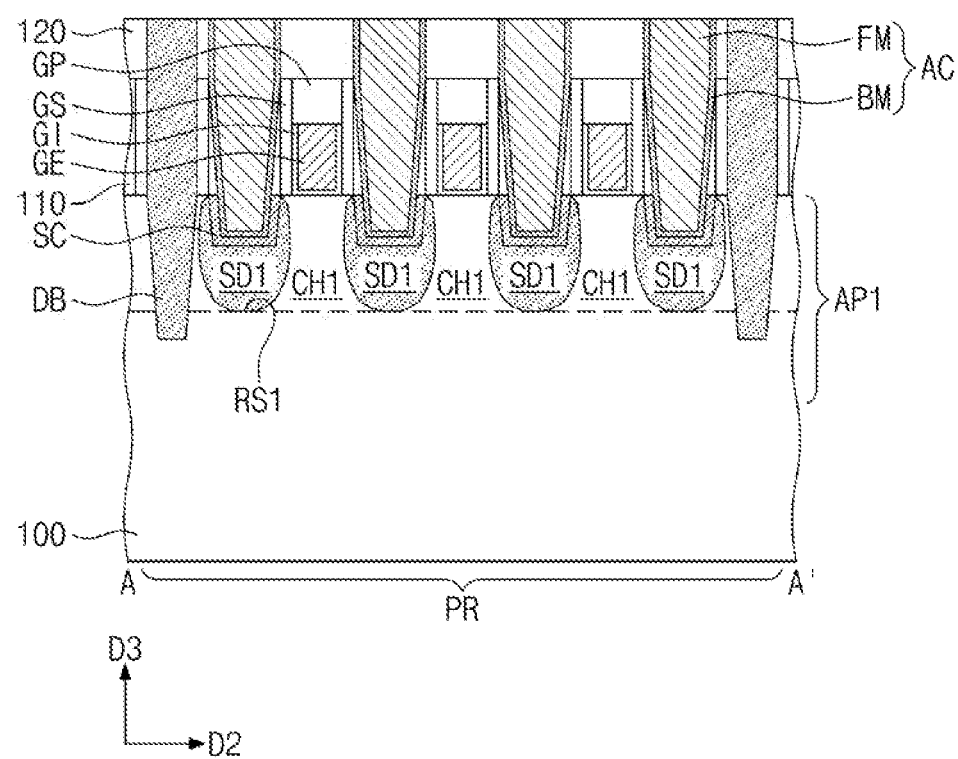
Figure 11B:
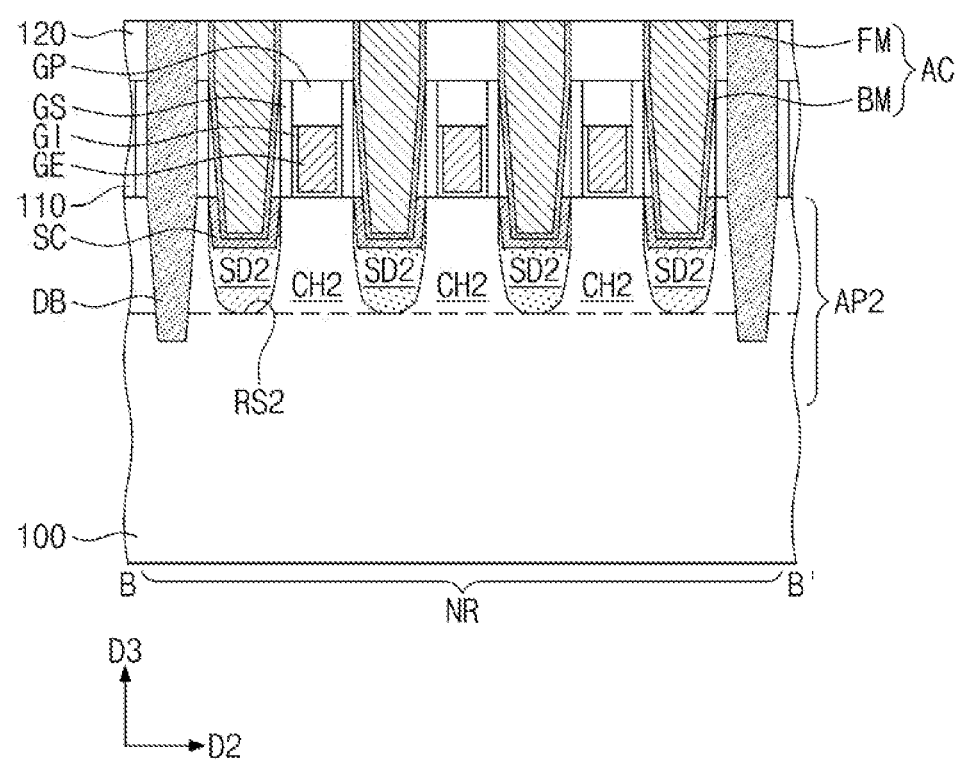
Figure 11C:
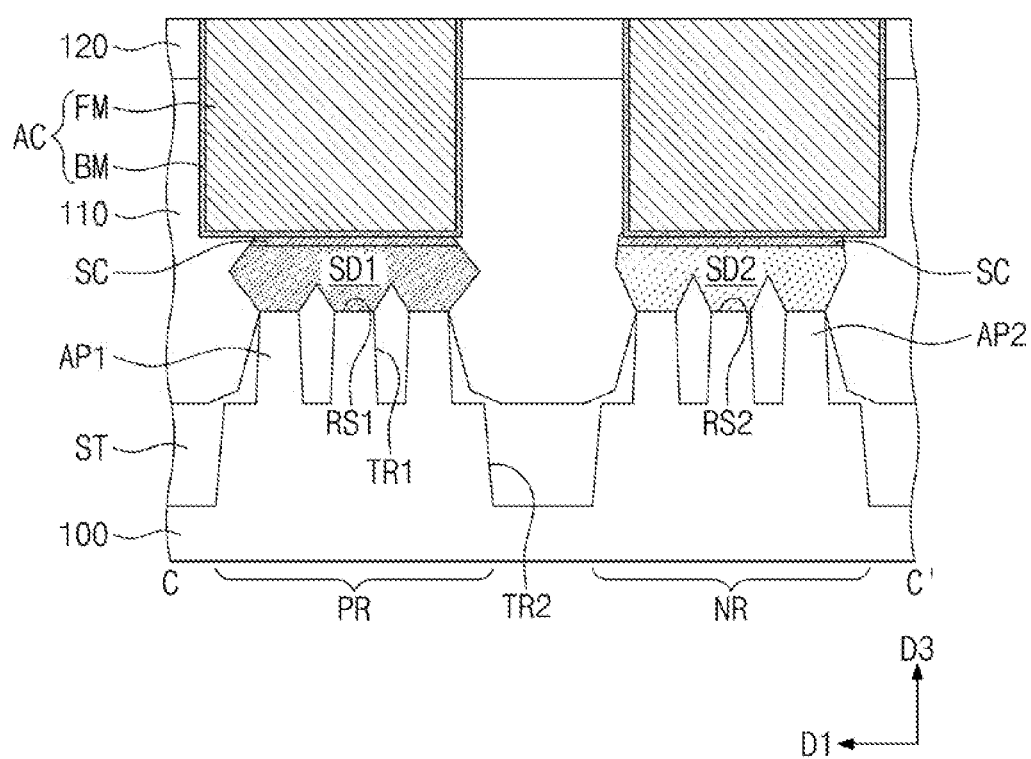
Figure 11D:
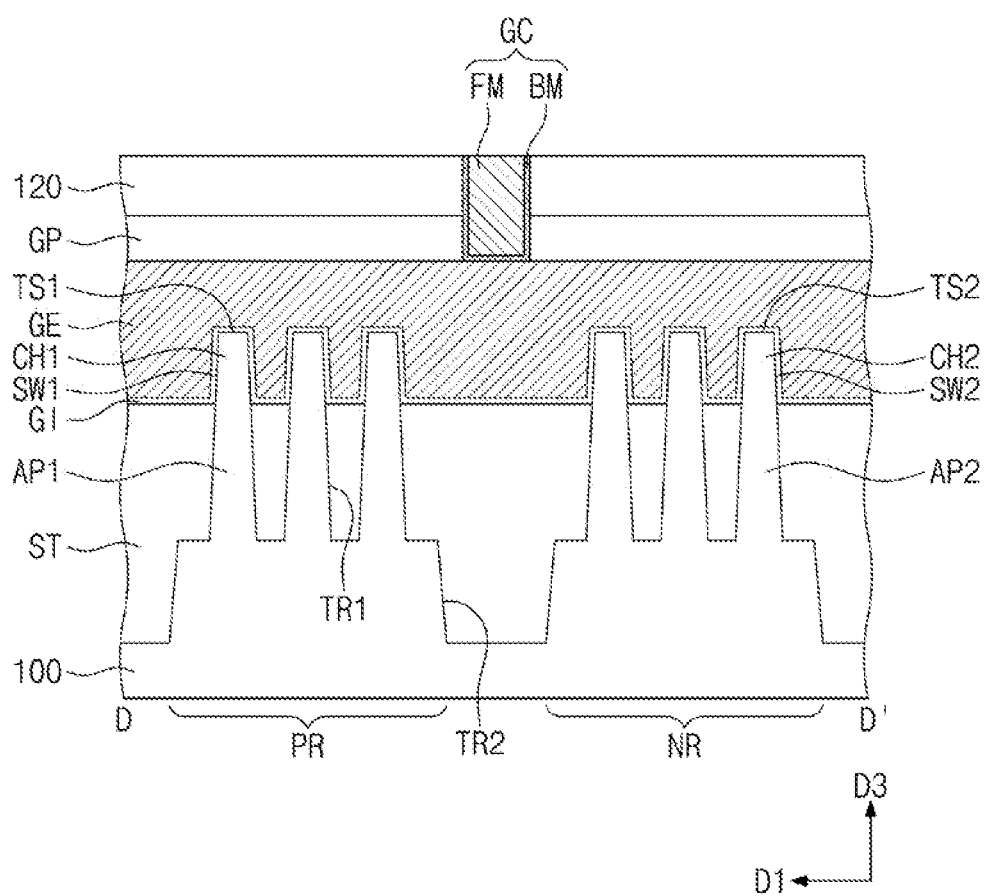
Figure 12:
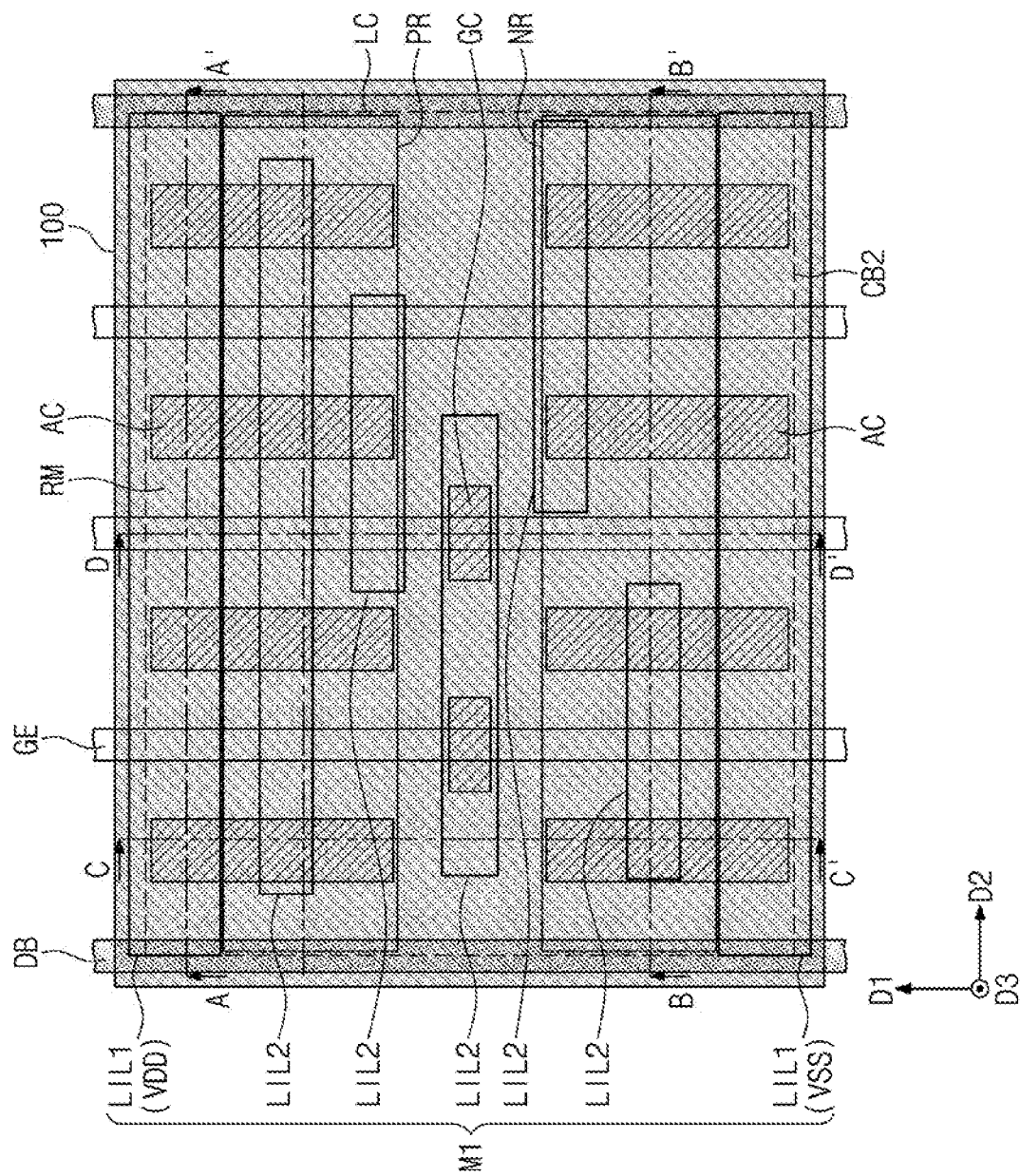
Figure 13A:
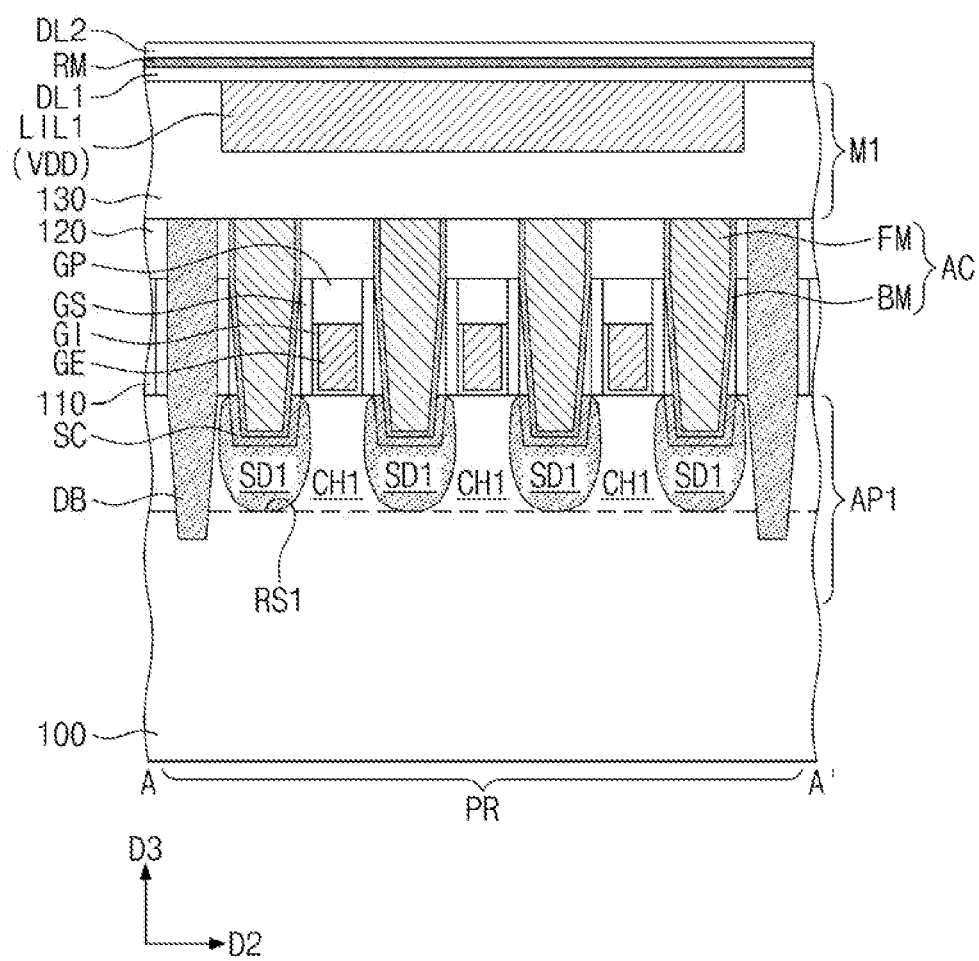
Figure 13B:
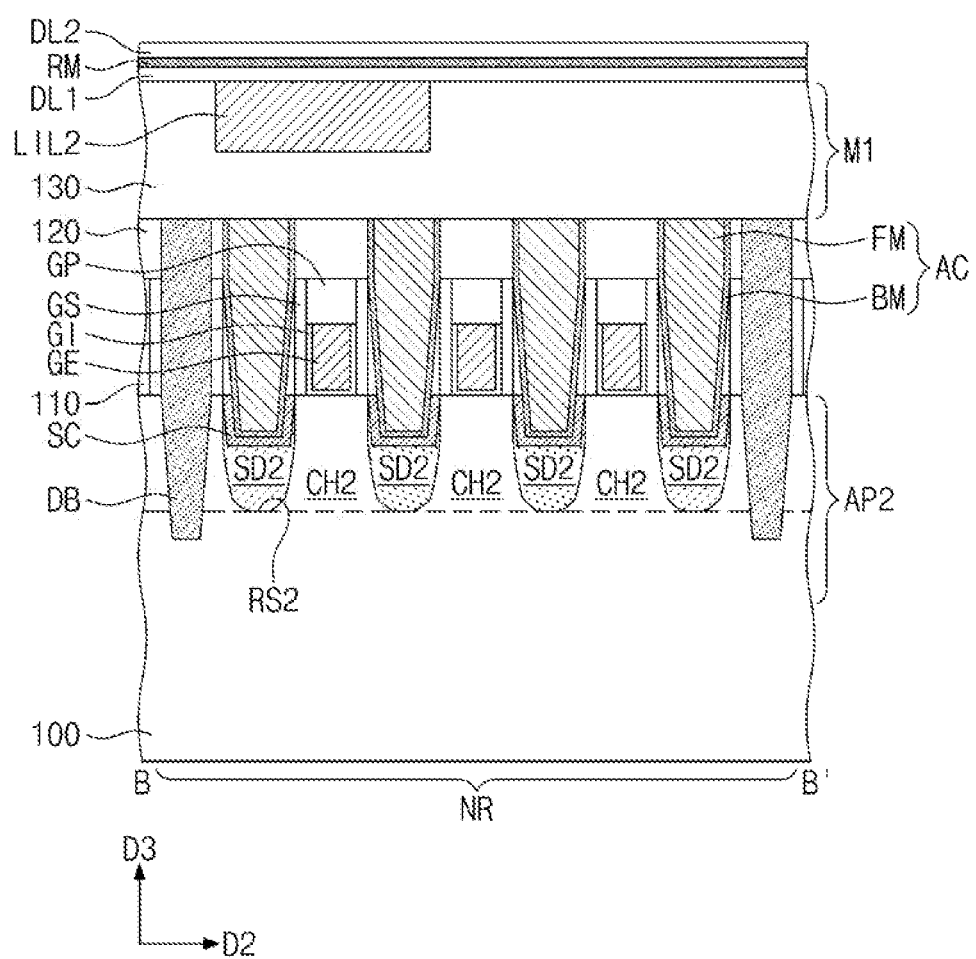
Figure 13C:
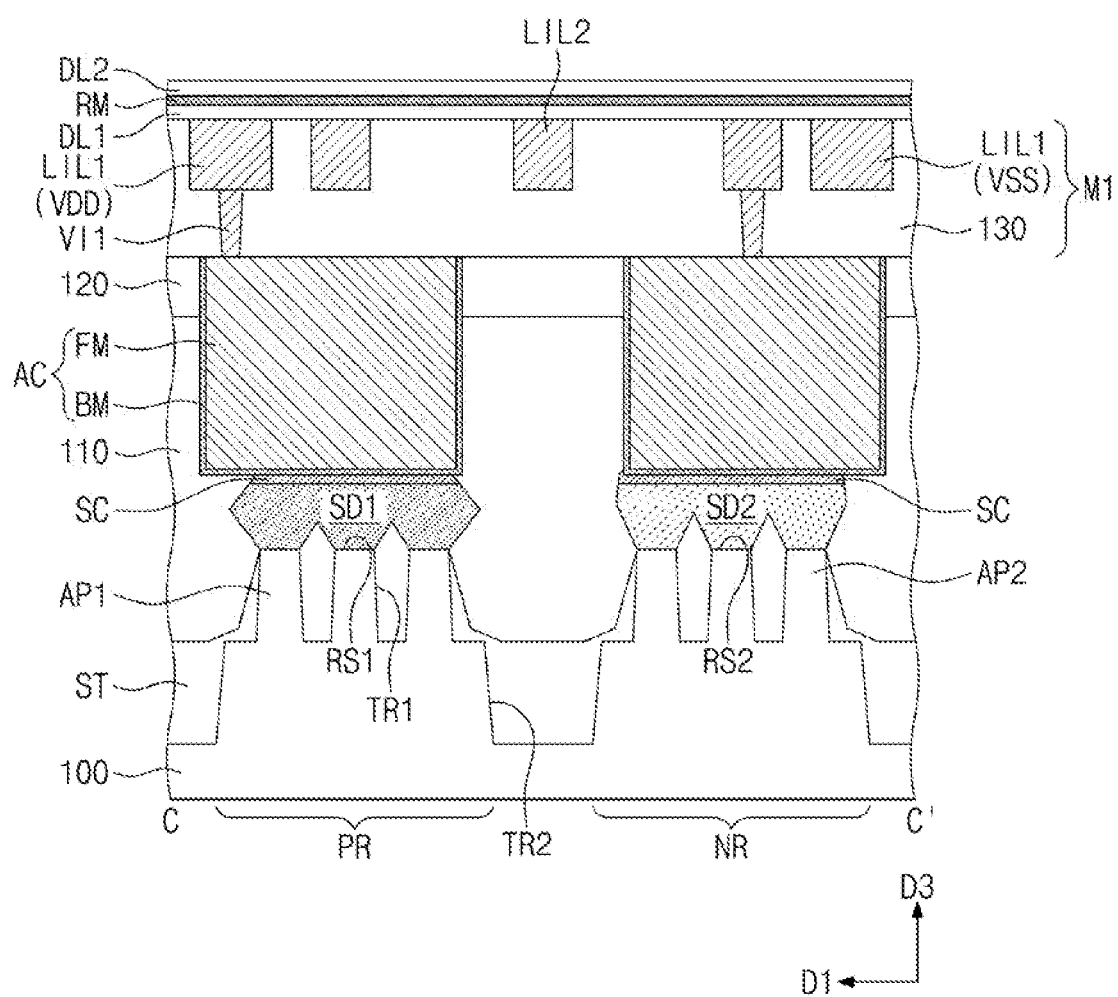
Figure 13D:
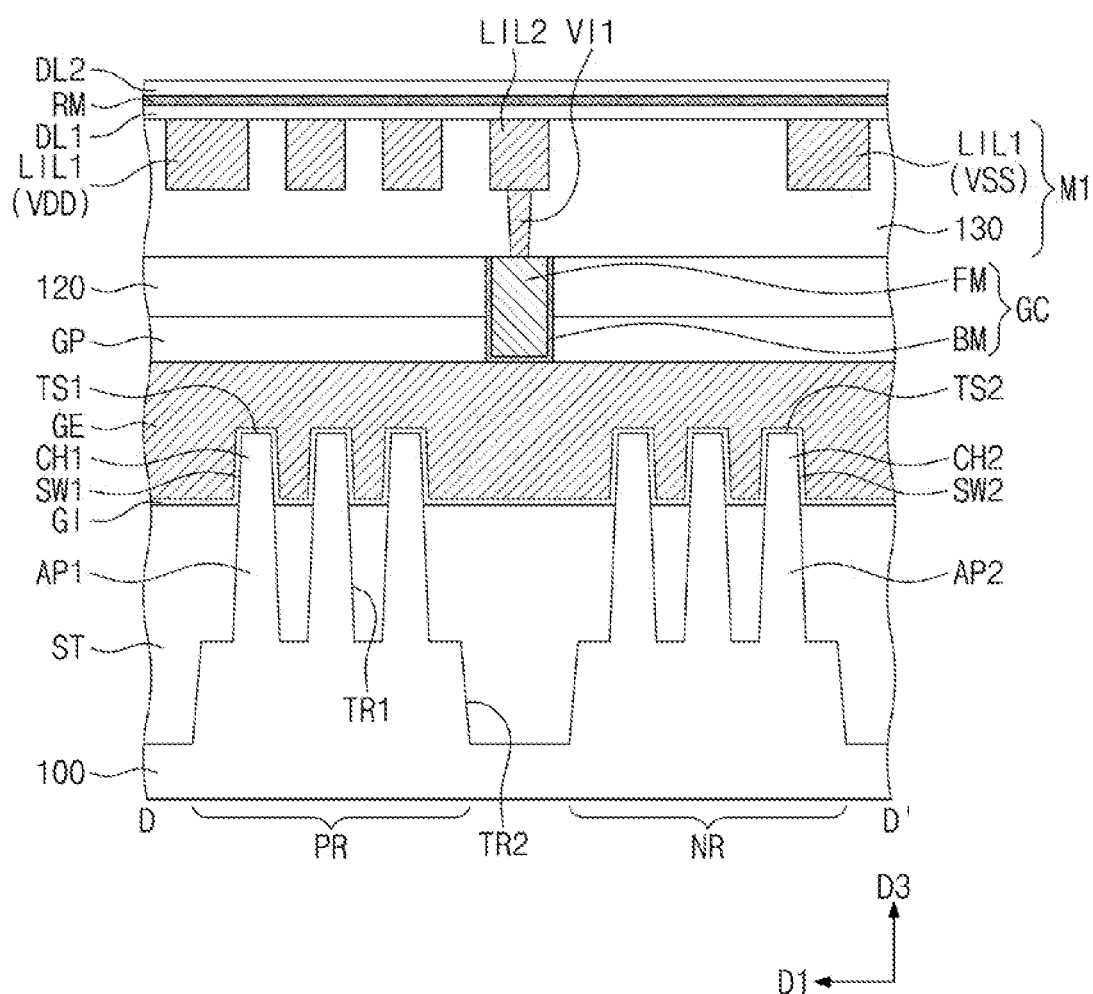
Figure 14A:
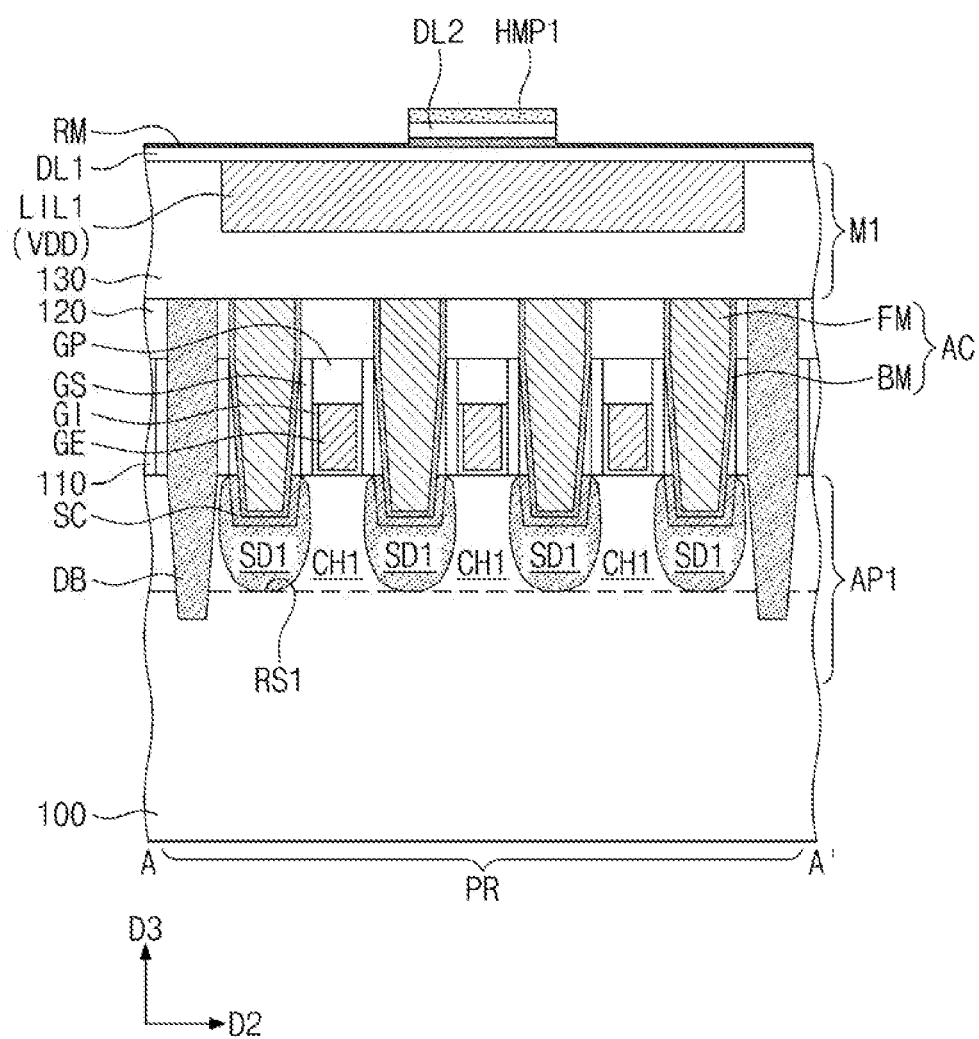
Figure 14B:
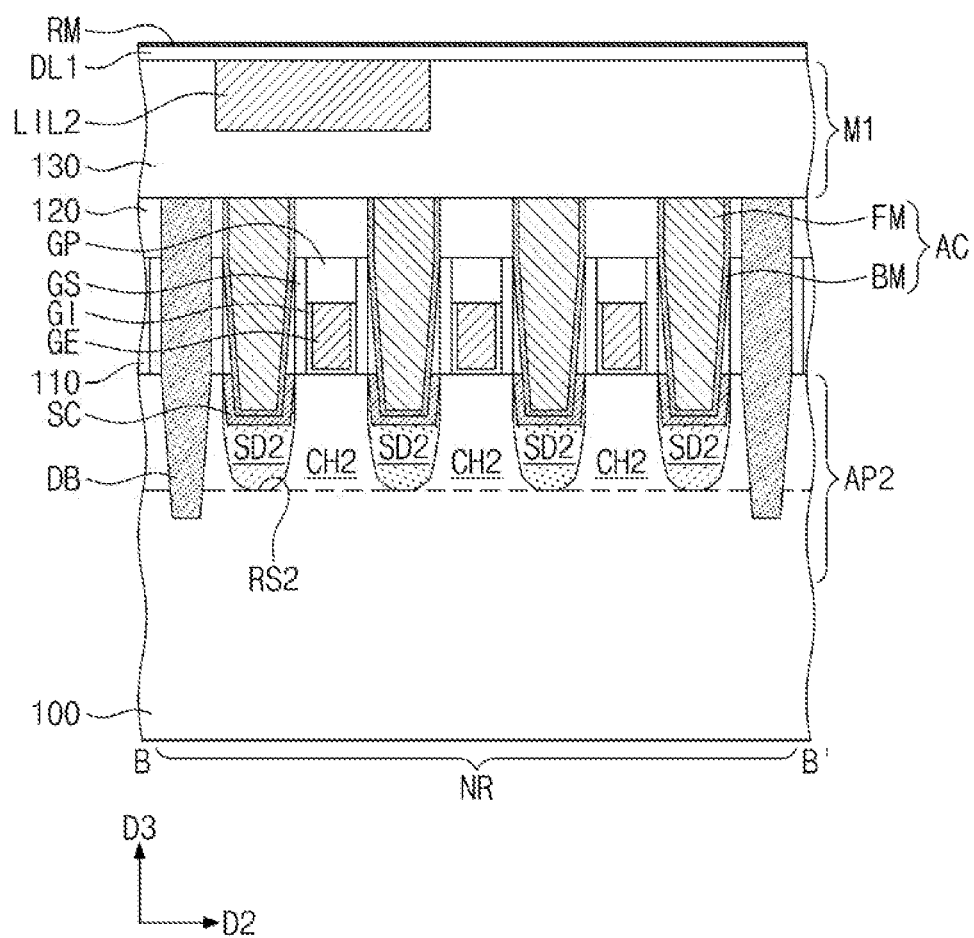
Figure 14C:
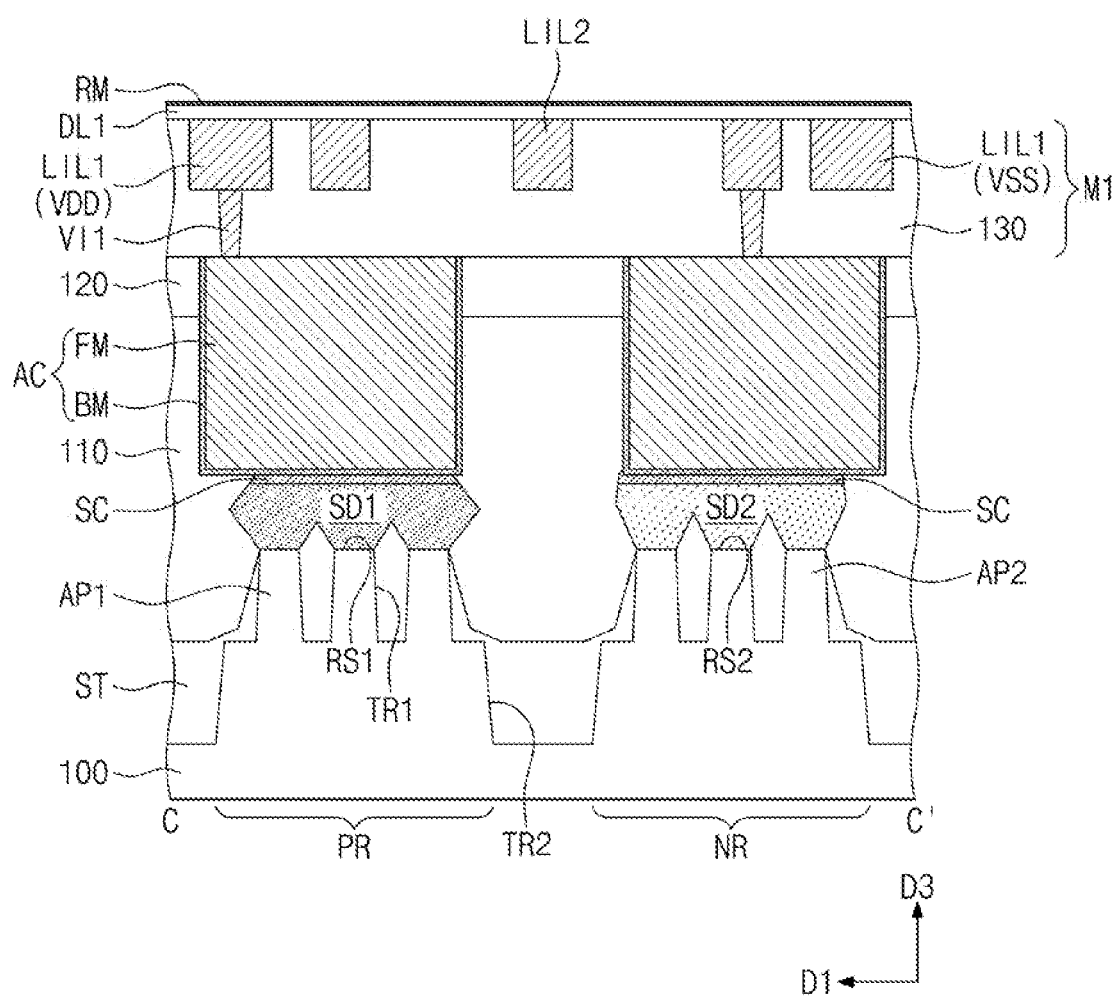
Figure 14D:
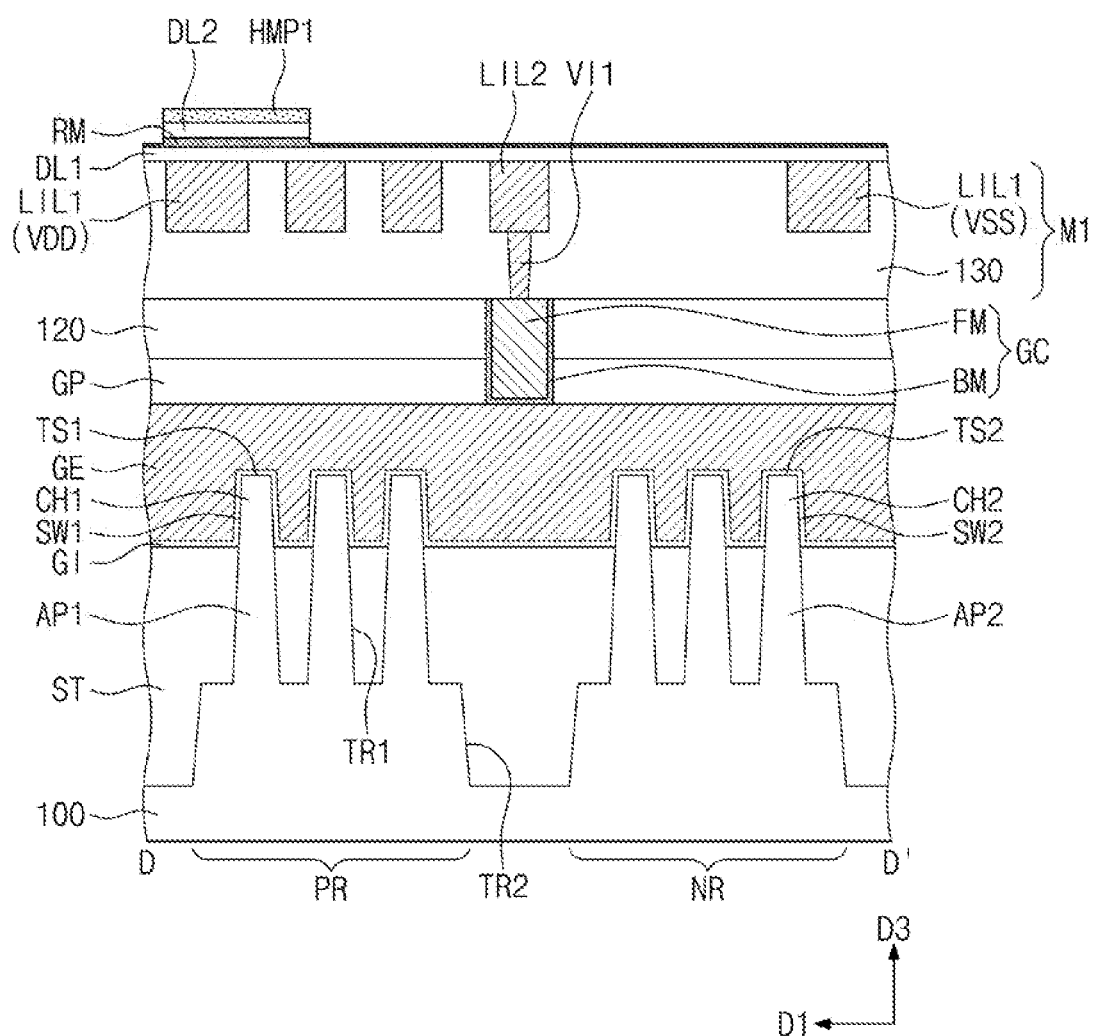

Referring to FIGS. 6, 7A, and 7B, sacrificial patterns PP may be formed to cross the first and second active patterns AP1 and AP2. The sacrificial patterns PP may be formed to have a line or bar shape extending in the first direction D1.

The sacrificial patterns PP may be arranged with the first pitch in the second direction D2.

In an implementation, the formation of the sacrificial patterns PP may include forming a sacrificial layer on the substrate 100, forming mask patterns MA on the sacrificial layer, and patterning the sacrificial layer using the mask patterns MA as an etch mask. The sacrificial layer may be formed of or include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. In an implementation, the gate spacer layer may be formed of or include SiCN, SiCON, or SiN. In an implementation, the gate spacer layer may be a multi-layered structure including at least two of SiCN, SiCON, or SiN layers.

Referring to FIGS. 8 and 9A to 9D, the first source/drain patterns SD1 may be formed in an upper portion of the first active pattern AP1. A pair of the first source/drain patterns SD1 may be formed at both sides of each of the sacrificial patterns PP.

In an implementation, first recesses RS1 may be formed by etching the upper portion of the first active pattern AP1 using the mask patterns MA and the gate spacers GS as an etch mask. The device isolation layer ST between the first active patterns AP1 may be recessed during the etching of the upper portion of the first active pattern AP1 (e.g., see FIG. 9C).

The first source/drain pattern SD1 may be formed by performing a selective epitaxial growth process using an inner side surface of the first recess RS1 of the first active pattern AP1 as a seed layer. As a result of the formation of the first source/drain patterns SD1, the first channel pattern CH1 may be defined between each pair of the first source/drain patterns SD1. In an implementation, the selective epitaxial growth process may include a chemical vapor deposition (CVD) process or a molecular beam epitaxy (MBE) process. The first source/drain patterns SD1 may include a semiconductor element (e.g., SiGe), whose lattice constant is larger than a lattice constant of a semiconductor element in the substrate 100. Each of the first source/drain patterns SD1 may be a multi-layered structure including a plurality of semiconductor layers.

In an implementation, the first source/drain patterns SD1 may be doped in situ during a selective epitaxial growth process. In an implementation, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both sides of each of the sacrificial patterns PP.

In an implementation, second recesses RS2 may be formed by etching an upper portion of the second active pattern AP2 using the mask patterns MA and the gate spacers GS as an etch mask. The second source/drain pattern SD2 may be formed by performing a selective epitaxial growth process using an inner side surface of the second recess RS2 of the second active pattern AP2 as a seed layer, may be performed to form. As a result of the formation of the second source/drain patterns SD2, the second channel pattern CH2 may be defined between each pair of the second source/drain patterns SD2. In an implementation, the second source/drain patterns SD2 may include the same semiconductor element (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In an implementation, the second source/drain patterns SD2 of the first source/drain patterns SD1 may not be formed at the same time.

Referring to FIGS. 10 and 11A to 11D, the first interlayer insulating layer 110 may be formed to cover the first and second source/drain patterns SD1 and SD2, the mask patterns MA, and the gate spacers GS. In an implementation, the first interlayer insulating layer 110 may be formed of or include silicon oxide.

The first interlayer insulating layer 110 may be planarized to expose the top surfaces of the sacrificial patterns PP. The planarization of the first interlayer insulating layer 110 may be performed using an etch-back or chemical mechanical polishing (CMP) process. In an implementation, the planarization process may be performed to fully remove the mask patterns MA. In an implementation, the first interlayer insulating layer 110 may have a top surface that is coplanar with the top surfaces of the sacrificial patterns PP and the top surfaces of the gate spacers GS.

The sacrificial patterns PP may be replaced with the gate electrodes GE, respectively. In an implementation, the exposed sacrificial patterns PP may be selectively removed. As a result of the removal of the sacrificial patterns PP, empty spaces may be formed. The gate dielectric pattern GI, the gate electrode GE, and the gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a metallic material whose resistance is low.

The second interlayer insulating layer 120 may be formed on the first interlayer insulating layer 110. The second interlayer insulating layer 120 may be formed of or include silicon oxide. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the isolation structures DB may be formed along both sides of the logic cell LC, which are opposite to each other in the second direction D2. The isolation structures DB may be formed to overlap with the gate electrodes GE, which are formed at the both sides of the logic cell LC. In an implementation, the formation of the isolation structures DB may include forming a hole, which may extended into the first and second active patterns AP1 and AP2 through the first and second interlayer insulating layers 110 and 120 and the gate electrode GE, and then filling the hole with an insulating layer.

Referring to FIGS. 12 and 13A to 13D, the third interlayer insulating layer 130 may be formed on the second interlayer insulating layer 120. The third interlayer insulating layer 130 may include a silicon oxide layer. The first metal-containing layer M1 may be formed in the third interlayer insulating layer 130. The first metal-containing layer M1 may include the first and second lower interconnection lines LIL1 and LIL2 and the first vias VI1. The first and second lower interconnection lines LIL1 and LIL2 may extend (e.g., lengthwise) in the second direction D2. In an implementation, the first and second lower interconnection lines LIL1 and LIL2 may be formed using a damascene process. The first vias VI1 may be formed below the first and second lower interconnection lines LIL1 and LIL2.

The first insulating layer DL1, the resistor metal layer RM, and the second insulating layer DL2 may be sequentially formed on the first metal-containing layer M1. The first insulating layer DL1, the resistor metal layer RM, and the second insulating layer DL2 may be formed to cover the entire top surface of the first metal-containing layer M1. In an implementation, the first and second insulating layers DL1 and DL2 may have substantially the same thickness. In an implementation, a ratio of the thickness of the first insulating layer DL1 to the thickness of the second insulating layer DL2 may range from 0.8 to 1.2. A thickness of the resistor metal layer RM may be smaller than the thickness of the first and second insulating layers DL1 and DL2.

Referring to FIGS. 12 and 14A to 14D, a first hard mask pattern HMP1 may be formed on the second insulating layer DL2. In an implementation, the first hard mask pattern HMP1 may be formed of or include titanium nitride (TiN).

An etching process using the first hard mask pattern HMP1 as an etch mask may be performed on the second insulating layer DL2 and the resistor metal layer RM. The etching process may be a dry etching process. The etching process may include forming a first hard mask layer on the second insulating layer DL2, patterning the first hard mask layer to form the first hard mask pattern HMP1, and anisotropically etching the second insulating layer DL2 and the resistor metal layer RM using the first hard mask pattern HMP1 as an etch mask.

The etching process may be performed such that the top surface of the first insulating layer DL1 is not exposed. In an implementation, at least a portion of the resistor metal layer RM may be left or remain on the entire top surface of the first metal-containing layer M1 (or on the first insulating layer DL1). In an implementation, the resistor metal layer RM may serve as an etch stop layer. In an implementation, it is possible to prevent the first insulating layer DL1 from having an etch damage caused by the etching process, and to prevent defects from being formed on the first insulating layer DL1. In an implementation, the resistor metal layer RM may serve as the etch stop layer, and a process of forming an additional etch stop layer may be omitted.

Referring to FIGS. 15 and 16A to 16D, an etching process using the first hard mask pattern HMP1 as an etch mask may be performed on the resistor metal layer RM. The etching process may be a wet etching process. The etching process may be performed to expose the top surface of the first insulating layer DL1.

The side surface SW of the resistor metal layer RM may be recessed by the etching process. The recessed side surface SW of the resistor metal layer RM may be recessed toward a center of the resistor metal layer RM. The recessed side surface SW of the resistor metal layer RM may be recessed in an inward direction away from a side surface of the second insulating layer DL2. In an implementation, the recessed side surface SW of the resistor metal layer RM may have a curved, concave, or non-flat profile. The recess region RSR may be defined by the recessed side surface SW of the resistor metal layer RM. As a result of the wet etching process, the final structure of the resistor RES may be formed.

Referring to FIGS. 15 and 17A to 17D, the first hard mask pattern HMP1 may be removed. The first hard mask pattern HMP1 may be removed by, e.g., a wet etching process, an ashing process, or a polishing process. The etch stop layer ESL may be formed on a top surface of the resistor RES. The etch stop layer ESL may be formed to cover the entire top surface of the first metal-containing layer M1. In an implementation, the etch stop layer ESL may cover the top and side surfaces of the second insulating layer DL2, the top surface of the first insulating layer DL1, and the recessed side surface SW of the resistor metal layer RM. In an implementation, the etch stop layer ESL may be formed of or include aluminum oxide (AlO).

The etch stop layer ESL may include the protruding portion PT, which protrudes toward the recessed side surface SW of the resistor metal layer RM. The protruding portion PT may fill the recess region RSR of the resistor metal layer RM. In an implementation, the protruding portion PT may be formed in the recess region RSR. The protruding portion PT may vertically overlap with the second insulating layer DL2. The protruding portion PT may have a curved, convex, or non-flat profile corresponding or complementary to the recessed side surface SW of the resistor metal layer RM.

Referring to FIGS. 15 and 18A to 18D, the fourth interlayer insulating layer 140 may be formed on the resistor RES. The fourth interlayer insulating layer 140 may include a silicon oxide layer. A top surface of the fourth interlayer insulating layer 140 may have a non-flat profile. In an implementation, a top surface of the fourth interlayer insulating layer 140, which vertically overlaps with the resistor metal layer RM, may be at a level that is higher than a top surface of the fourth interlayer insulating layer 140, which does not vertically overlap with the resistor metal layer RM.

A second hard mask pattern may be formed on the fourth interlayer insulating layer 140. In an implementation, the second hard mask pattern may be formed of or include the same material as the first hard mask pattern HMP1.

Openings may be formed by etching the fourth interlayer insulating layer 140 using the second hard mask pattern as an etch mask. The formation of the openings may include forming a second hard mask layer on the fourth interlayer insulating layer 140, patterning the second hard mask layer to form the second hard mask pattern, and anisotropically etching the fourth interlayer insulating layer 140 using the second hard mask pattern as an etch mask. The openings may be formed to expose a top surface of the etch stop layer ESL.

An etching process may be performed to remove portions of the etch stop layer ESL exposed by the openings. The etching process may be a wet etching process. In an implementation, the second hard mask pattern may also be removed by the etching process. The etch stop layer ESL may be partially removed by the etching process, and the top surfaces of the first and second insulating layers DL1 and DL2 may be exposed through the openings.

Next, an etching process may be performed to remove portions of the first and second insulating layers DL1 and DL2 exposed by the openings. The etching process may be a dry etching process. In an implementation, the first and second insulating layers DL1 and DL2 may be formed to have substantially the same thickness, and it is possible to help prevent the first and second lower interconnection lines LIL1 and LIL2 and the resistor metal layer RM from being undesirably etched. Accordingly, the reliability of the semiconductor device may be improved.

As a result of the partial removal of the first and second insulating layers DL1 and DL2, first openings OP1 and second openings OP2 may be formed. The first openings OP1 may be holes penetrating the fourth interlayer insulating layer 140, the etch stop layer ESL, and the second insulating layer DL2. The second openings OP2 may be holes penetrating the fourth interlayer insulating layer 140, the etch stop layer ESL, and the first insulating layer DL1. The first openings OP1 may be formed to expose the top surface of the resistor metal layer RM. The second openings OP2 may be formed to expose the top surfaces of the first and second lower interconnection lines LIL1 and LIL2.

Referring back to FIGS. 1, 2A to 2E, and 3, the second vias VI2 and the third vias VI3 may be formed in the second metal-containing layer M2. The second vias VI2 and the third vias VI3 may be formed in the first openings OP1 and the second openings OP2, respectively, which were described with reference to FIGS. 15 and 18A to 18D. The upper interconnection lines UIL may be formed on the fourth interlayer insulating layer 140. The upper interconnection lines UIL may include the first portion S1, which vertically overlaps with the resistor metal layer RM, and the second portion S2, which does not vertically overlap with the resistor metal layer RM. The second portion S2 may be a portion, which is horizontally offset from the resistor metal layer RM.

An insulating layer may be additionally deposited on the fourth interlayer insulating layer 140. The insulating layer may include a silicon oxide layer. The fourth interlayer insulating layer 140 may cover the top and side surfaces of the upper interconnection lines UIL.

Next, a planarization process may be performed on the fourth interlayer insulating layer 140. The planarization process may be performed to expose top surfaces of the upper interconnection lines UIL. The planarization process may be performed using an etch-back or chemical mechanical polishing (CMP) process.

Figure 19:
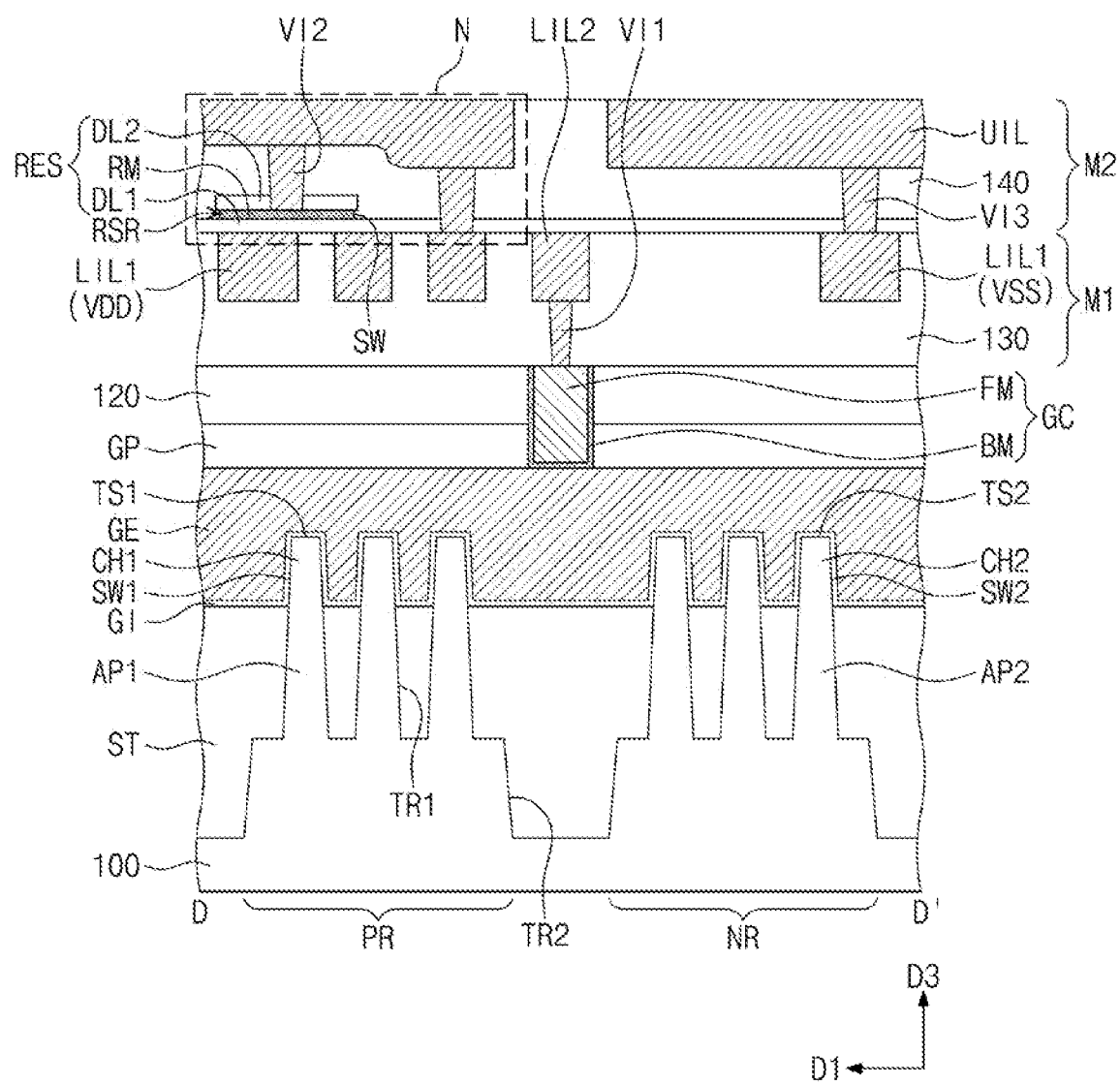
FIG. 19 is a sectional view taken along the line D-D' of FIG. 1 of a semiconductor device according to an embodiment.
Figure 20:
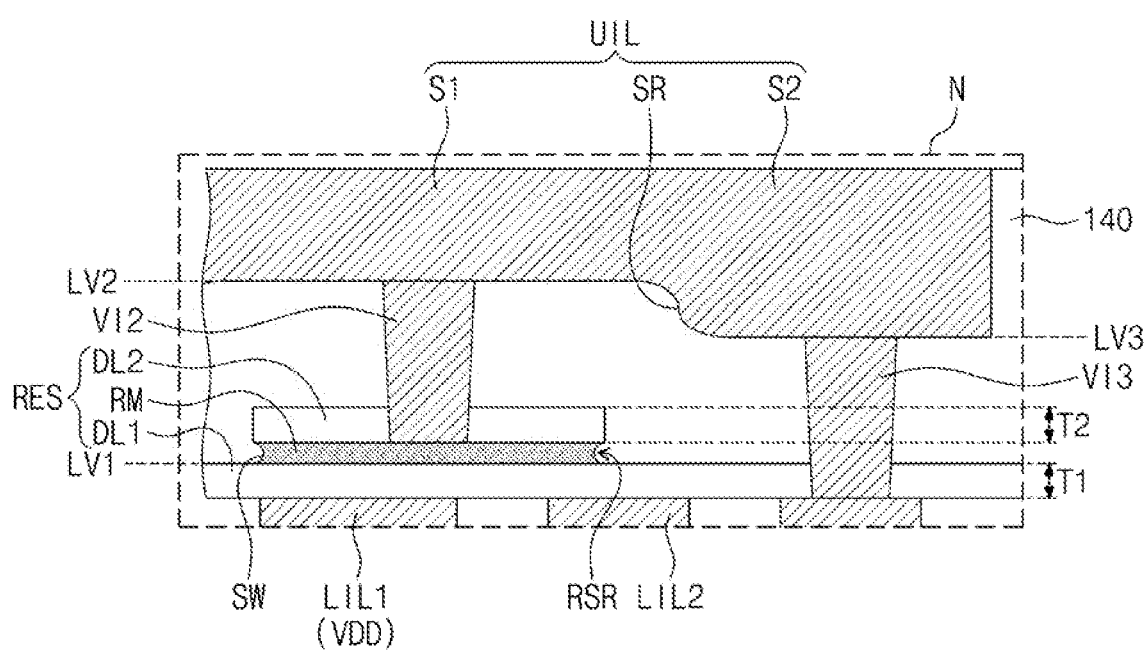
FIG. 20 is an enlarged sectional view of a portion N of FIG. 19.

FIG. 19 is a sectional view taken along the line D-D' of FIG. 1 of a semiconductor device according to an embodiment. FIG. 20 is an enlarged sectional view of a portion N of FIG. 19. In the following description, an element previously described with reference to FIGS. 1, 2A to 2E, and 3 may be identified by the same reference number without repeating an overlapping description thereof, for the sake of brevity.

Referring to FIGS. 19 and 20, the etch stop layer ESL may be omitted. The second vias VI2 may penetrate the second insulating layer DL2 and may be electrically connected to the resistor metal layer RM. The third vias VI3 may penetrate the first insulating layer DL1 and may be electrically connected to the first and second lower interconnection lines LIL1 and LIL2.

The resistor metal layer RM may have the recessed side surface SW. The recessed side surface SW of the resistor metal layer RM may be recessed toward a center of the resistor metal layer RM. The recessed side surface SW of the resistor metal layer RM may be recessed in an inward direction away from a side surface of the second insulating layer DL2. In an implementation, the recessed side surface SW of the resistor metal layer RM may have a curved, concave, or non-flat profile. The recess region RSR may be defined by the recessed side surface SW of the resistor metal layer RM. In an implementation, the fourth interlayer insulating layer 140 may include a portion protruding into the recess region RSR.

Figure 15:
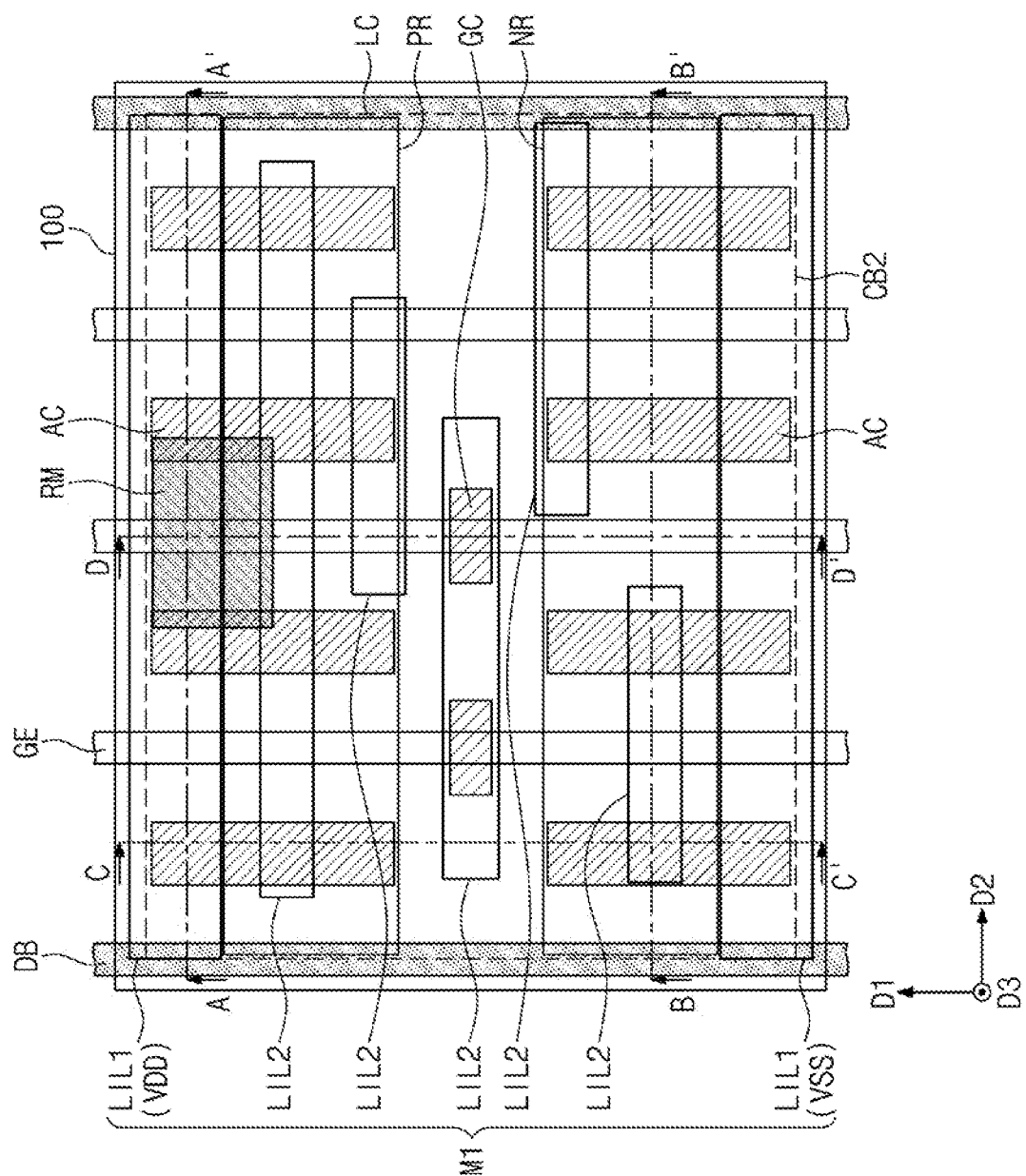
Figure 16A:
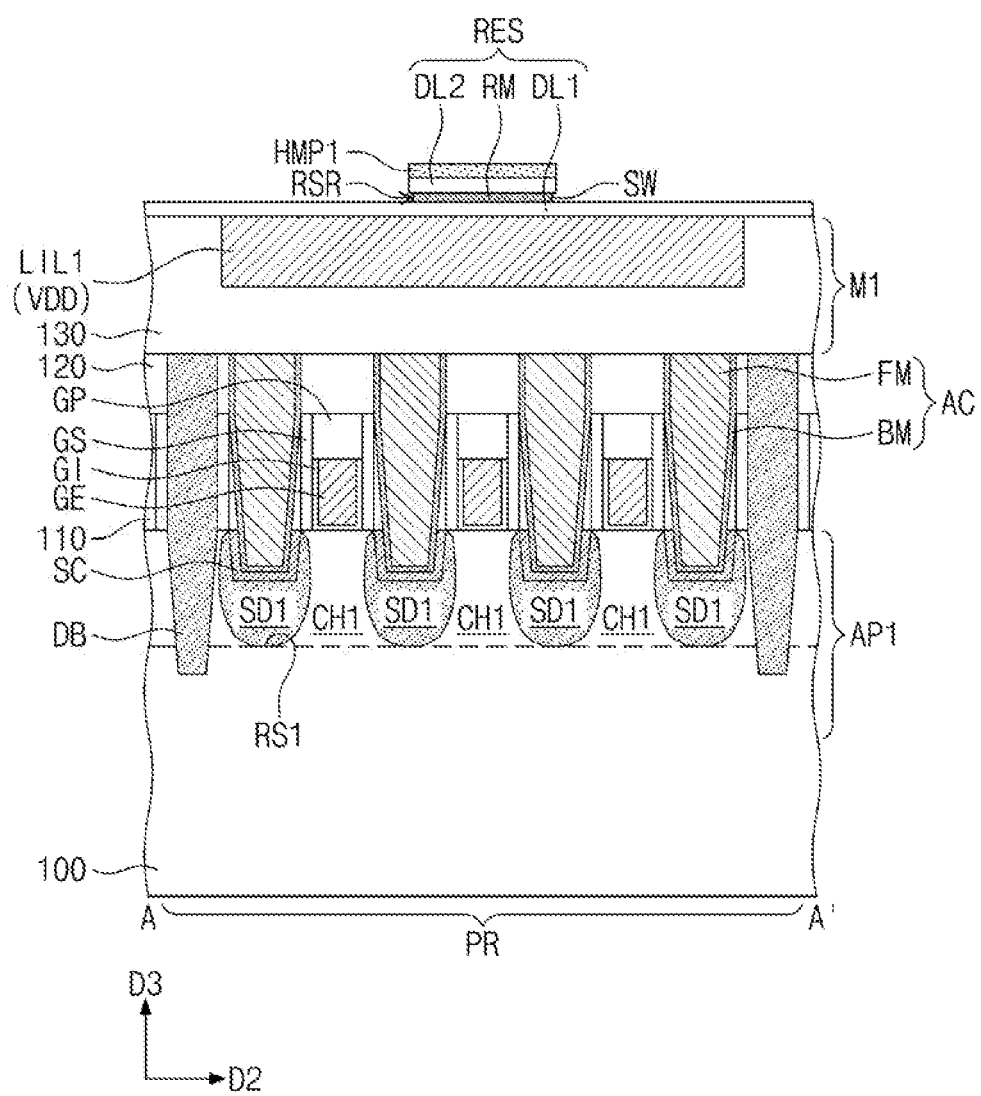
Figure 16B:
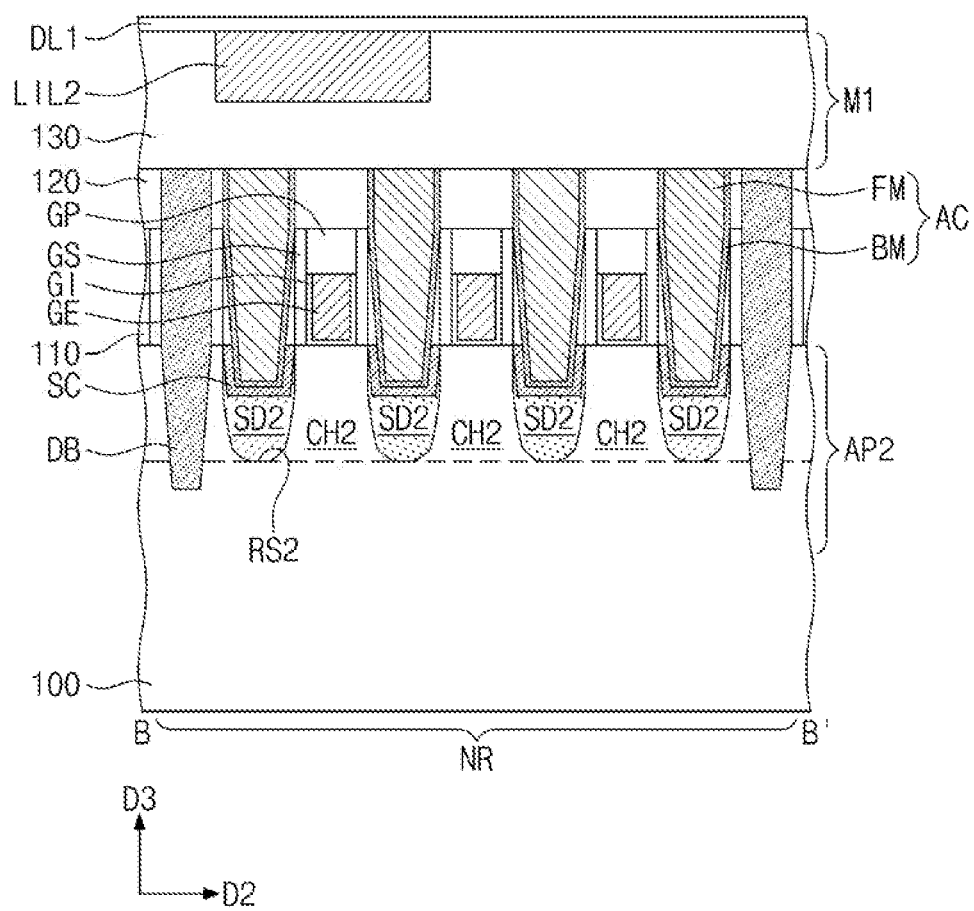
Figure 16C:
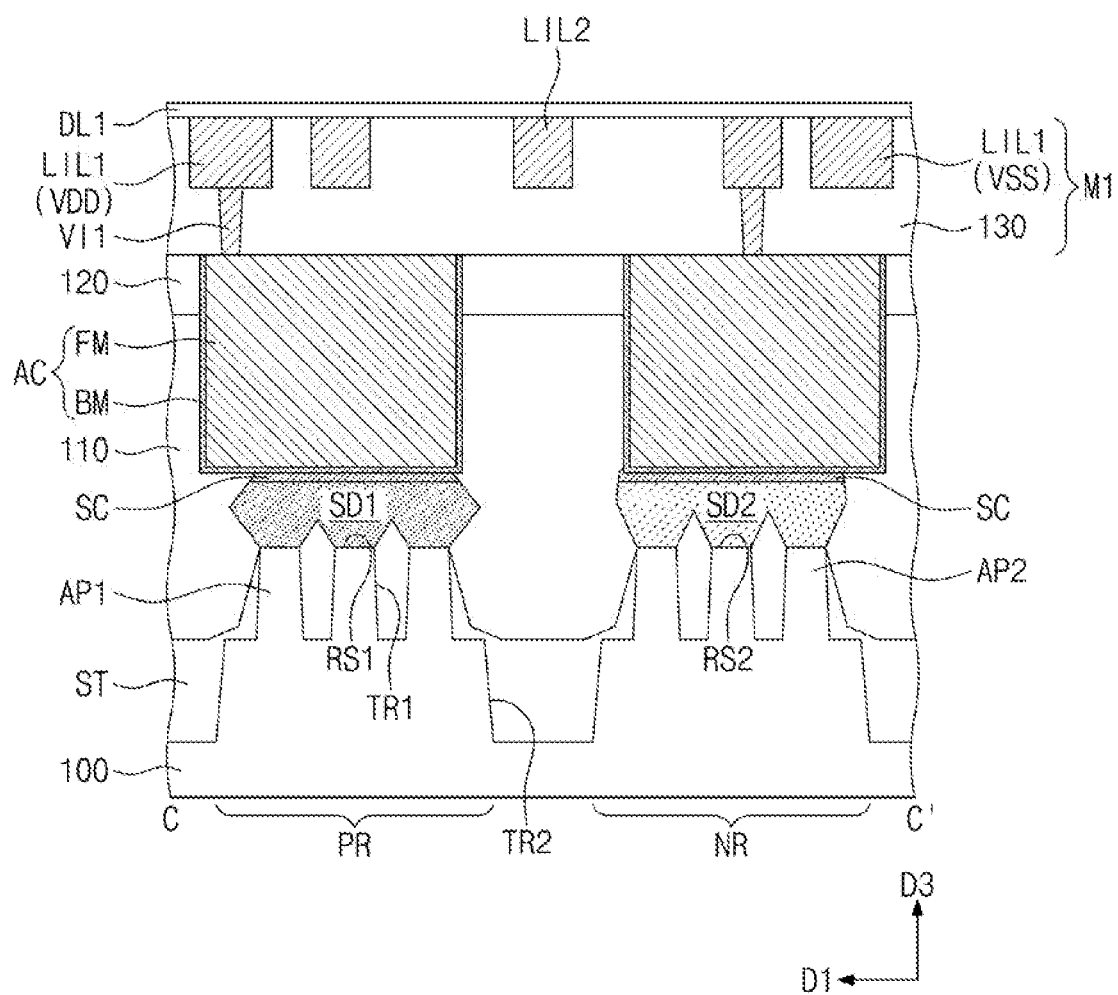
Figure 16D:
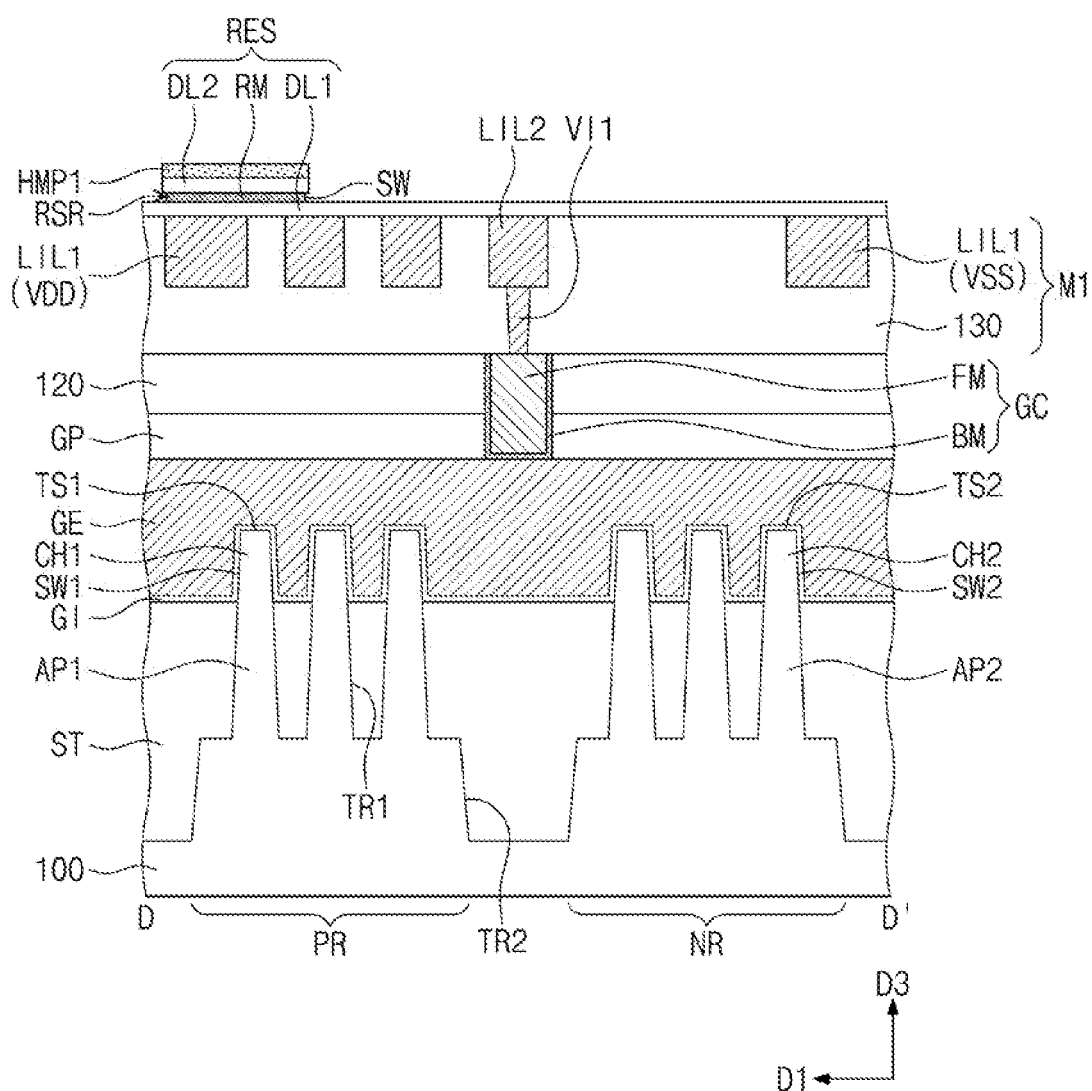
Figure 17A:
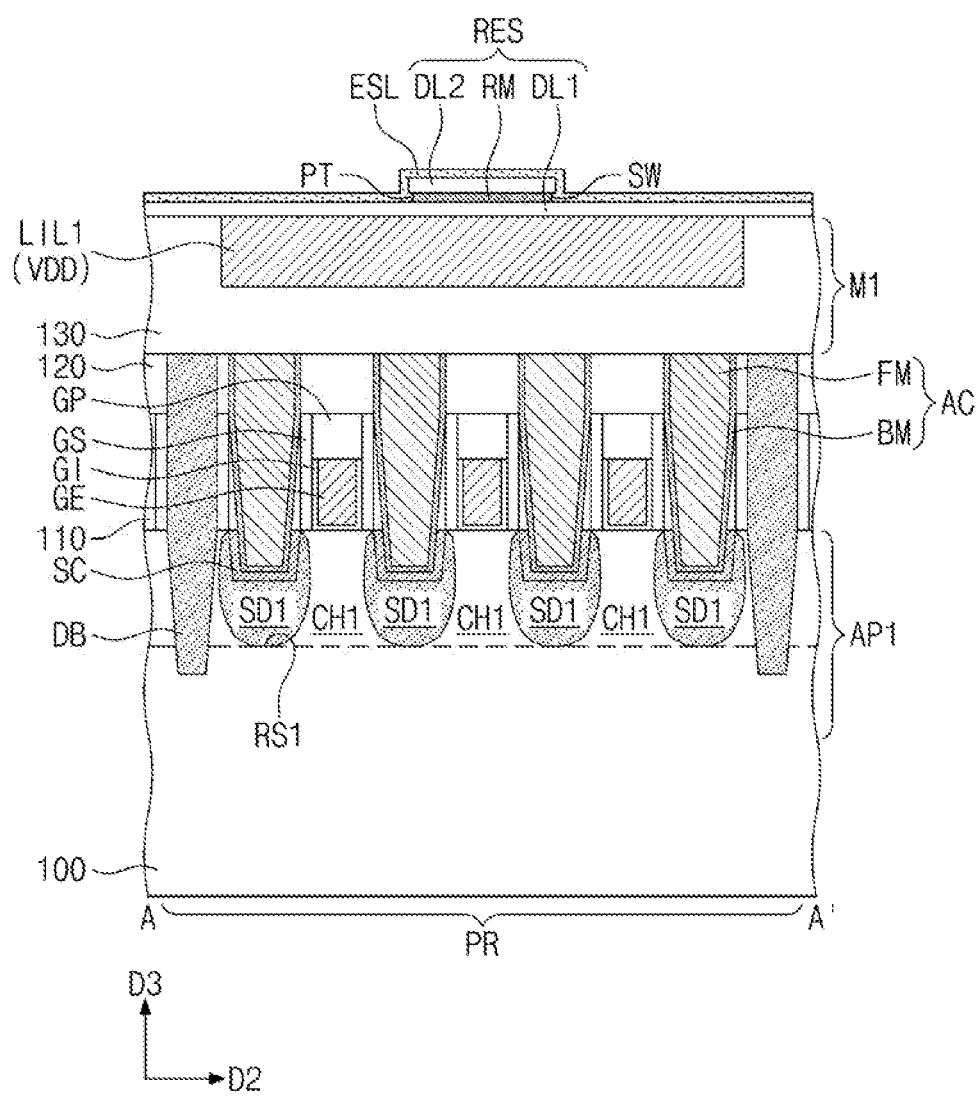
Figure 17B:
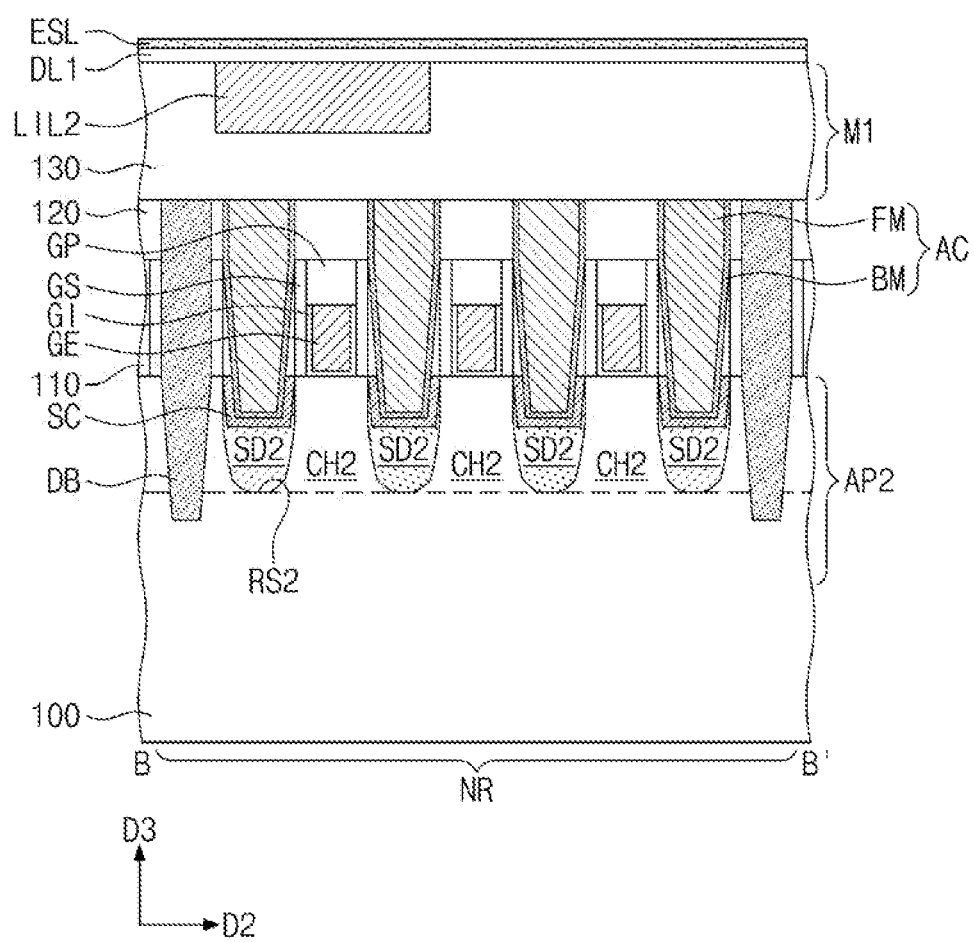
Figure 17C:
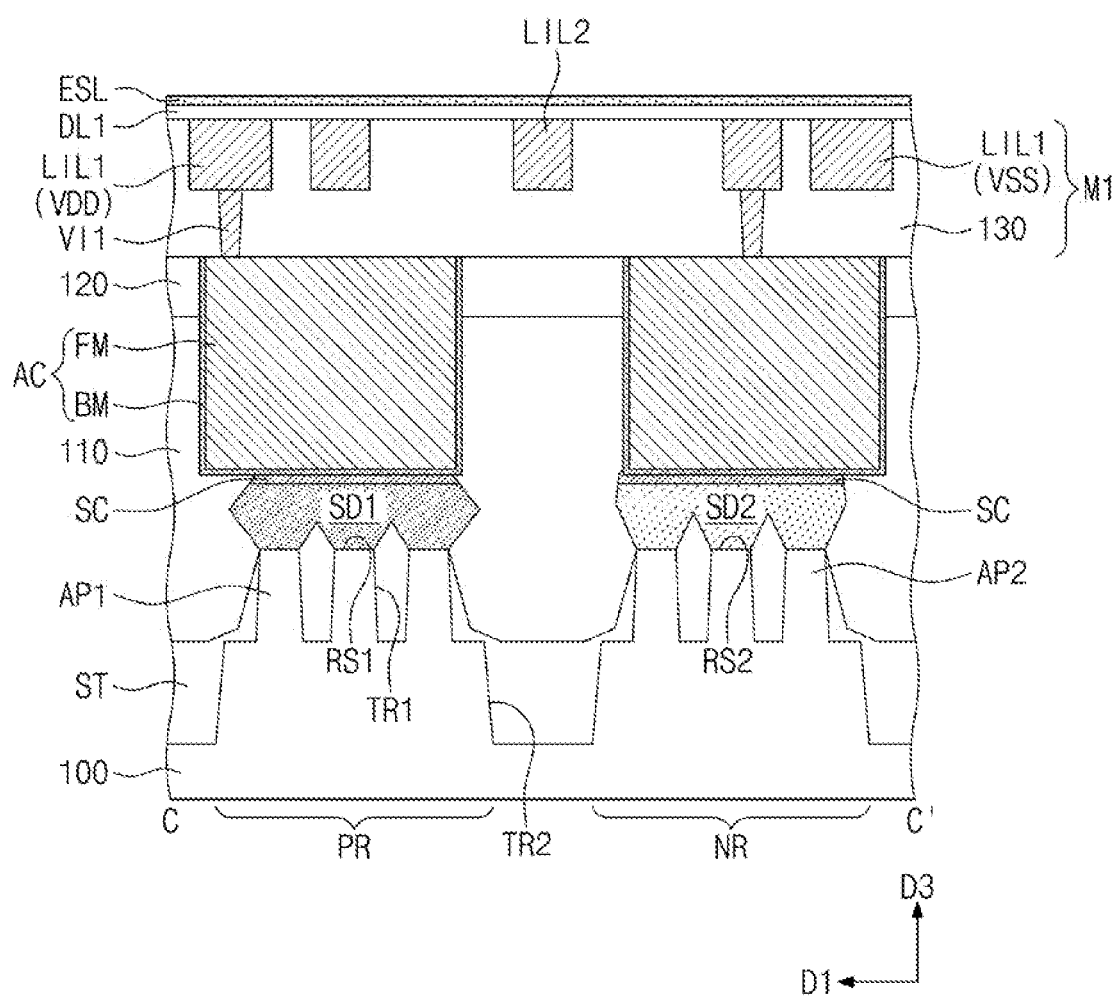
Figure 17D:
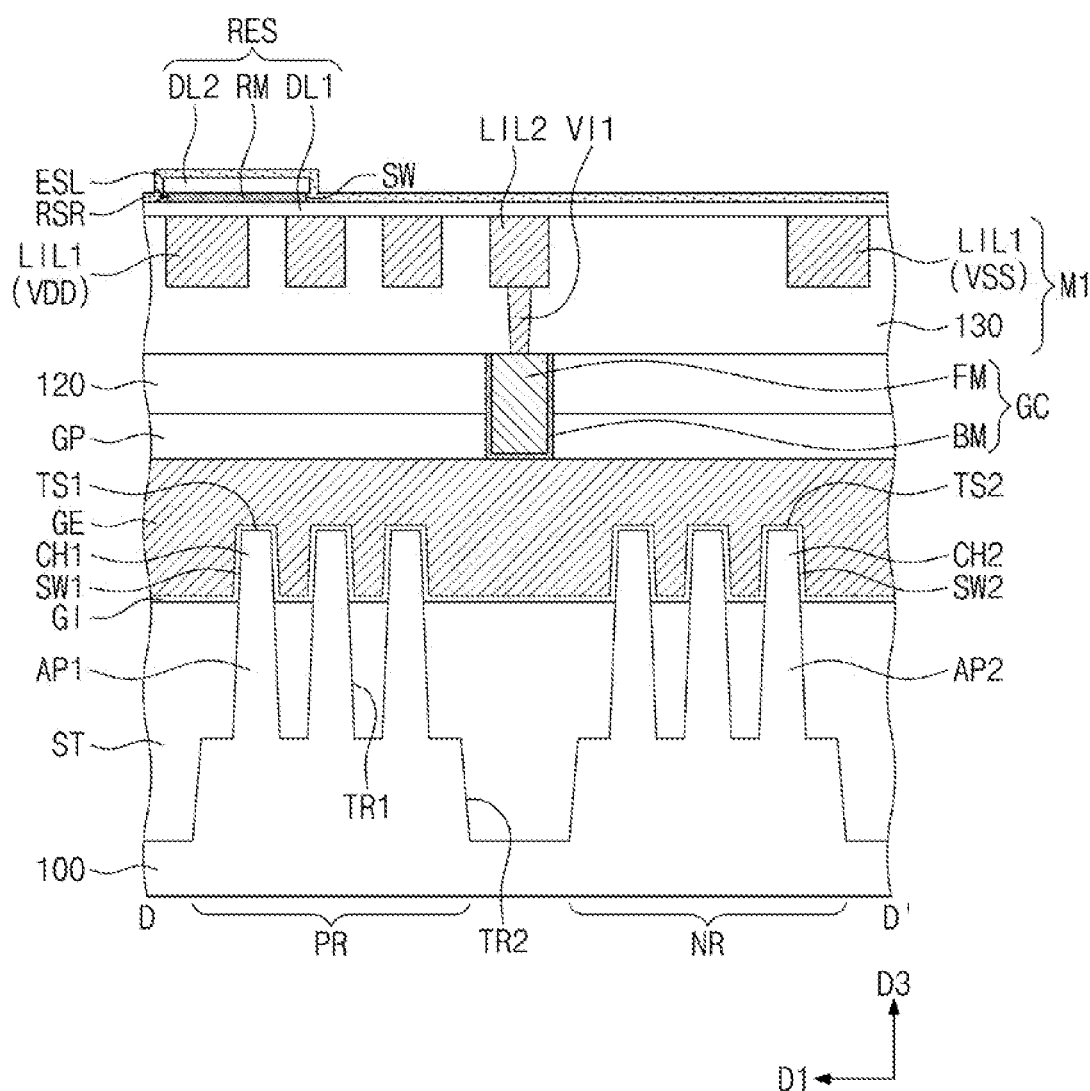
Figure 18A:
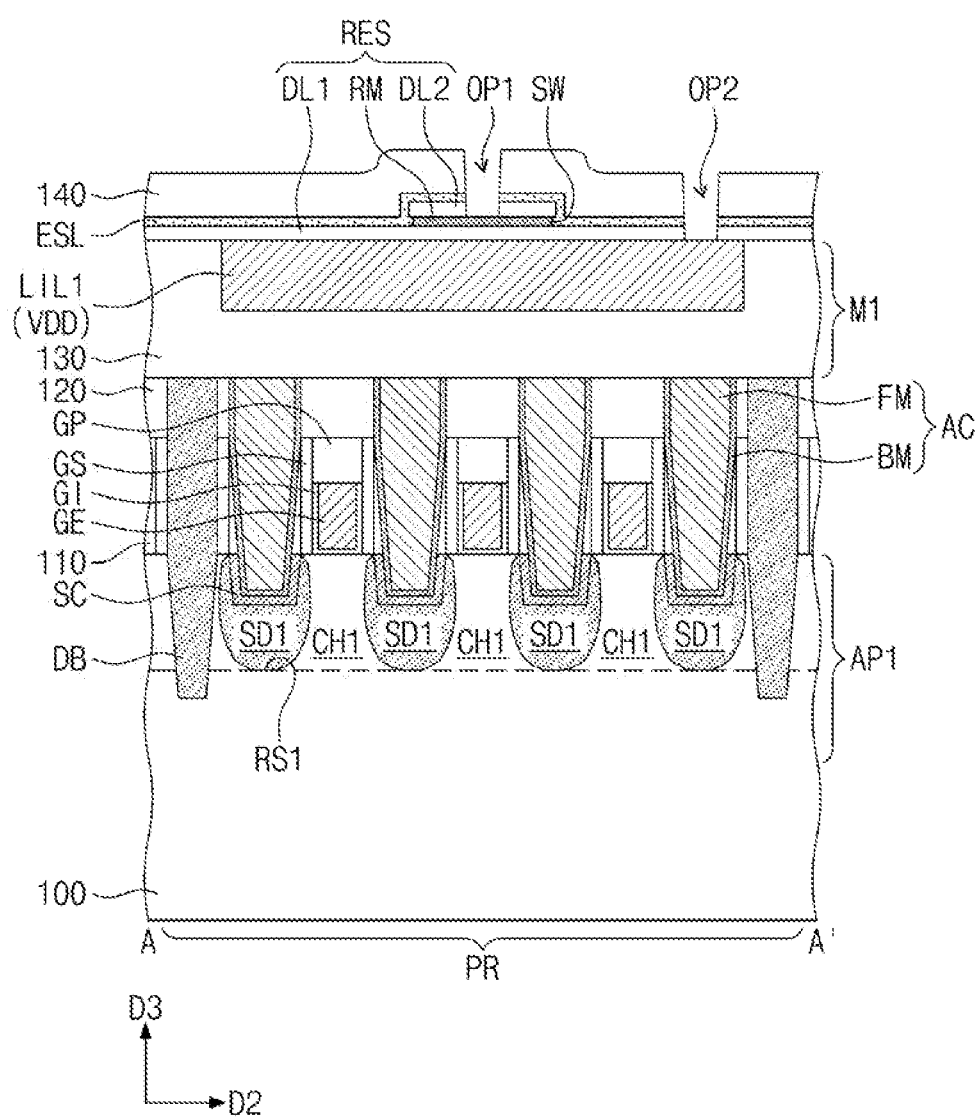
Figure 18B:
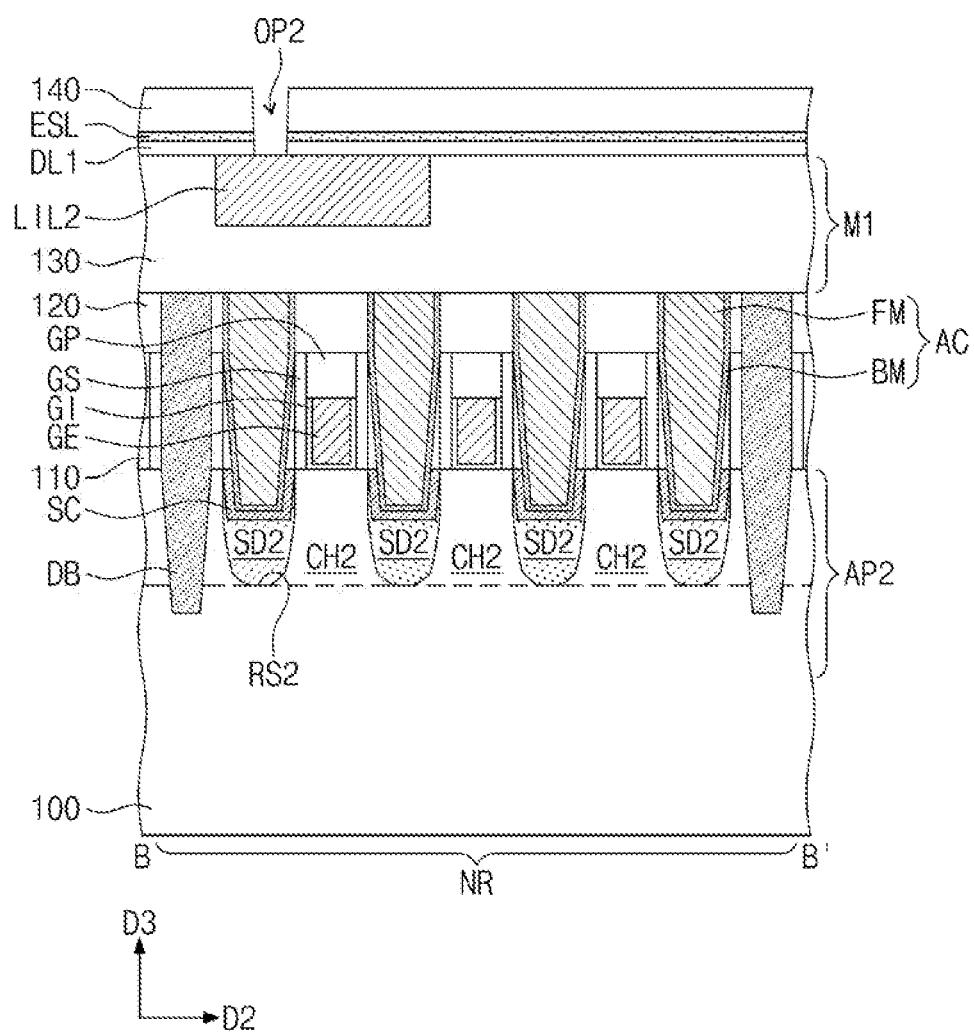
Figure 18C:
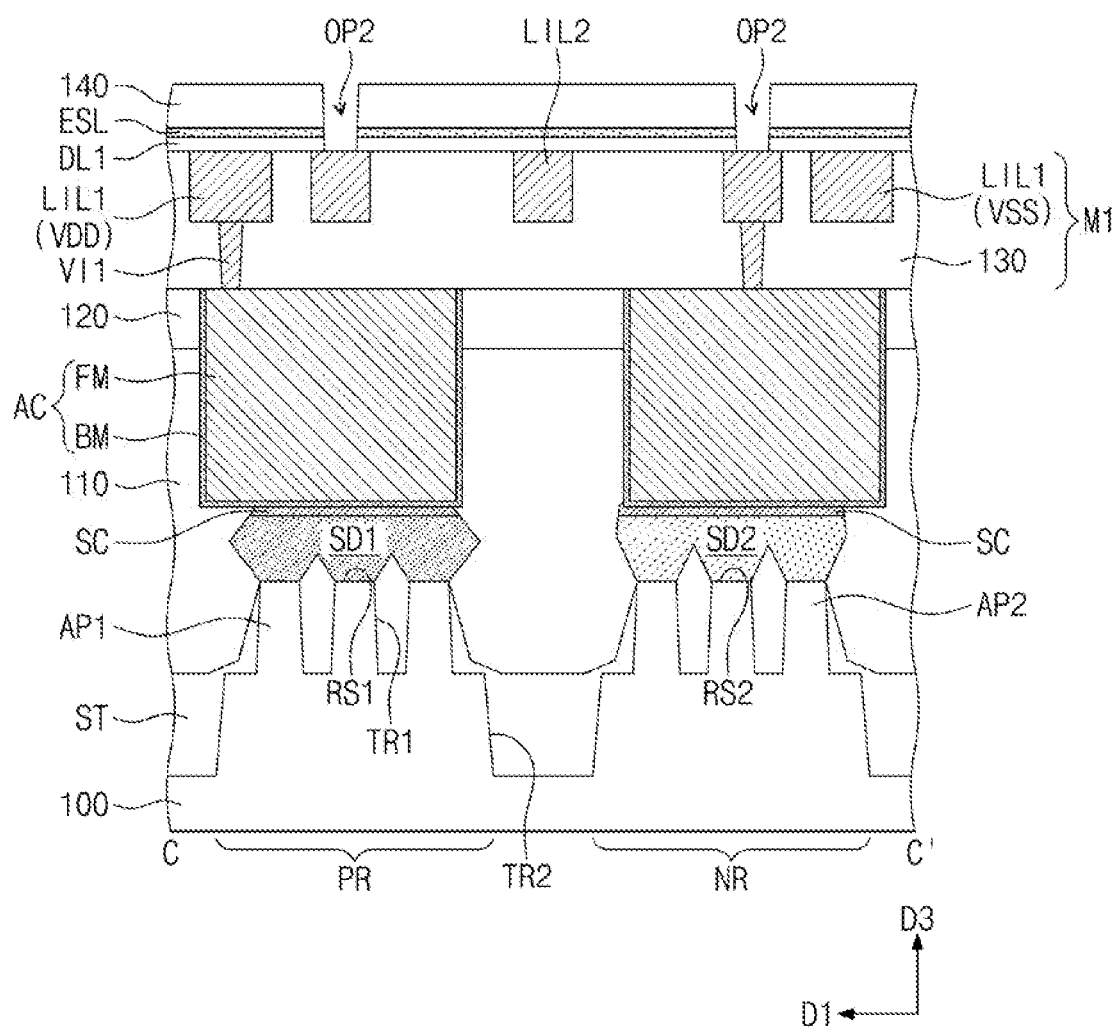
Figure 18D:
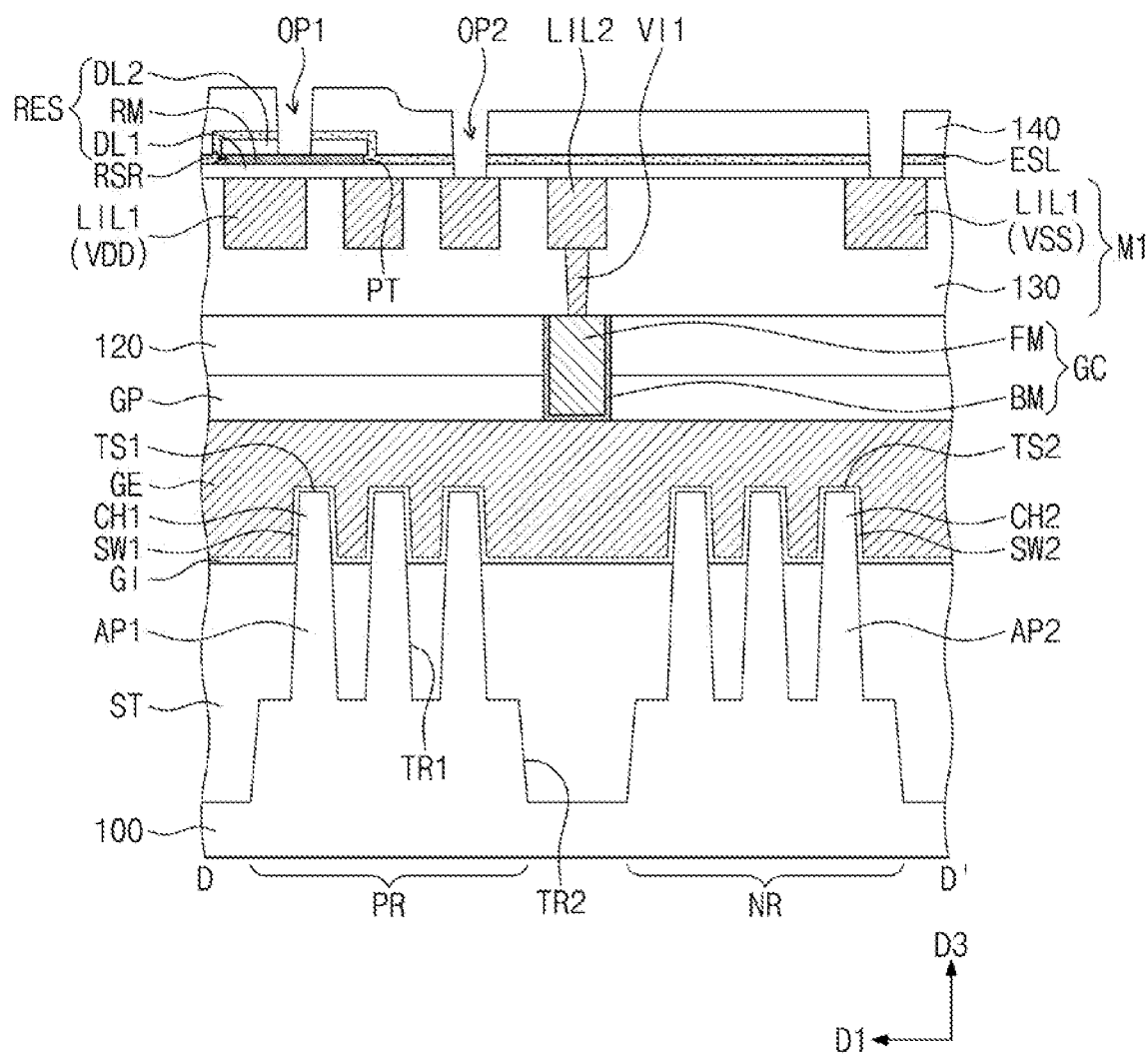
Figure 21:
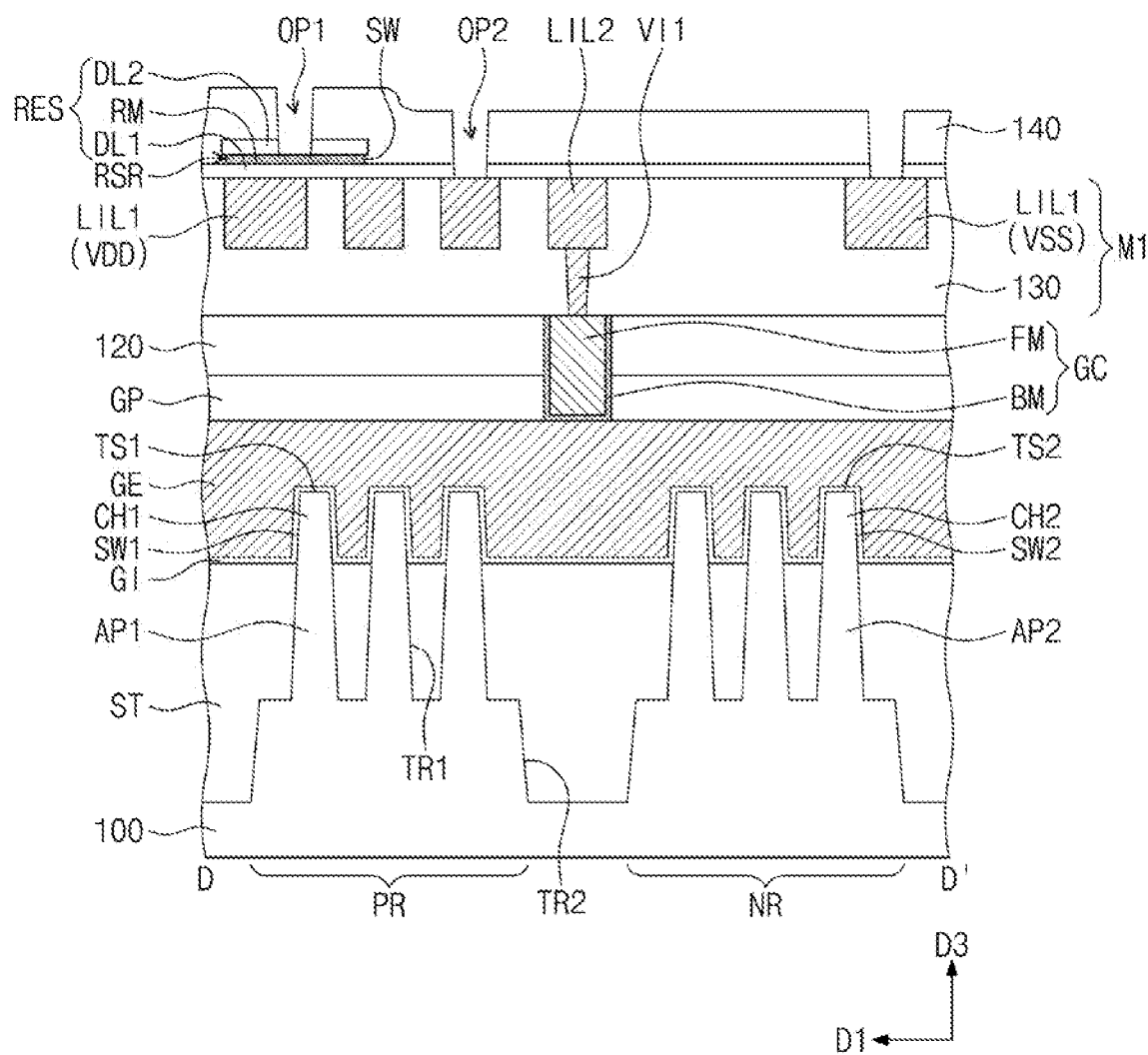
FIG. 21 is a sectional view taken along the line D-D' of FIG. 15 of a method of fabricating a semiconductor device, according to an embodiment.

FIG. 21 is a sectional view taken along the line D-D' of FIG. 15 of a stage in a method of fabricating a semiconductor device, according to an embodiment.

After the process described with reference to FIGS. 15 and 16A to 16D, the first hard mask pattern HMP1 may be removed. The first hard mask pattern HMP1 may be removed by, e.g., a wet etching process, an ashing process, or a polishing process. The fourth interlayer insulating layer 140 may be formed on the top surface of the resistor RES. The fourth interlayer insulating layer 140 may include a silicon oxide layer.

The top surface of the fourth interlayer insulating layer 140 may have a non-flat profile. In an implementation, a top surface of the fourth interlayer insulating layer 140, which vertically overlaps with the resistor metal layer RM, may be at a level that is higher than a top surface of the fourth interlayer insulating layer 140, which does not vertically overlap with the resistor metal layer RM.

A second hard mask pattern may be formed on the fourth interlayer insulating layer 140. In an implementation, the second hard mask pattern may be formed of or include the same material as the first hard mask pattern HMP1.

Openings may be formed by etching the fourth interlayer insulating layer 140 using the second hard mask pattern as an etch mask. The formation of the openings may include forming a second hard mask layer on the fourth interlayer insulating layer 140, patterning the second hard mask layer to form the second hard mask pattern, and anisotropically etching the fourth interlayer insulating layer 140 using the second hard mask pattern as an etch mask. Each of the openings may be formed to expose a top surface of the first or second insulating layer DL1 or DL2.

Next, an etching process may be performed to remove portions of the first and second insulating layers DL1 and DL2 exposed by the openings. In an implementation, the first and second insulating layers DL1 and DL2 may be formed to have substantially the same thickness, and it is possible to prevent the first and second lower interconnection lines LIL1 and LIL2 and the resistor metal layer RM from being undesirably etched. Accordingly, the reliability of the semiconductor device may be improved.

Thereafter, the second hard mask pattern may be removed. In an embodiment, the second hard mask pattern may be removed by a polishing process.

As a result of the partial removal of the first and second insulating layers DL1 and DL2, the first openings OP1 and the second openings OP2 may be formed. The first openings OP1 may be holes penetrating the fourth interlayer insulating layer 140 and the second insulating layer DL2. The second openings OP2 may be holes penetrating the fourth interlayer insulating layer 140 and the first insulating layer DL1.

Next, the process described with reference to FIGS. 1, 2A to 2E, and 3 may be performed. As a result, a semiconductor device, from which the etch stop layer ESL is omitted, may be fabricated to have the structure described with reference to FIGS. 19 and 20.

FIGS. 22A to 22E are sectional views, which are respectively taken along the lines A-A', B-B', C-C', D-D', and E-E' of FIG. 1 of a semiconductor device according to an embodiment. For concise description, an element previously described with reference to FIGS. 1, 2A to 2E, and 3 may be identified by the same reference number without repeating an overlapping description thereof.

Referring to FIGS. 1 and 22A to 22E, the substrate 100 including the first and second active regions PR and NR may be provided. The device isolation layer ST may be on the substrate 100. The device isolation layer ST may define the first and second active patterns AP1 and AP2 in an upper portion of the substrate 100. The first and second active patterns AP1 and AP2 may be defined on the first and second active regions PR and NR, respectively.

The first active pattern AP1 may include the first channel patterns CH1, which are vertically stacked on the substrate 100. The stacked first channel patterns CH1 may be spaced apart from each other in the third direction D3. The stacked first channel patterns CH1 may be overlapped with each other, when viewed in a plan view. The second active pattern AP2 may include the second channel patterns CH2, which are vertically stacked on the substrate 100. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of or include silicon (Si), germanium (Ge), or silicon germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be between each adjacent pair of the second source/drain patterns SD2. The stacked second channel patterns CH2 may connect each adjacent pair of the second source/drain patterns SD2 to each other.

The gate electrodes GE may extend in the first direction D1 and to cross the first and second channel patterns CH1 and CH2. The gate electrode GE may overlap with the first and second channel patterns CH1 and CH2, when viewed in a plan view. A pair of the gate spacers GS may be on both side surfaces of the gate electrode GE. The gate capping pattern GP may be on the gate electrode GE.

Figure 22A:
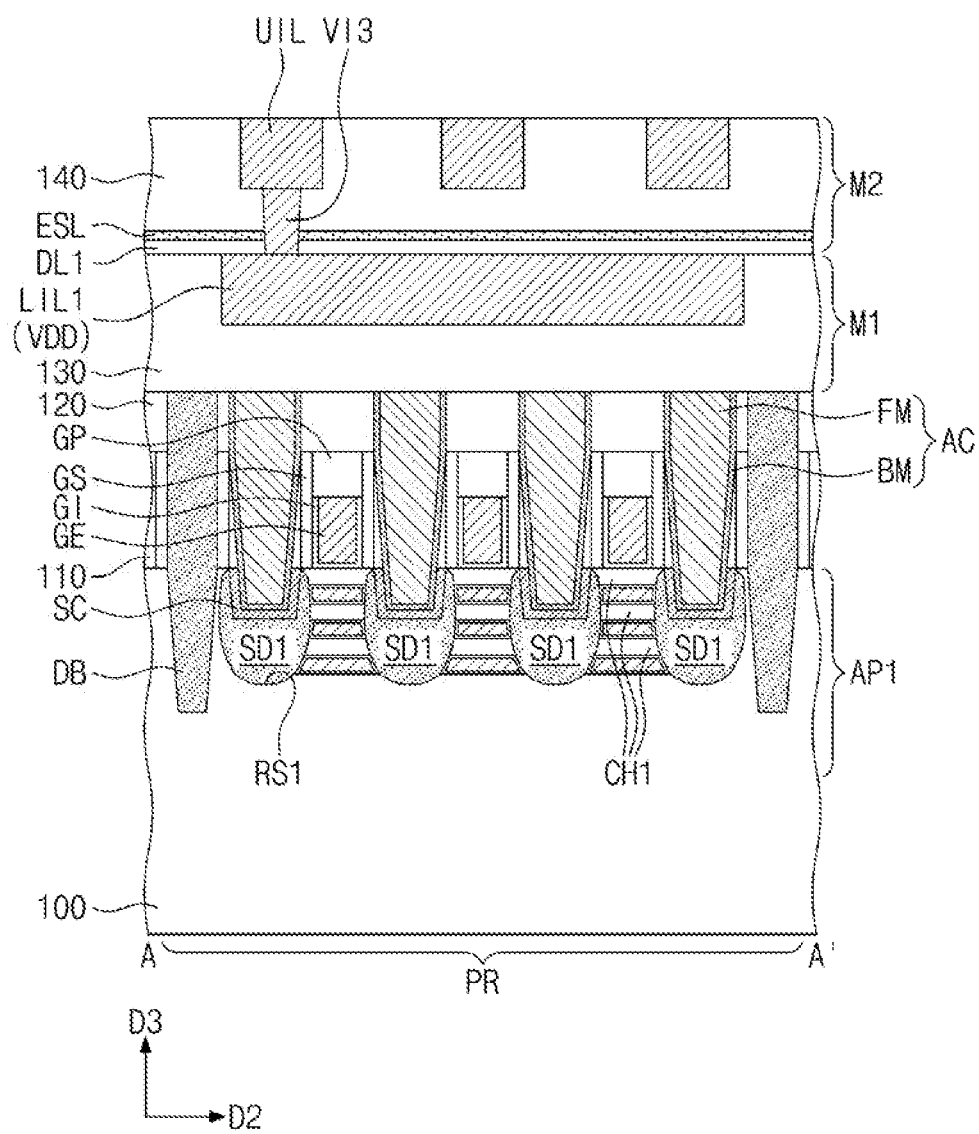
FIGS. 22A to 22E are sectional views taken along the lines A-A', B-B', C-C', D-D', and E-E' of FIG. 1 of a semiconductor device according to an embodiment.
Figure 22B:
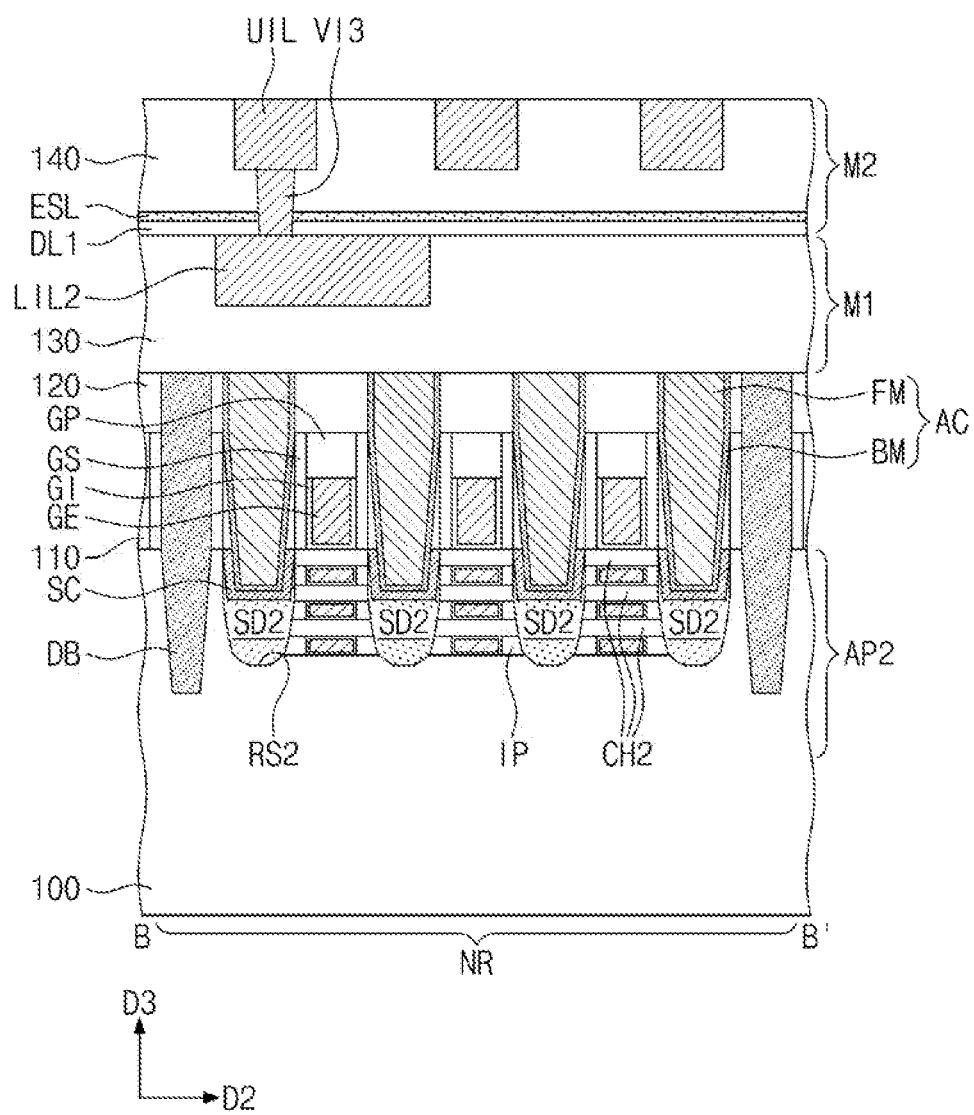
Figure 22C:
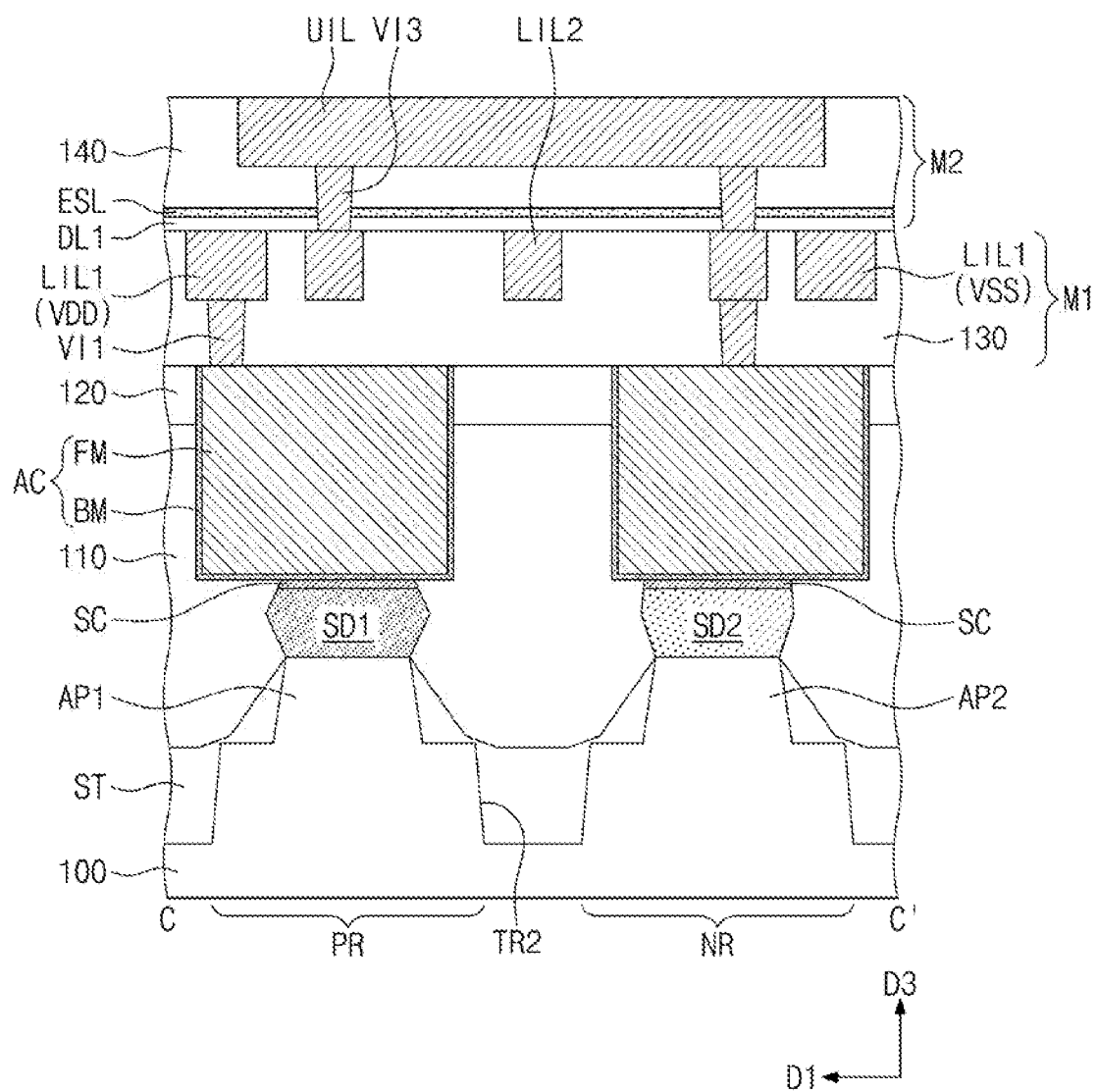
Figure 22D:
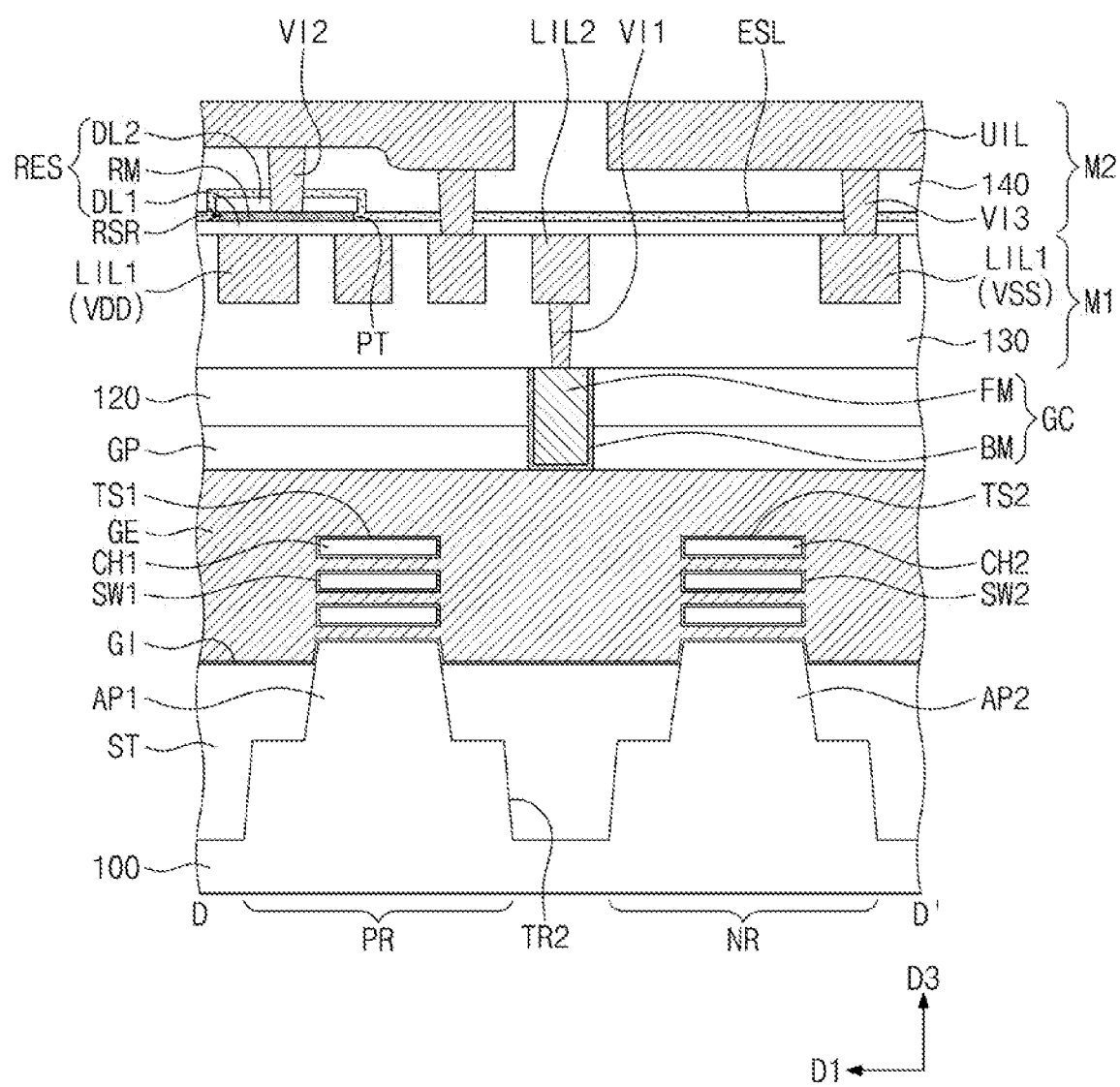
Figure 22E:
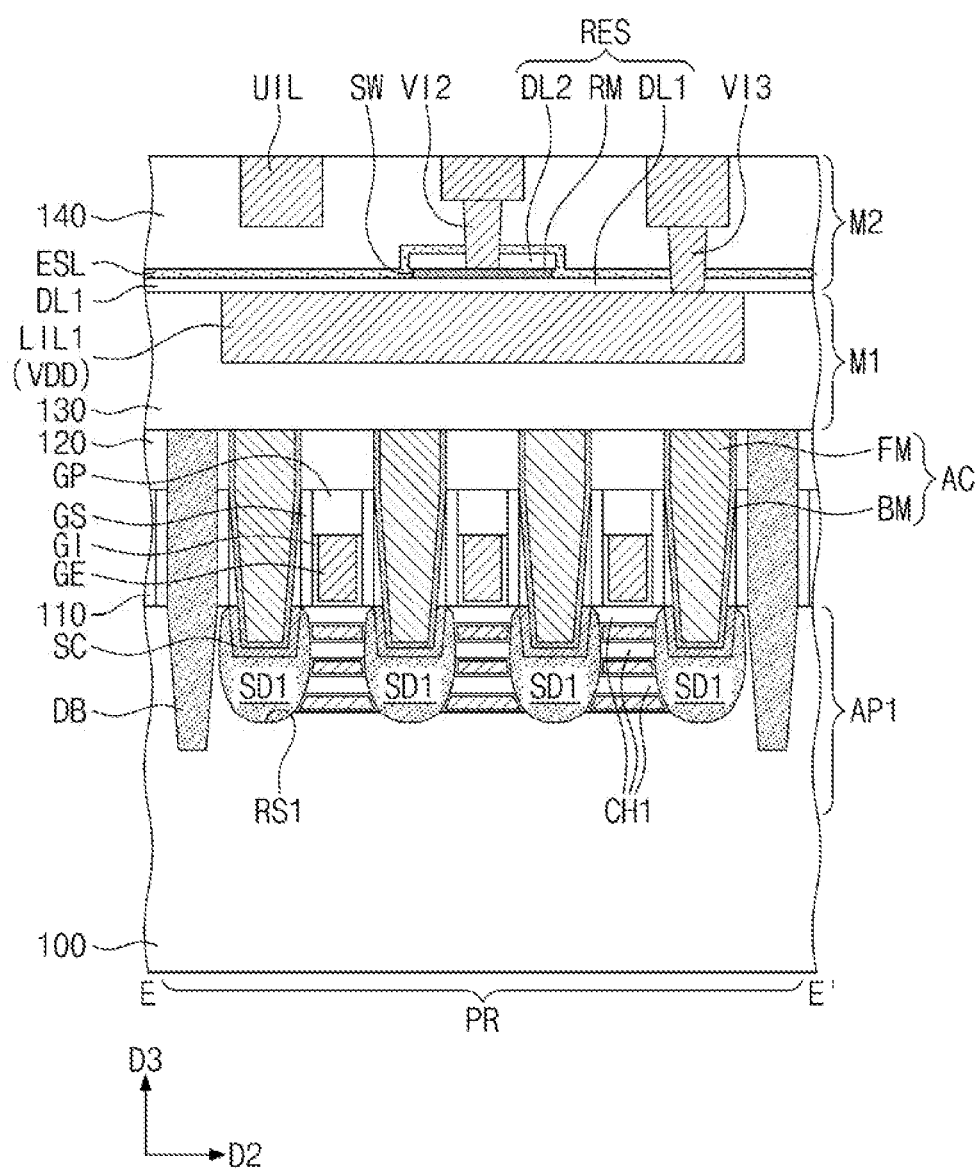

The gate electrode GE may surround each of the first and second channel patterns CH1 and CH2 (e.g., see FIG. 22D). The gate electrode GE may be on a first top surface TS1, at least one first side surface SW1, and a first bottom surface BS1 of the first channel pattern CH1. The gate electrode GE may be on a second top surface TS2, at least one second side surface SW2, and a second bottom surface BS2 of the second channel pattern CH2. In an implementation, the gate electrode GE may surround a top surface, a bottom surface, and both side surfaces of each of the first and second channel patterns CH1 and CH2. The transistor according to the present embodiment may be a three-dimensional field effect transistor (e.g., a multi-bridge channel field-effect transistor (MBCFET)), in which the gate electrode GE three-dimensionally surrounds the channel patterns CH1 and CH2.

The gate dielectric pattern GI may be between each of the first and second channel patterns CH1 and CH2 and the gate electrode GE. The gate dielectric pattern GI may surround each of the first and second channel patterns CH1 and CH2.

On the second active region NR, an insulating pattern IP may be between the gate dielectric pattern GI and the second source/drain pattern SD2. The gate electrode GE may be spaced apart from the second source/drain pattern SD2 by the gate dielectric pattern GI and the insulating pattern IP. In an implementation, on the first active region PR, the insulating pattern IP may be omitted.

The first interlayer insulating layer 110 and the second interlayer insulating layer 120 may cover the substrate 100. The active contacts AC may penetrate the first and second interlayer insulating layers 110 and 120 and may be connected to the first and second source/drain patterns SD1 and SD2, respectively. The gate contact GC may penetrate the second interlayer insulating layer 120 and the gate capping pattern GP and may be connected to the gate electrode GE.

The third interlayer insulating layer 130 may be on the second interlayer insulating layer 120. The fourth interlayer insulating layer 140 may be on the third interlayer insulating layer 130. The first metal-containing layer M1 may be in the third interlayer insulating layer 130. The second metal-containing layer M2 may be on the first metal-containing layer M1. The first metal metal-containing M1 and the second metal-containing layer M2 may be substantially the same as those in the previous embodiment described with reference to FIGS. 1, 2A to 2E, and 3.

By way of summation and review, scaling-down of the MOS-FETs could lead to deterioration in operational properties of the semiconductor device. A variety of studies are conducted to address issues associated with the scale-down of the semiconductor device and to provide a high performance semiconductor device.

According to an embodiment, a semiconductor device may include a resistor, and a resistor metal layer may be used as an etch stop layer. Accordingly, it is possible to help prevent or suppress defects from being formed in a first insulating layer, which is below the resistor metal layer, and to simplify an overall fabrication process. As a result, reliability of the semiconductor device may be improved.

One or more embodiments may provide a semiconductor device including a field effect transistor.

One or more embodiments may provide a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a transistor on a substrate;
an interlayer insulating layer on the transistor;
a first metal-containing layer on the interlayer insulating layer; and
a second metal-containing layer on the first metal-containing layer,
wherein:
the second metal-containing layer includes a resistor,
the resistor includes:
a first insulating layer on the first metal-containing layer;
a resistor metal layer on the first insulating layer; and
a second insulating layer on the resistor metal layer, and
the resistor metal layer includes a curved concave recessed side surface such that a center portion of the side surface of the resistor metal layer extends along a curve and further inwardly in the resistor metal layer than a top portion of the side surface of the resistor metal layer and extends along a curve and further inwardly in the resistor metal layer than a bottom portion of the side surface of the resistor metal layer.
2. The semiconductor device as claimed in claim 1, wherein a lowermost level of a bottom surface of the resistor

19 metal layer is located at a same level as a lowermost level of a top surface of the first insulating layer.

3. The semiconductor device as claimed in claim 1, wherein a ratio of a thickness of the first insulating layer to a thickness of the second insulating layer ranges from 0.8 to 1.2.

4. The semiconductor device as claimed in claim 1, wherein a thickness of the first insulating layer ranges from 100 Å to 150 Å.

5. The semiconductor device as claimed in claim 1, wherein:
the first metal-containing layer includes a lower interconnection line below the resistor and extending in a first direction,
the second metal-containing layer further includes an upper interconnection line on the resistor and extending in a second direction crossing the first direction,
the upper interconnection line includes:
a first portion vertically overlapped with the resistor metal layer, and
a second portion horizontally offset from the resistor metal layer, and
a bottom surface of the first portion of the upper interconnection line is located at a level higher than a bottom surface of the second portion of the upper interconnection line.

6. The semiconductor device as claimed in claim 5, wherein a bottom surface of the upper interconnection line has a stepped profile.

7. The semiconductor device as claimed in claim 5, wherein:
the second metal-containing layer further includes a first via and a second via, which are below the upper interconnection line,
the first via electrically connects the first portion of the upper interconnection line to the resistor metal layer, and
the second via electrically connects the second portion of the upper interconnection line to the lower interconnection line.

8. The semiconductor device as claimed in claim 7, wherein a top surface of the first via is located at a level higher than a top surface of the second via.

9. The semiconductor device as claimed in claim 1, wherein:
the second metal-containing layer further includes an etch stop layer on a top surface of the resistor, and
the etch stop layer includes a protruding portion protruding into the concave recessed side surface of the resistor metal layer.

10. The semiconductor device as claimed in claim 9, wherein the protruding portion vertically overlaps with the second insulating layer.

11. A semiconductor device, comprising:
a transistor on a substrate;
an interlayer insulating layer on the transistor;
a first metal-containing layer on the interlayer insulating layer, the first metal-containing layer including a lower interconnection line; and
a second metal-containing layer on the first metal-containing layer,
wherein:
the second metal-containing layer includes a resistor metal layer and an upper interconnection line on the resistor metal layer,
the resistor metal layer is between the upper interconnection line and the lower interconnection line,

20 the upper interconnection line includes:
a first portion vertically overlapped with the resistor metal layer, and
a second portion horizontally offset from the resistor metal layer,
a bottom surface of the first portion of the upper interconnection line is located at a level higher than a bottom surface of the second portion of the upper interconnection line, and
the resistor metal layer includes a curved concave recessed side surface such that a center portion of the side surface of the resistor metal layer extends along a curve and further inwardly in the resistor metal layer than a top portion of the side surface of the resistor metal layer and extends along a curve and further inwardly in the resistor metal layer than a bottom portion of the side surface of the resistor metal layer.

12. The semiconductor device as claimed in claim 11, wherein:
the second metal-containing layer further includes an etch stop layer on the resistor metal layer, and
the etch stop layer includes a protruding portion protruding into the concave recessed side surface of the resistor metal layer.

13. The semiconductor device as claimed in claim 12, wherein:
the second metal-containing layer further includes a first insulating layer below the resistor metal layer, and
a lowermost level of a bottom surface of the etch stop layer is located at a same level as a lowermost level of a top surface of the first insulating layer.

14. The semiconductor device as claimed in claim 11, wherein:
the second metal-containing layer further includes a first via and a second via, which are below the upper interconnection line,
the first via electrically connects the first portion of the upper interconnection line to the resistor metal layer,
the second via electrically connects the second portion of the upper interconnection line to the lower interconnection line, and
a top surface of the first via is at a level higher than a top surface of the second via.

15. The semiconductor device as claimed in claim 11, wherein a bottom surface of the upper interconnection line has a stepped profile.

16. A semiconductor device, comprising:
a substrate including an active region;
a device isolation layer defining active patterns on the active region, the device isolation layer covering a lower side surface of each of the active patterns, an upper portion of each of the active patterns protruding above the device isolation layer;
a pair of source/drain patterns in the upper portion of each of the active patterns;
a channel pattern between the pair of source/drain patterns;
a gate electrode crossing the channel pattern and extending in a first direction;
gate spacers at both sides of the gate electrode and extending in the first direction, along with the gate electrode;
a gate dielectric pattern between the gate electrode and the channel pattern and between the gate electrode and the gate spacer;

a gate capping pattern on a top surface of the gate electrode and extending in the first direction, along with the gate electrode;
a first interlayer insulating layer on the gate capping pattern;
an active contact penetrating the first interlayer insulating layer and being coupled to at least one of the source/drain patterns;
a gate contact penetrating the first interlayer insulating layer and being coupled to the gate electrode;
a first metal-containing layer in a second interlayer insulating layer on the first interlayer insulating layer; and
a second metal-containing layer in a third interlayer insulating layer on the second interlayer insulating layer,
wherein:
the first metal-containing layer includes a lower interconnection line,
the second metal-containing layer includes:
a resistor on the first metal-containing layer;
an upper interconnection line on the resistor; and
a first via below the upper interconnection line and connected to the resistor,
the resistor includes:
a first insulating layer;
a resistor metal layer on the first insulating layer; and
a second insulating layer on the resistor metal layer, and
the resistor metal layer includes a curved concave recessed side surface such that a center portion of the side surface of the resistor metal layer extends along a curve and further inwardly in the resistor metal layer than a top portion of the side surface of the resistor metal layer and extends along a curve and further inwardly in the resistor metal layer than a bottom portion of the side surface of the resistor metal layer.

17. The semiconductor device as claimed in claim 16, further comprising an etch stop layer on a top surface of the resistor,
wherein a lowermost level of a bottom surface of the etch stop layer is located at a same level as a lowermost level of a top surface of the first insulating layer.

18. The semiconductor device as claimed in claim 17, wherein:
the etch stop layer includes a protruding portion protruding into the concave recessed side surface of the resistor metal layer, and
the protruding portion is vertically overlapped with the second insulating layer.

19. The semiconductor device as claimed in claim 16, wherein:
the upper interconnection line includes:
a first portion vertically overlapped with the resistor metal layer, and
a second portion horizontally offset from the resistor metal layer, and
a bottom surface of the first portion of the upper interconnection line is located at a level higher than a bottom surface of the second portion of the upper interconnection line.

20. The semiconductor device as claimed in claim 19, wherein:
the second metal-containing layer further includes a second via below the upper interconnection line,
the first via electrically connects the first portion of the upper interconnection line to the resistor metal layer, and
the second via electrically connects the second portion of the upper interconnection line to the lower interconnection line.

* * * * *